(12) United States Patent
Yamazaki et al.

(10) Patent No.: US 9,761,736 B2
(45) Date of Patent: Sep. 12, 2017

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi-shi, Kanagawa-ken (JP)

(72) Inventors: Shunpei Yamazaki, Tokyo (JP); Shinya Sasagawa, Kanagawa (JP); Suguru Hondo, Kanagawa (JP); Hideomi Suzawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/337,835

(22) Filed: Jul. 22, 2014

(65) Prior Publication Data
US 2015/0028330 A1 Jan. 29, 2015

(30) Foreign Application Priority Data

| Jul. 25, 2013 | (JP) | 2013-154723 |
| Jul. 25, 2013 | (JP) | 2013-154736 |
| Jul. 25, 2013 | (JP) | 2013-154749 |

(51) Int. Cl.
*H01L 29/786* (2006.01)
*H01L 29/66* (2006.01)
(Continued)

(52) U.S. Cl.
CPC ...... *H01L 29/78693* (2013.01); *H01L 21/467* (2013.01); *H01L 27/1225* (2013.01);
(Continued)

(58) Field of Classification Search
CPC ............ H01L 27/1222; H01L 27/1225; H01L 29/78693
See application file for complete search history.

(56) References Cited

U.S. PATENT DOCUMENTS

| 5,731,856 A | 3/1998 | Kim et al. |
| 5,744,864 A | 4/1998 | Cillessen et al. |
(Continued)

FOREIGN PATENT DOCUMENTS

| EP | 1737044 A | 12/2006 |
| EP | 2226847 A | 9/2010 |
(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
(Continued)

*Primary Examiner* — Bryan Junge
(74) *Attorney, Agent, or Firm* — Fish & Richardson P.C.

(57) ABSTRACT

Provided is a semiconductor device in which a deterioration in electrical characteristics which becomes more noticeable as miniaturization can be suppressed. The semiconductor device includes a first oxide semiconductor film over an insulating surface; a second oxide semiconductor film over the first oxide semiconductor film; a source electrode and a drain electrode in contact with each side surface of the first oxide semiconductor film and the second oxide semiconductor film; a first insulating film and a second insulating film over the source electrode and the drain electrode; a third oxide semiconductor film over the second oxide semiconductor film, the source electrode, and the drain electrode; a gate insulating film over the third oxide semiconductor film; and a gate electrode in contact with an upper surface of the
(Continued)

gate insulating film and facing an upper surface and the side surface of the second oxide semiconductor film.

11 Claims, 66 Drawing Sheets

(51) Int. Cl.
  *H01L 29/24*   (2006.01)
  *H01L 29/423*  (2006.01)
  *H01L 27/12*   (2006.01)
  *H01L 21/467*  (2006.01)
  *H01L 21/02*   (2006.01)

(52) U.S. Cl.
  CPC ...... *H01L 29/247* (2013.01); *H01L 29/42384* (2013.01); *H01L 29/66969* (2013.01); *H01L 29/7869* (2013.01); *H01L 29/78648* (2013.01); *H01L 29/78696* (2013.01); *H01L 21/02565* (2013.01)

(56) References Cited

U.S. PATENT DOCUMENTS

| | | | |
|---|---|---|---|
| 6,197,625 B1 | 3/2001 | Choi | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,598,670 B2 | 10/2009 | Kumaki et al. | |
| 7,674,650 B2 | 3/2010 | Akimoto et al. | |
| 7,732,819 B2 | 6/2010 | Akimoto et al. | |
| 7,977,255 B1 | 7/2011 | Scheer et al. | |
| 7,994,500 B2 | 8/2011 | Kim et al. | |
| 8,058,645 B2 | 11/2011 | Jeong et al. | |
| 8,058,647 B2 | 11/2011 | Kuwabara et al. | |
| 8,148,779 B2 | 4/2012 | Jeong et al. | |
| 8,188,480 B2 | 5/2012 | Itai | |
| 8,202,365 B2 | 6/2012 | Umeda et al. | |
| 8,203,143 B2 | 6/2012 | Imai | |
| 8,274,078 B2 | 9/2012 | Itagaki et al. | |
| 8,344,387 B2 | 1/2013 | Akimoto et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0191204 A1 | 8/2008 | Kim et al. | |
| 2008/0224133 A1 | 9/2008 | Park et al. | |
| 2008/0237598 A1 | 10/2008 | Nakayama | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0073268 A1 | 3/2010 | Matsunaga et al. | |
| 2010/0092800 A1 | 4/2010 | Itagaki et al. | |
| 2010/0109002 A1 | 5/2010 | Itagaki et al. | |
| 2010/0117078 A1 | 5/2010 | Kuwabara et al. | |
| 2010/0133530 A1 | 6/2010 | Akimoto et al. | |
| 2010/0155716 A1 | 6/2010 | Cheong et al. | |
| 2010/0219410 A1 | 9/2010 | Godo et al. | |
| 2011/0049508 A1 | 3/2011 | Kawamura et al. | |
| 2011/0049509 A1* | 3/2011 | Takahashi | H01L 29/7869 257/43 |
| 2011/0140100 A1* | 6/2011 | Takata | H01L 29/7869 257/43 |
| 2011/0193083 A1 | 8/2011 | Kim et al. | |
| 2012/0001170 A1* | 1/2012 | Yamazaki | H01L 27/1225 257/43 |
| 2012/0032730 A1 | 2/2012 | Koyama | |
| 2012/0104385 A1* | 5/2012 | Godo | H01L 29/7869 257/43 |
| 2012/0119205 A1 | 5/2012 | Taniguchi et al. | |
| 2012/0241738 A1 | 9/2012 | Imoto et al. | |
| 2014/0027762 A1 | 1/2014 | Tsurume et al. | |
| 2014/0306217 A1 | 10/2014 | Yamazaki et al. | |

(56) References Cited

U.S. PATENT DOCUMENTS

| | | | |
|---|---|---|---|
| 2014/0339538 | A1 | 11/2014 | Yamazaki et al. |
| 2014/0339539 | A1 | 11/2014 | Yamazaki et al. |
| 2015/0325600 | A1 | 11/2015 | Sakata et al. |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-165528 A | 6/2006 | |
| JP | 2011-124360 A | 6/2011 | |
| JP | 2011-138934 A | 7/2011 | |
| JP | 2012-257187 A | 12/2012 | |
| WO | WO-2004/114391 | 12/2004 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17 22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09:SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000α C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUs on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

(56) References Cited

OTHER PUBLICATIONS

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al.. "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2. pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", Am-Fpd '09 Digest of Technical Papers, Jul. 1, 2009, pp. 33-36. Eng. Eng.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-72104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

* cited by examiner

SEMICONDUCTOR DEVICE AND METHOD FOR MANUFACTURING SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. In particular, an embodiment of the present invention relates to a semiconductor device or a manufacturing method of a semiconductor device.

In this specification, a semiconductor device generally means a device which can function by utilizing semiconductor characteristics. A display device, a light-emitting device, a lighting device, an electro-optical device, a semiconductor circuit, and an electronic device may include a semiconductor device.

2. Description of the Related Art

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to a transistor, and in addition, an oxide semiconductor has been attracting attention.

For example, a transistor including an amorphous oxide semiconductor film containing indium (In), gallium (Ga), and zinc (Zn) is disclosed in Patent Document 1.

Techniques for improving carrier mobility by stacking oxide semiconductor films are disclosed in Patent Documents 2 and 3.

A transistor including an oxide semiconductor film is known to have extremely low leakage current in an off state. For example, a CPU with low-power consumption utilizing the low leakage current of the transistor including an oxide semiconductor film is disclosed (see Patent Document 4).

REFERENCE

Patent Document

[Patent Document 1] Japanese Published Patent Application No. 2006-165528
[Patent Document 2] Japanese Published Patent Application No. 2011-124360
[Patent Document 3] Japanese Published Patent Application No. 2011-138934
[Patent Document 4] Japanese Published Patent Application No. 2012-257187

SUMMARY OF THE INVENTION

Miniaturization of transistors has been progressing with an increase in the degree of integration of circuits. Miniaturization of transistors may cause deterioration of the electrical characteristics of the transistors, such as on-state current, off-state current, threshold voltage, and a subthreshold swing (an S value). In general, a decrease in channel length leads to an increase in off-state current, an increase in variations of threshold voltage, and an increase in S value. A decrease in a channel width leads to a decrease in on-state current.

Thus, an object of one embodiment of the present invention is to provide a semiconductor device having a structure which can prevent deterioration of the electrical characteristics, which becomes more significant with miniaturization. Another object is to provide a highly integrated semiconductor device. Another object is to provide a semiconductor device in which deterioration of on-state current characteristics is reduced. Another object of one embodiment of the present invention is to provide a semiconductor device with low power consumption. Another object of one embodiment of the present invention is to provide a semiconductor device with high reliability. Another object is to provide a semiconductor device which can retain data even when power supply is stopped. Another object of one embodiment of the present invention is to provide a semiconductor device with good characteristics. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first oxide semiconductor film over an insulating surface; a second oxide semiconductor film over the first oxide semiconductor film; a source electrode and a drain electrode in contact with each side surface of the first oxide semiconductor film and the second oxide semiconductor film; a first insulating film and a second insulating film over the source electrode and the drain electrode; a third oxide semiconductor film over the second oxide semiconductor film, the source electrode, and the drain electrode; a gate insulating film over the third oxide semiconductor film; and a gate electrode in contact with an upper surface of the gate insulating film and facing an upper surface and the side surface of the second oxide semiconductor film.

Another embodiment of the present invention is a semiconductor device including a first oxide semiconductor film over an insulating surface; a second oxide semiconductor film over the first oxide semiconductor film; a source electrode and a drain electrode in contact with each side surface of the first oxide semiconductor film and the second oxide semiconductor film; a third oxide semiconductor film over the second oxide semiconductor film, the source electrode, and the drain electrode; a first insulating film and a second insulating film over the third oxide semiconductor film; a gate insulating film over the third oxide semiconductor film, the first insulating film, and the second insulating film; and a gate electrode in contact with an upper surface of the gate insulating film and facing an upper surface and the side surface of the second oxide semiconductor film.

Another embodiment of the present invention is a semiconductor device including a first oxide semiconductor film over an insulating surface; a second oxide semiconductor film over the first oxide semiconductor film; a source electrode and a drain electrode in contact with each side surface of the first oxide semiconductor film and the second oxide semiconductor film; a third oxide semiconductor film over the second oxide semiconductor film, the source electrode, and the drain electrode; a gate insulating film over the third oxide semiconductor film; and a gate electrode in contact with an upper surface of the gate insulating film and facing an upper surface and the side surface of the second oxide semiconductor film.

Another embodiment of the present invention is a semiconductor device including a first wiring and a second wiring whose bottom surfaces and side surfaces are provided in a base insulating film and top surfaces are exposed; a first oxide semiconductor film over the base insulating film; a second oxide semiconductor film over the first oxide semiconductor film; a source electrode and a drain electrode electrically in contact with the first wiring and the second wiring and in contact with each side surface of the first oxide semiconductor film and the second oxide semiconductor film; a third oxide semiconductor film over the second oxide semiconductor film, the source electrode, and the drain electrode; a gate insulating film over the third oxide semiconductor film; and a gate electrode in contact with an upper surface of the gate insulating film and facing an upper surface and the side surface of the second oxide semiconductor film.

In the above structures, the upper surface of the second oxide semiconductor film may be higher than an upper surface of the source electrode and the drain electrode.

Another embodiment of the present invention is a semiconductor device including a first oxide semiconductor film over an insulating surface; a second oxide semiconductor film over the first oxide semiconductor film; a source electrode and a drain electrode in contact with each side surface of the first oxide semiconductor film and the second oxide semiconductor film; a third oxide semiconductor film over the second oxide semiconductor film, the source electrode, and the drain electrode; a gate insulating film over the third oxide semiconductor film; and a gate electrode in contact with an upper surface of the gate insulating film and facing an upper surface and the side surface of the second oxide semiconductor film. The upper surface of the second oxide semiconductor film is lower than an upper surface of the source electrode and the drain electrode.

Another embodiment of the present invention is a semiconductor device including a first oxide semiconductor film over an insulating surface; a second oxide semiconductor film over the first oxide semiconductor film; a source electrode and a drain electrode in contact with each side surface of the first oxide semiconductor film and the second oxide semiconductor film; a third oxide semiconductor film over the second oxide semiconductor film, the source electrode, and the drain electrode; a first insulating film, a second insulating film, and a third insulating film over the third oxide semiconductor film; a gate insulating film over the third oxide semiconductor film and the third insulating film; and a gate electrode in contact with an upper surface of the gate insulating film and facing an upper surface and the side surface of the second oxide semiconductor film. The upper surface of the second oxide semiconductor film is lower than an upper surface of the source electrode and the drain electrode.

In the above structures, a distance in a channel length direction between ends of the second oxide semiconductor film becomes shorter from the bottom surface toward the top surface. Half of a difference in length in the channel length direction between the bottom surface and the top surface of the second oxide semiconductor film may be greater than zero and less than half the length of the bottom surface in the channel length direction.

Another embodiment of the present invention is a manufacturing method of a semiconductor device, including the steps of: forming a first oxide semiconductor film over an insulating surface; forming a second oxide semiconductor film over the first oxide semiconductor film; forming a conductive film over the insulating surface and the second oxide semiconductor film; forming a first insulating film over the conductive film; performing a removing process on the conductive film and the first insulating film to expose the second oxide semiconductor film; etching the conductive film and the first insulating film which are subjected by the removing process to form a source electrode and a drain electrode which are in contact with side surfaces of the first oxide semiconductor film and the second oxide semiconductor film and form a second insulating film and a third insulating film over the source electrode and the drain electrode; forming a third oxide semiconductor film over the second oxide semiconductor film, the source electrode, and the drain electrode; forming a gate insulating film over the third oxide semiconductor film; and forming a gate electrode in contact with an upper surface of the gate insulating film and facing an upper surface and the side surface of the second oxide semiconductor film.

Another embodiment of the present invention is a manufacturing method of a semiconductor device, including the steps of: forming a first oxide semiconductor film over an insulating surface; forming a second oxide semiconductor film over the first oxide semiconductor film; forming a conductive film over the insulating surface and the second oxide semiconductor film; etching the conductive film to form a source electrode and a drain electrode which are in contact with side surfaces of the first oxide semiconductor film and the second oxide semiconductor film; forming a third oxide semiconductor film over the second oxide semiconductor film, the source electrode, and the drain electrode; forming a first insulating film over the third oxide semiconductor film; performing a removing process on the first insulating film to expose the third oxide semiconductor film; etching the first insulating film which is subjected to the removing process to form a second insulating film and a third insulating film; forming a gate insulating film over the third oxide semiconductor film, the second insulating film, and the third insulating film; and forming a gate electrode in contact with an upper surface of the gate insulating film and facing an upper surface and the side surface of the second oxide semiconductor film.

Another embodiment of the present invention is a manufacturing method of a semiconductor device, including the steps of: forming a first oxide semiconductor film over an insulating surface; forming a second oxide semiconductor film over the first oxide semiconductor film; forming a sacrificial layer over the second oxide semiconductor film; forming a conductive film over the insulating surface and the sacrificial layer; performing a lift-off process on the sacrificial layer to form a source electrode and a drain electrode which are in contact with side surfaces of the first oxide semiconductor film and the second oxide semiconductor film; forming a third oxide semiconductor film over the second oxide semiconductor film, the source electrode, and the drain electrode; forming a first insulating film over the third oxide semiconductor film; performing a removing process on the first insulating film to expose the third oxide semiconductor film; etching the first insulating film which is subjected to the removing process to form a second insulating film, a third insulating film, and a fourth insulating film; forming a gate insulating film over the third oxide semiconductor film and the fourth insulating film, the second insulating film, and the third insulating film; and forming a gate electrode in contact with an upper surface of the gate insulating film and facing an upper surface and the side surface of the second oxide semiconductor film.

In the above structures, the removing process may be performed by a chemical mechanical polishing method.

Another embodiment of the present invention is a manufacturing method of a semiconductor device, including the steps of: forming a first oxide semiconductor film over an insulating surface; forming a second oxide semiconductor film over the first oxide semiconductor film; forming a sacrificial layer over the second oxide semiconductor film; forming a conductive film over the insulating surface and the sacrificial layer; performing a lift-off process on the sacrificial layer to form a source electrode and a drain electrode which are in contact with side surfaces of the first oxide semiconductor film and the second oxide semiconductor film; forming a third oxide semiconductor film over the second oxide semiconductor film, the source electrode, and the drain electrode; forming a gate insulating film over the third oxide semiconductor film; and forming a gate electrode in contact with an upper surface of the gate insulating film and facing an upper surface and the side surface of the second oxide semiconductor film.

Another embodiment of the present invention is a manufacturing method of a semiconductor device, including the steps of: forming a first oxide semiconductor film over an insulating surface; forming a second oxide semiconductor film over the first oxide semiconductor film; forming a conductive film over the insulating surface and the second oxide semiconductor film; etching the conductive film to form a source electrode and a drain electrode which are in contact with side surfaces of the first oxide semiconductor film and the second oxide semiconductor film; forming a third oxide semiconductor film over the second oxide semiconductor film, the source electrode, and the drain electrode; forming a gate insulating film over the third oxide semiconductor film; and forming a gate electrode in contact with an upper surface of the gate insulating film and facing an upper surface and the side surface of the second oxide semiconductor film.

Another embodiment of the present invention is a manufacturing method of a semiconductor device, including the steps of: forming a first wiring and a second wiring over an insulating surface; forming a base insulating film over the insulating surface, the first wiring, and the second wiring; exposing upper surfaces of the first wiring and the second wiring; forming a first oxide semiconductor film over the base insulating film; forming a second oxide semiconductor film over the first oxide semiconductor film; forming a conductive film over the first wiring, the second wiring, and the second oxide semiconductor film; etching the conductive film to form a source electrode and a drain electrode which are in contact with the first wiring and the second wiring and with side surfaces of the first oxide semiconductor film and the second oxide semiconductor film; forming a third oxide semiconductor film over the second oxide semiconductor film, the source electrode, and the drain electrode; forming a gate insulating film over the third oxide semiconductor film; and forming a gate electrode in contact with an upper surface of the gate insulating film and facing an upper surface and the side surface of the second oxide semiconductor film.

In one embodiment of the present invention, a semiconductor device can be provided in which deterioration of electrical characteristics which becomes more noticeable as the transistor is miniaturized can be suppressed. A highly integrated semiconductor device can be provided. A semiconductor device in which deterioration of on-state current characteristics is reduced can be provided. A semiconductor device with low power consumption can be provided. A highly reliable semiconductor device can be provided. A semiconductor device which can retain data even when power supply is stopped can be provided.

DETAILED DESCRIPTION OF THE INVENTION

Figure 1A:
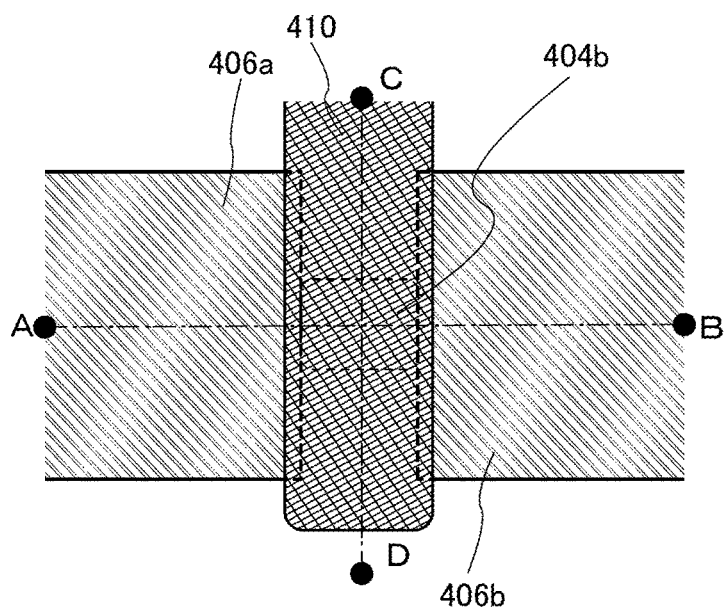
FIGS. 1A to 1C are a top view and cross-sectional views of a transistor.

Embodiments will be described in detail with reference to drawings. Note that the present invention is not limited to the following description and it will be readily appreciated by those skilled in the art that modes and details can be modified in various ways without departing from the spirit and the scope of the present invention. Therefore, the present invention should not be interpreted as being limited to the description of Embodiments below. Note that in structures of the present invention described below, the same portions or portions having similar functions are denoted by the same reference numerals in different drawings, and description thereof is not repeated in some cases.

Note that functions of a "source" and a "drain" of a transistor are sometimes replaced with each other when a transistor of opposite polarity is used or when the direction of current flowing is changed in circuit operation, for example. Therefore, the terms "source" and "drain" can be replaced with each other in this specification.

Note that what is described (or part thereof) in an embodiment can be applied to, combined with, or exchanged with another content in the same embodiment and/or what is described (or part thereof) in another embodiment or other embodiments.

Note that in each embodiment, a content described in the embodiment is a content described with reference to a variety of diagrams or a content described with a text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Embodiment 1

In this embodiment, a semiconductor device which is one embodiment of the present invention is described with reference to drawings.

Figure 1B:
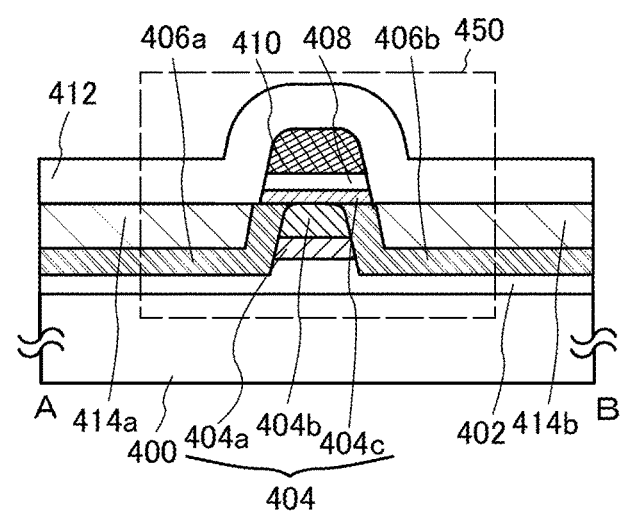
Figure 1C:
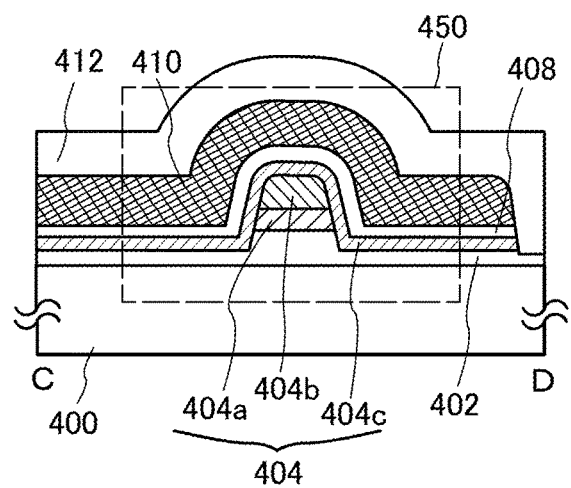

FIGS. 1A to 1C are a top view and cross-sectional views which illustrate a transistor of one embodiment of the present invention. FIG. 1A illustrates a top view. FIG. 1B illustrates a cross section taken along the dashed-dotted line A-B of FIG. 1A. FIG. 1C illustrates a cross section taken along the dashed-dotted line C-D of FIG. 1A. Note that for simplification of the drawing, some components in the top view of FIG. 1A are not illustrated. The direction of the dashed-dotted line A-B and the direction of the dashed-dotted line C-D can be referred to as a channel length direction and a channel width direction, respectively.

A transistor 450 illustrated in FIGS. 1A to 1C includes a base insulating film 402 having a depressed portion and a projected portion over a substrate 400; a first oxide semiconductor film 404a and a second oxide semiconductor film 404b over the projected portion of the base insulating layer 402; a source electrode 406a and a drain electrode 406b in contact with the side surfaces of the first oxide semiconductor film 404a and the second oxide semiconductor film 404b;

an insulating film 414a and an insulating film 414b over the source electrode 406a and the drain electrode 406b; a third oxide semiconductor film 404c over the second oxide semiconductor film 404b, the source electrode 406a, and the drain electrode 406b; a gate insulating film 408 over the third oxide semiconductor film 404c; a gate electrode 410 which is over and in contact with the gate insulating film 408 and faces the top surface of the second oxide semiconductor film 404b and the side surface of the second oxide semiconductor film 404b; and an oxide insulating film 412 over the insulating films 414a and 414b and the gate electrode 410. The first oxide semiconductor film 404a, the second oxide semiconductor film 404b, and the third oxide semiconductor film 404c are collectively referred to as a multilayer film 404.

Note that a channel length means a distance between a source (a source region or a source electrode) and a drain (a drain region or a drain electrode) in a region where a semiconductor film and a gate electrode overlap with each other in a top view. Accordingly, in FIG. 1A, the channel length is a distance between the source electrode 406a and the drain electrode 406b in a region where the second oxide semiconductor film 404b and the gate electrode 410 overlap with each other. A channel width means a length of a portion where a source and a drain face each other in parallel and where a semiconductor film and a gate electrode overlap with each other. Accordingly, in FIG. 1A, the channel width is a length of a portion where the source electrode 406a and the drain electrode 406b face each other and where the second oxide semiconductor film 404b and the gate electrode 410 overlap with each other.

In fabricating a transistor with a small channel length and a small channel width, an electrode, a semiconductor film, or the like is processed while a resist mask is reduced in size and consequently has a round upper end portion (curved surface) in some cases. With this structure, the coverage with the gate insulating film 408, the gate electrode 410, and the oxide insulating film 412, which are to be formed over the second oxide semiconductor film 404b, can be improved. In addition, electric field concentration which might occur at end portions of the source electrode 406a and the drain electrode 406b can be reduced, which can suppress deterioration of the transistor.

The source and drain electrodes 406a and 406b of the transistor 450 in FIGS. 1A to 1C can be formed by performing removing (polishing) treatment on a conductive film which is to be the source and drain electrodes 406a and 406b.

A large current can flow in the whole (bulk) of the second oxide semiconductor film 404b which is a channel because the side surfaces of the source electrode 406a and the drain electrode 406b are in contact with the side surfaces of the second oxide semiconductor film 404b, so that high on-state current can be obtained.

Miniaturization of a transistor leads to high integration and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Moreover, the gate electrode 410 electrically surrounds the second oxide semiconductor film 404b, so that on-state current is increased. Such a transistor structure is referred to as a surrounded channel (s-channel) structure. Note that in the s-channel structure, current flows in the whole of the second oxide semiconductor film 404b. When current flows inside the second oxide semiconductor film 404b, the current is hardly affected by interface scattering, leading to high on-state current. Note that when the second oxide semiconductor film 404b is thick, the on-state current can be further increased. Furthermore, the gate electrode 410 extending lower than the interface between the first oxide semiconductor film 404a and the second oxide semiconductor film 404b toward the base insulating film 402 side does not affect the channel width. Thus, the channel width can be reduced, achieving high density (high integration).

The substrate 400 is not limited to a simple supporting substrate, and may be a substrate where a device such as a transistor is formed. In that case, at least one of the gate electrode 410, the source electrode 406a, and the drain electrode 406b of the transistor 450 may be electrically connected to the above device.

The base insulating film 402 can have a function of supplying oxygen to the multilayer film 404 as well as a function of preventing diffusion of impurities from the substrate 400. For this reason, the base insulating film 402 preferably contains oxygen and more preferably contains oxygen more than the stoichiometric composition. Moreover, when the substrate 400 is provided with another device as described above, the base insulating film 402 also has a function as an interlayer insulating film. In that case, since the base insulating film 402 has an uneven surface, the base insulating film 402 is preferably subjected to planarization treatment such as chemical mechanical polishing (CMP) treatment so as to have a flat surface.

In a region of the transistor 450 where a channel is formed, the multilayer film 404 has a structure in which the first oxide semiconductor film 404a, the second oxide semiconductor film 404b, and the third oxide semiconductor film 404c are stacked in this order from the substrate 400 side. The second oxide semiconductor film 404b is surrounded by the first oxide semiconductor film 404a and the third oxide semiconductor film 404c. As in FIG. 1C, the gate electrode 410 electrically surrounds the second oxide semiconductor film 404b.

Here, for the second oxide semiconductor film 404b, for example, an oxide semiconductor whose electron affinity (an energy difference between a vacuum level and the conduction band minimum) is higher than those of the first semiconductor oxide film 404a and the third oxide semiconductor film 404c is used. The electron affinity can be obtained by subtracting an energy difference between the conduction band minimum and the valence band maximum (what is called an energy gap) from an energy difference between the vacuum level and the valence band maximum (what is called an ionization potential).

The first oxide semiconductor film 404a and the third oxide semiconductor film 404c each contain one or more kinds of metal elements forming the second oxide semiconductor film 404b. For example, the first oxide semiconductor film 404a and the third oxide semiconductor film 404c are preferably formed using an oxide semiconductor whose conduction band minimum is closer to a vacuum level than that of the second oxide semiconductor film 404b. Furthermore, the energy difference of the conduction band minimum between the second oxide semiconductor film 404b and the first oxide semiconductor film 404a and the energy difference of the conduction band minimum between the second oxide semiconductor film 404b and the third oxide semiconductor film 404c are each preferably greater than or equal to 0.05 eV, 0.07 eV, 0.1 eV, or 0.15 eV and less than or equal to 2 eV, 1 eV, 0.5 eV, or 0.4 eV.

In such a structure, when an electric field is applied to the gate electrode 410, a channel is formed in the second oxide semiconductor film 404b whose conduction band minimum is the lowest in the multilayer film 404. In other words, the structure includes the third oxide semiconductor film 404c between the second oxide semiconductor film 404b and the gate insulating film 408 and thus a channel of the transistor is formed in a region which is not in contact with the gate insulating film 408.

Furthermore, because the first oxide semiconductor film 404a contains one or more kinds of metal elements contained in the second oxide semiconductor film 404b, an interface state is less likely to be formed at the interface of the second oxide semiconductor film 404b with the first oxide semiconductor film 404a than at the interface with the base insulating film 402 on the assumption that the second oxide semiconductor film 404b is in contact with the base insulating film 402. The interface state sometimes forms a channel; therefore, the threshold voltage of the transistor is changed in some cases. Thus, with the first oxide semiconductor film 404a, variation in the electrical characteristics of the transistor, such as a threshold voltage, can be reduced. Furthermore, the reliability of the transistor can be improved.

In addition, because the third oxide semiconductor film 404c contains one or more kinds of metal elements contained in the second oxide semiconductor film 404b, scattering of carriers is less likely to occur at the interface of the second oxide semiconductor film 404b with the third oxide semiconductor film 404c than at the interface with the gate insulating film 408 on the assumption that the second oxide semiconductor film 404b is in contact with the gate insulating film 408. Thus, the field-effect mobility of the transistor can be increased by the presence of the third oxide semiconductor film 404c.

For the first oxide semiconductor film 404a and the third oxide semiconductor film 404c, for example, a material containing Al, Ti, Ga, Ge, Y, Zr, Sn, La, Ce, or Hf with a higher atomic ratio than that used for the second oxide semiconductor film 404b can be used. Specifically, any of the above metal elements in an atomic ratio 1.5 times or more, preferably 2 times or more, further preferably 3 times or more as much as a metal element of the second oxide semiconductor film 404b is contained. Any of the above metal elements is strongly bonded to oxygen and thus has a function of suppressing generation of an oxygen vacancy in the oxide semiconductor films. That is, an oxygen vacancy is less likely to be generated in the first oxide semiconductor film 404a and the third oxide semiconductor film 404c than in the second oxide semiconductor film 404b.

Note that when each of the first oxide semiconductor film 404a, the second oxide semiconductor film 404b, and the third oxide semiconductor film 404c is an In-M-Zn oxide containing at least indium, zinc, and M (M is a metal such as Al, Ti, Ga, Ge, Y, Zr, Sn, La, Ce, or Hf), and the first oxide semiconductor film 404a has an atomic ratio of In to M and Zn which is $x_1:y_1:z_1$, the second oxide semiconductor film 404b has an atomic ratio of In to M and Zn which is $x_2:y_2:z_2$, and the third oxide semiconductor film 404c has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the second oxide semiconductor film 404b, the transistor can have stable electrical characteristics. However, if $y_2$ is 3 times or more as large as $x_2$, the field-effect mobility of the transistor is reduced. For this reason, $y_2$ is preferably smaller than 3 times $x_2$.

In the case where Zn and O are not taken into consideration, the proportion of In and the proportion of M in the first oxide semiconductor film 404a and the third oxide semiconductor film 404c are preferably lower than 50 atomic % and higher than or equal to 50 atomic %, respectively, and further preferably lower than 25 atomic % and higher than or equal to 75 atomic %, respectively. In the case where Zn and O are not taken into consideration, the proportion of In and the proportion of M in the second oxide semiconductor film 404b are preferably higher than or equal to 25 atomic % and lower than 75 atomic %, respectively, and further preferably higher than or equal to 34 atomic % and lower than 66 atomic %, respectively.

The thicknesses of the first oxide semiconductor film 404a and the third oxide semiconductor film 404c are each greater than or equal to 3 nm and less than or equal to 100 nm, preferably greater than or equal to 3 nm and less than or equal to 50 nm. The thickness of the second oxide semiconductor film 404b is greater than or equal to 3 nm and less than or equal to 200 nm, preferably greater than or equal to 3 nm and less than or equal to 100 nm, further preferably greater than or equal to 3 nm and less than or equal to 50 nm. The second oxide semiconductor film 404b is preferably thicker than the first oxide semiconductor film 404a and the third oxide semiconductor film 404c.

For the first oxide semiconductor film 404a, the second oxide semiconductor film 404b, and the third oxide semiconductor film 404c, an oxide semiconductor containing indium, zinc, and gallium can be used, for example. Note that the second oxide semiconductor film 404b preferably contains indium because carrier mobility can be increased.

Note that stable electrical characteristics can be effectively imparted to a transistor including an oxide semiconductor film by reducing the concentration of impurities in the oxide semiconductor film to make the oxide semiconductor film intrinsic or substantially intrinsic. The term "substantially intrinsic" refers to the state where an oxide semiconductor film has a carrier density lower than $1\times10^{17}/cm^3$, preferably lower than $1\times10^{15}/cm^3$, further preferably lower than $1\times10^{13}/cm^3$.

Hydrogen, nitrogen, carbon, silicon, and a metal element other than main components in the oxide semiconductor film are impurities. For example, hydrogen and nitrogen form donor levels to increase the carrier density. Silicon in the oxide semiconductor film forms an impurity level. The impurity level becomes a trap, which might deteriorate the electrical characteristics of the transistor. Accordingly, in the first oxide semiconductor film 404a, the second oxide semiconductor film 404b, and the third oxide semiconductor film 404c and at interfaces between these films, the impurity concentration is preferably reduced.

In order to make the oxide semiconductor film intrinsic or substantially intrinsic, in secondary ion mass spectrometry (SIMS), for example, the concentration of silicon at a certain depth of the oxide semiconductor film or in a certain region of the oxide semiconductor film is preferably lower than $1\times10^{19}$ atoms/cm$^3$, more preferably lower than $5\times10^{18}$ atoms/cm$^3$, still more preferably lower than $1\times10^{18}$ atoms/cm$^3$. Further, the concentration of hydrogen at a certain depth of the oxide semiconductor film or in a certain region of the oxide semiconductor film is preferably lower than or equal to $2\times10^{20}$ atoms/cm$^3$, more preferably lower than or equal to $5\times10^{19}$ atoms/cm$^3$, still more preferably lower than or equal to $1\times10^{19}$ atoms/cm$^3$, yet still more preferably lower than or equal to $5\times10^{18}$ atoms/cm$^3$. The concentration of nitrogen at a certain depth of the oxide semiconductor film or in a certain region of the oxide semiconductor film is preferably lower than $5\times10^{19}$ atoms/cm$^3$, more preferably lower than or equal to $5\times10^{18}$ atoms/cm$^3$, still more preferably lower than or equal to $1\times10^{18}$ atoms/cm$^3$, yet still more preferably lower than or equal to $5\times10^{17}$ atoms/cm$^3$.

When the oxide semiconductor film includes a crystal and silicon or carbon is contained at high concentration, the crystallinity of the oxide semiconductor film might be decreased. In order not to lower the crystallinity of the oxide semiconductor film, for example, the concentration of silicon at a certain depth of the oxide semiconductor film or in a certain region of the oxide semiconductor film is preferably lower than $1\times10^{19}$ atoms/cm$^3$, preferably lower than $5\times10^{18}$ atoms/cm$^3$, more preferably lower than $1\times10^{18}$ atoms/cm$^3$. The concentration of carbon at a certain depth of the oxide semiconductor film or in a certain region of the oxide semiconductor film is preferably lower than $1\times10^{19}$ atoms/cm$^3$, preferably lower than $5\times10^{18}$ atoms/cm$^3$, more preferably lower than $1\times10^{18}$ atoms/cm$^3$, for example.

A transistor in which a highly purified oxide semiconductor film is used for a channel formation region as described above has extremely low off-state current. When the voltage between a source and a drain is set to about 0.1 V, 5 V, or 10 V, for example, the off-state current standardized on the channel width of the transistor can be as low as several yoctoamperes per micrometer to several zeptoamperes per micrometer.

Note that it is preferable that, as in the transistor of one embodiment of the present invention, a region of the multilayer film, which serves as a channel, be not in contact with the gate insulating film for the above-described reason. This is because an insulating film containing silicon is used in many cases as the gate insulating film of the transistor. When a channel is formed at the interface between the gate insulating film and the multilayer film, scattering of carriers may occur at the interface, resulting in a decrease in the field-effect mobility of the transistor. Also from the view of the above, it is preferable that the region of the multilayer film, which serves as a channel, be separated from the gate insulating film.

From the above, the multilayer film 404 has a stacked structure including the first oxide semiconductor film 404a, the second oxide semiconductor film 404b, and the third oxide semiconductor film 404c in this order, a channel can be formed in the second oxide semiconductor film 404b. Thus, the transistor can have a high field-effect mobility and stable electrical characteristics.

Next, the band structure of the multilayer film 404 is described. In the stacked film, In—Ga—Zn oxide with an energy gap of 3.5 eV is used for layers corresponding to the first oxide semiconductor film 404a and the third oxide semiconductor film 404c, and In—Ga—Zn oxide with an energy gap of 3.15 eV is used for a layer corresponding to the second oxide semiconductor film 404b.

The thickness of each of the first oxide semiconductor film 404a, the second oxide semiconductor film 404b, and the third oxide semiconductor film 404c was 10 nm. The energy gap is measured with the use of a spectroscopic ellipsometer (UT-300 manufactured by HORIBA Jobin Yvon). The energy difference between the vacuum level and the top of the valence band was measured using an ultraviolet photoelectron spectroscopy (UPS) device (VersaProbe, ULVAC-PHI, Inc.).

Figure 2A:
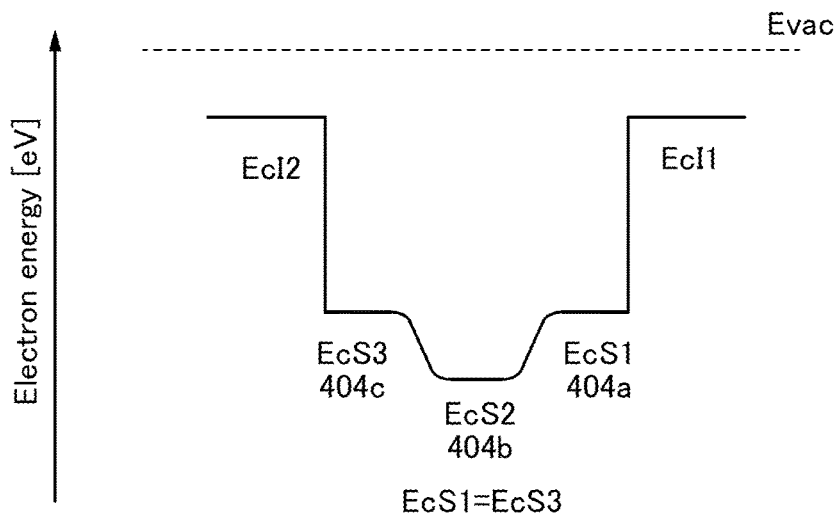
FIGS. 2A and 2B show band structures of multilayer films.

FIG. 2A schematically shows part of a band structure of an energy gap (electron affinity) between the vacuum level and a bottom of a conduction band of each layer, which is calculated by subtracting the energy gap of each layer from the energy gap between the vacuum level and the top of the valence band. FIG. 2A is a band diagram showing the case where silicon oxide films are provided in contact with the first oxide semiconductor film 404a and the third oxide semiconductor film 404c. Here, Evac represents energy of the vacuum level, EcI1 and EcI2 each represent the conduction band minimum of the silicon oxide film, EcS1 represents the conduction band minimum of the first oxide semiconductor film 404a, EcS2 represents the conduction band minimum of the second oxide semiconductor film 404b, and EcS3 represents the conduction band minimum of the third oxide semiconductor film 404c.

As shown in FIG. 2A, the energies of the conduction band minimums of the first oxide semiconductor film 404a, the second oxide semiconductor film 404b, and the third oxide semiconductor film 404c successively vary. This can be understood also from the fact that a common element is contained in the first oxide semiconductor film 404a, the second oxide semiconductor film 404b, and the third oxide semiconductor film 404c and oxygen is easily diffused among the first oxide semiconductor film 404a, the second oxide semiconductor film 404b, and the third oxide semiconductor film 404c. Thus, the first oxide semiconductor film 404a, the second oxide semiconductor film 404b, and the third oxide semiconductor film 404c have a continuous physical property although they have different compositions and form a stack.

The multilayer film 404 in which layers containing the same main components are stacked is formed to have not only a simple stacked-layer structure of the layers but also a continuous energy band (here, in particular, a well structure having a U shape (U shape well) in which the conduction band minimums successively vary between layers). In other words, the stacked-layer structure is formed so that a defect state which serves as a trap canter or a recombination center in an oxide semiconductor, or an impurity which forms a barrier preventing the flow of carriers does not exist at interfaces between the layers. If impurities exist between the stacked layers in the multilayer film, the continuity of the energy band is lost and carriers disappear by a trap or recombination.

Note that FIG. 2A shows the case where EcS1 and EcS3 are similar to each other; however, EcS1 and EcS3 may be different from each other. For example, part of the band structure in the case where EcS1 is higher than EcS3 is shown as in FIG. 2B.

For example, when EcS1 is equal to EcS3, an In—Ga—Zn oxide whose atomic ratio of In to Ga and Zn is 1:3:2, 1:3:3, 1:3:4, 1:6:4, or 1:9:6 can be used for the first oxide semiconductor film 404a and the third oxide semiconductor film 404c and an In—Ga—Zn oxide whose atomic ratio of In to Ga and Zn is 1:1:1 or 3:1:2 can be used for the second oxide semiconductor film 404b. When EcS1 is higher than EcS3, an In—Ga—Zn oxide whose atomic ratio of In to Ga and Zn is 1:6:4 or 1:9:6 can be used for the first oxide semiconductor film 404a, an In—Ga—Zn oxide whose atomic ratio of In to Ga and Zn is 1:1:1 or 3:1:2 can be used for the second oxide semiconductor film 404b, and an In—Ga—Zn oxide whose atomic ratio of In to Ga and Zn is 1:3:2, 1:3:3, or 1:3:4 can be used for the third oxide semiconductor film 404c, for example.

Figure 2B:
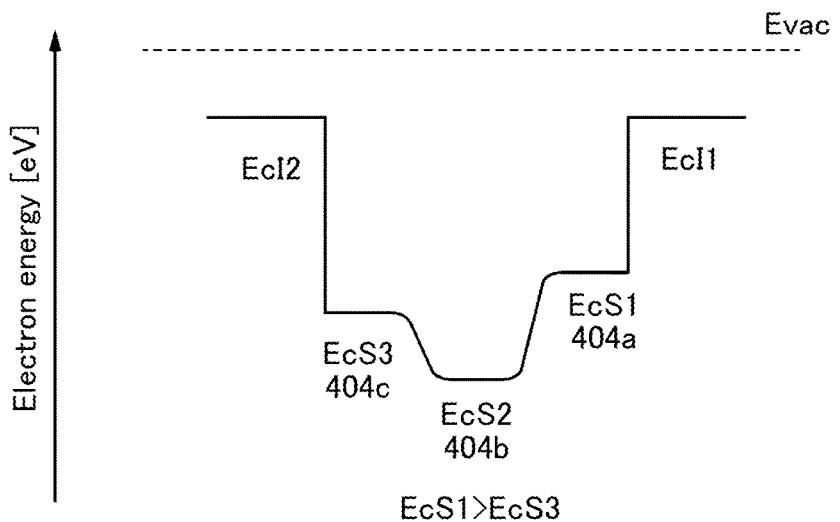

According to FIGS. 2A and 2B, the second oxide semiconductor film 404b of the multilayer film 404 serves as a well, so that a channel is formed in the second oxide semiconductor film 404b in a transistor including the multilayer film 404. Since the energies of the conduction band minimums are continuously changed, the multilayer film 404 can also be referred to as a U-shaped well. A channel formed to have such a structure can also be referred to as a buried channel.

Note that trap levels due to impurities or defects might be formed in the vicinity of the interface between an insulating film such as a silicon oxide film and each of the first oxide semiconductor film 404a and the third oxide semiconductor film 404c. The second oxide semiconductor film 404b can be distanced away from the trap levels owing to existence of the first oxide semiconductor film 404a and the third oxide semiconductor film 404c. However, when the energy difference between EcS1 or EcS3 and EcS2 is small, an electron in the second oxide semiconductor film 404b might reach the trap level by passing over the first oxide semiconductor film 404a or the third oxide semiconductor film 404c. When the electron is trapped by the trap level, the threshold voltage of the transistor is shifted in the positive direction.

Thus, to reduce a change in the threshold voltage of the transistor, energy differences between EcS2 and each of EcS1 and EcS3 are necessary. Each of the energy differences is preferably greater than or equal to 0.1 eV, further preferably greater than or equal to 0.15 eV.

The first oxide semiconductor film 404a, the second oxide semiconductor film 404b, and the third oxide semiconductor film 404c preferably include crystal parts. In particular, when a crystal in which c-axes are aligned is used, the transistor can have stable electrical characteristics.

In the case where an In—Ga—Zn oxide is used for the multilayer film 404, it is preferable that the third oxide semiconductor film 404c contain less In than the second oxide semiconductor film 404b so that diffusion of In to the gate insulating film is prevented.

For the source electrode 406a and the drain electrode 406b, a conductive material which can be bonded to oxygen is preferably used. For example, Al, Cr, Cu, Ta, Ti, Mo, or W can be used. Among the materials, in particular, it is preferable to use Ti which is easily bonded to oxygen or W with a high melting point, which allows subsequent process temperatures to be relatively high. Note that the conductive material which can be bonded to oxygen includes, in its category, a material to which oxygen can be diffused.

When the conductive material which can be bonded to oxygen is in contact with a multilayer film, a phenomenon occurs in which oxygen in the multilayer film is diffused to the conductive material which can be bonded to oxygen. The phenomenon noticeably occurs when the temperature is high. Since the fabricating process of the transistor involves some heat treatment steps, the above phenomenon causes generation of oxygen vacancies in the vicinity of a region which is in the multilayer film and is in contact with the source electrode or the drain electrode. Hydrogen slightly contained in the film enters the site of oxygen vacancies, whereby the region is changed to an n-type region. Thus, the n-type region can serve as a source region or a drain region of the transistor.

In the case of forming a transistor with an extremely short channel length, an n-type region which is formed by the generation of oxygen vacancies might extend in the channel length direction of the transistor, causing short-circuit. In that case, the electrical characteristics of the transistor are changed by a threshold voltage shift; for example, on and off of the transistor cannot be controlled with a gate voltage at a practical level (in which case the transistor is on). Accordingly, when a transistor with an extremely short channel length is formed, it is not always preferable that a conductive material which is easily bonded to oxygen be used for a source electrode and a drain electrode.

In such a case, a conductive material which is less likely to be bonded to oxygen than the above material is preferably used for the source electrode 406a and the drain electrode 406b. As the conductive material which is not easily bonded to oxygen, for example, a material containing tantalum nitride, titanium nitride, or ruthenium or the like can be used. When the conductive material is in contact with the second oxide semiconductor film 404b, the source electrode 406a and the drain electrode 406b may be a stack including the conductive material and the aforementioned conductive material which can be bonded to oxygen.

The gate insulating film 408 can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 408 may be a stack including any of the above materials. The gate insulating film 408 may contain lanthanum (La), nitrogen, or zirconium (Zr) as an impurity.

When the specific material is used for the gate insulating film, electrons are trapped in the gate insulating film under the specific conditions and the threshold voltage can be increased. For example, like a stacked-layer film of silicon oxide and hafnium oxide, part of the gate insulating film 408 uses a material having a lot of electron trap states, such as hafnium oxide, aluminum oxide, and tantalum oxide, and the state where the potential of the gate electrode is higher than that of the source electrode or the drain electrode is kept for one second or more, typically one minute or more at a higher temperature (a temperature higher than the operating temperature or the storage temperature of the semiconductor device, or a temperature of 125° C. or higher and 450° C. or lower, typically a temperature of 150° C. or higher and 300° C. or lower). Thus, electrons are moved from the oxide semiconductor film to the gate electrode, and some of the electrons are trapped by the electron trap states.

In the semiconductor device in which a necessary amount of electrons is trapped by the electron trap states in this manner, the threshold voltage is shifted in the positive direction. By controlling the voltage of the gate electrode, the amount of electrons to be trapped can be controlled, and thus the threshold voltage can be controlled. Furthermore, the treatment for trapping the electrons may be performed in the manufacturing process of the semiconductor device.

For example, the treatment is preferably performed at any step before factory shipment, such as after the formation of a wire metal connected to the source electrode or the drain electrode of the semiconductor device, after the preceding process (wafer processing), after a wafer-dicing step, after packaging, or the like. In any case, it is preferable that the transistor be not exposed to a temperature higher than or equal to 125° C. for one hour or more after that.

An example in which the gate insulating film is used also as an electron trap layer (a layer containing electron trap states) is described with reference to simplified cross-sectional views.

Figure 58A:
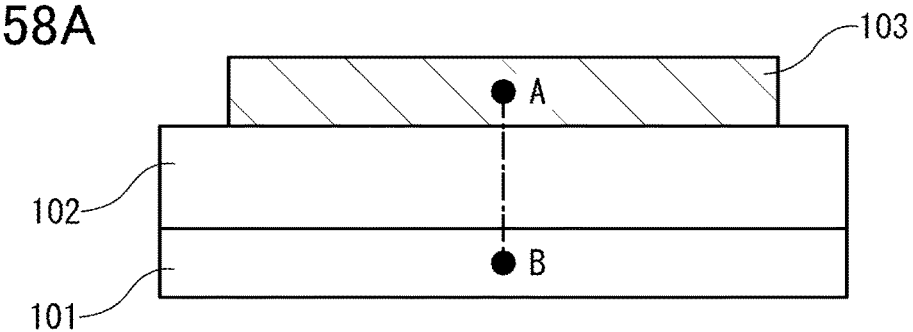
FIGS. 58A to 58C are cross-sectional views of a transistor.

FIG. 58A illustrates a semiconductor device including a semiconductor layer 101, an electron trap layer 102, and a gate electrode 103.

The semiconductor layer 101, the electron trap layer 102, and the gate electrode 103 correspond to the multilayer film 404, the gate insulating film 408, and the gate electrode 410 of FIGS. 1A to 1C, respectively.

The electron trap layer 102 includes a state that traps an electron (electron trap state). Depending on the formation method and formation conditions, such a state is not formed even when the electron trap layer 102 is formed of the same constituent elements.

Figure 58B:
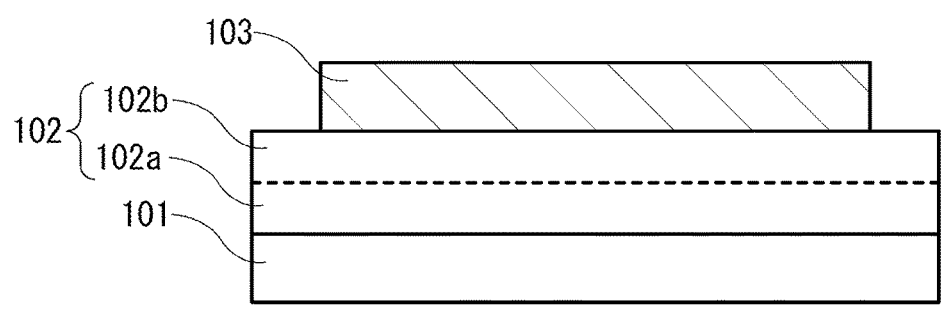
Figure 58C:
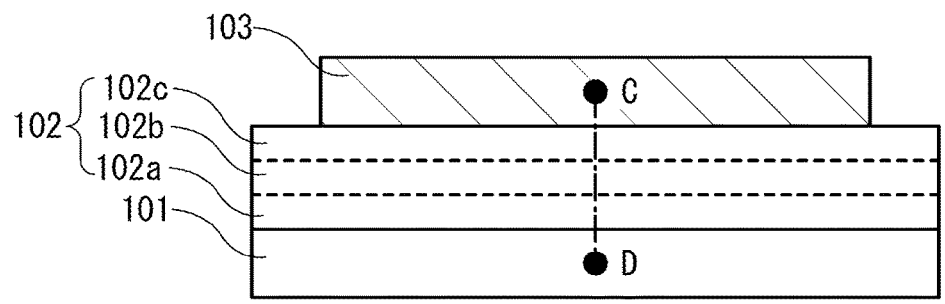

For example, the electron trap layer 102 may be a stacked body that includes a first insulating film 102a formed by a first formation method (or under first formation conditions) and a second insulating film 102b formed by a second formation method (or under second formation conditions) as illustrated in FIG. 58B. Alternatively, the electron trap layer 102 may be a stacked body that includes the first insulating film 102a formed by the first formation method (or under the first formation conditions), the second insulating film 102b formed by the second formation method (or under the second formation conditions), and a third insulating film 102c formed by a third formation method (or under third formation conditions) as illustrated in FIG. 58C, or a stacked body including four or more insulating layers.

Here, the first to third insulating films have the same constituent elements. Note that the first formation method (or the first formation conditions) may be the same as the third formation method (or the third formation conditions). In this case, it is preferable that the number of electron trap states in a layer that is not in contact with the semiconductor layer 101 (e.g., the second insulating film) be large. For example, an insulating film formed by a sputtering method has a higher density of electron trap states than an insulating film formed by a CVD method or an ALD method and having the same composition.

Accordingly, an insulating film formed by a sputtering method may be used as the second insulating film 102b, and an insulating film formed by a CVD method or an ALD method may be used as the first insulating film 102a. In the case of FIG. 58C, the third insulating film 102c may be formed in the same way as the first insulating film 102a. However, the insulating films are not limited thereto in one embodiment of the present invention; an insulating film formed by a CVD method or an ALD method may be used as the second insulating film 102b, and an insulating film formed by a sputtering method may be used as the first insulating film 102a. In the case of FIG. 58C, the third insulating film 102c may be formed in the same way as the first insulating film 102a.

The insulating film formed by a CVD method can function as a normal gate insulating film and thereby can reduce leakage current between a gate and a drain or a source. In contrast, the insulating film formed by a sputtering method has a high density of electron trap states and thereby can make the threshold voltage of the transistor high. Accordingly, this structure enables small leakage current and appropriate threshold voltage adjustment. For this reason, it is preferable to form a stacked structure using different formation methods (or different formation conditions). Note that one embodiment of the present invention is not limited to these examples.

Furthermore, the formation method of the semiconductor layer 101 and the formation method of the first insulating film 102a that is in contact with the semiconductor layer 101 may be the same for easy successive formation. For example, in the case of forming the semiconductor layer 101 by a sputtering method, the first insulating film 102a may also be formed by a sputtering method and then the second insulating film 102b may be formed by a CVD method or an ALD method. In the case of FIG. 58C, the third insulating film 102c may also be formed by a sputtering method. Similarly, in the case of forming the semiconductor layer 101 by a CVD method, the first insulating film 102a may also be formed by a CVD method and then the second insulating film 102b may be formed by a sputtering method. In the case of FIG. 58C, the third insulating film 102c may also be formed by a CVD method. These structures enable small leakage current, appropriate threshold voltage adjustment, and easy manufacturing. Note that one aspect of one embodiment of the present invention is not limited to these.

Note that an insulating film formed by a CVD method or an ALD method is preferably formed thicker than an insulating film formed by a sputtering method. This can reduce an electrical breakdown, increases withstand voltage, and reduces leakage current. Note that one embodiment of the present invention is not limited to the examples described above.

Note that the CVD method may be any of a variety of methods: a thermal CVD method, a photo CVD method, a plasma CVD method, a MOCVD method, an LPCVD method, and the like. The insulating films may be formed by different CVD methods.

Figure 59A:
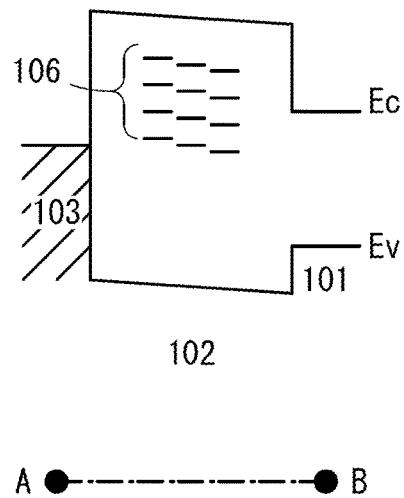
FIGS. 59A to 59D illustrate band structures.

FIG. 59A illustrates a band diagram example of the semiconductor device illustrated in FIG. 58A, from point A to point B. In the drawings, Ec represents a conduction band minimum and Ev represents a valence band maximum. In FIG. 59A, the potential of the gate electrode 103 is the same as the potential of a source electrode or a drain electrode (not illustrated).

Figure 59B:
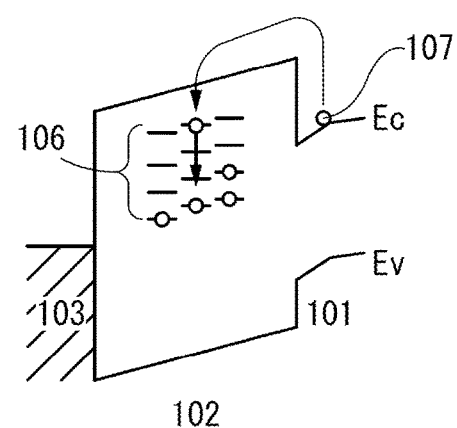

The electron trap states 106 exist inside the electron trap layer 102. FIG. 59B shows the state where the potential of the gate electrode 103 is higher than the potential of the source or drain electrode. The potential of the gate electrode 103 may be higher than the potential of the source or drain electrode by 1 V or more. After this process, the potential of the gate electrode 103 may be lower than the highest potential applied to the gate electrode 103, which is typically less than 4 V.

Electrons 107 that exist in the semiconductor layer 101 move toward the gate electrode 103 having a higher potential. Some of the electrons 107 moving from the semiconductor layer 101 toward the gate electrode 103 are trapped in the electron trap states 106.

To hold electrons trapped by electron trap states inside the second insulating film 102b or at the interface with another insulating film, it is effective that the electron trap layer 102 is formed of three insulating film as illustrated in FIG. 58C by different formation methods (or different formation conditions) and that the number of electron trap states in the second insulating film 102b is larger than that of the other films.

Figure 59C:
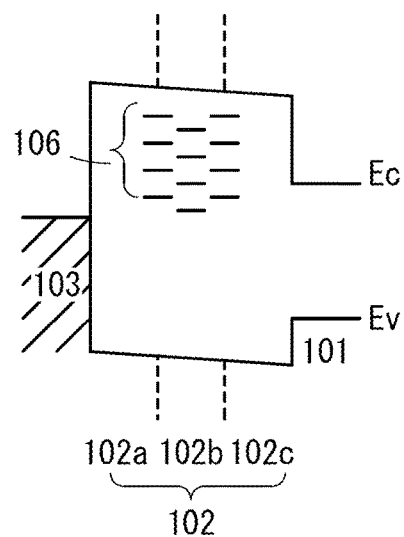

In this case, if the physical thickness of the third insulating film 102c is large enough, electrons trapped by the electron trap states 106 can be held even when the second insulating film 102b has a small thickness. FIG. 59C illustrates a band diagram example of the semiconductor device illustrated in FIG. 58C, from point C to point D. Note that if the formation method (or formation conditions) is different, materials including the same constituent elements have different number of oxygen vacancies or the like and thus may have different Fermi levels. However, in the example described below, it is assumed that such materials have the same Fermi level.

The second insulating film 102b is formed by a formation method (or under formation conditions) that makes the number of electron trap states 106 larger. Accordingly, the number of electron trap states at the interface between the first insulating film 102a and the second insulating film 102b and at the interface between the second insulating film 102*b* and the third insulating film 102*c* is large.

Figure 59D:
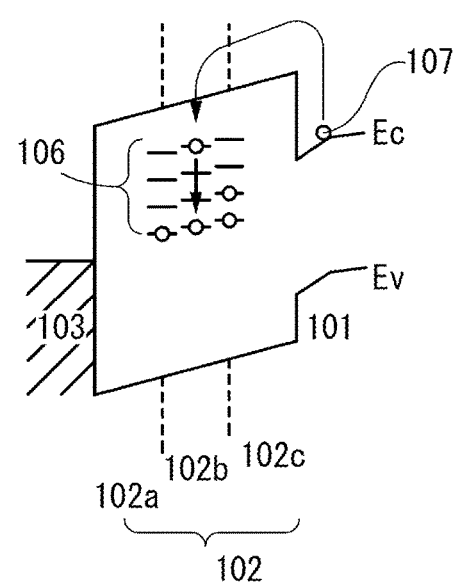

By setting the potential of the gate electrode 103 and the temperature at the above-described conditions, electrons from the semiconductor layer 101 are trapped by the electron trap states 106 as described with FIG. 59B, so that the electron trap layer 102 is negatively charged (see FIG. 59D).

Figure 60A:
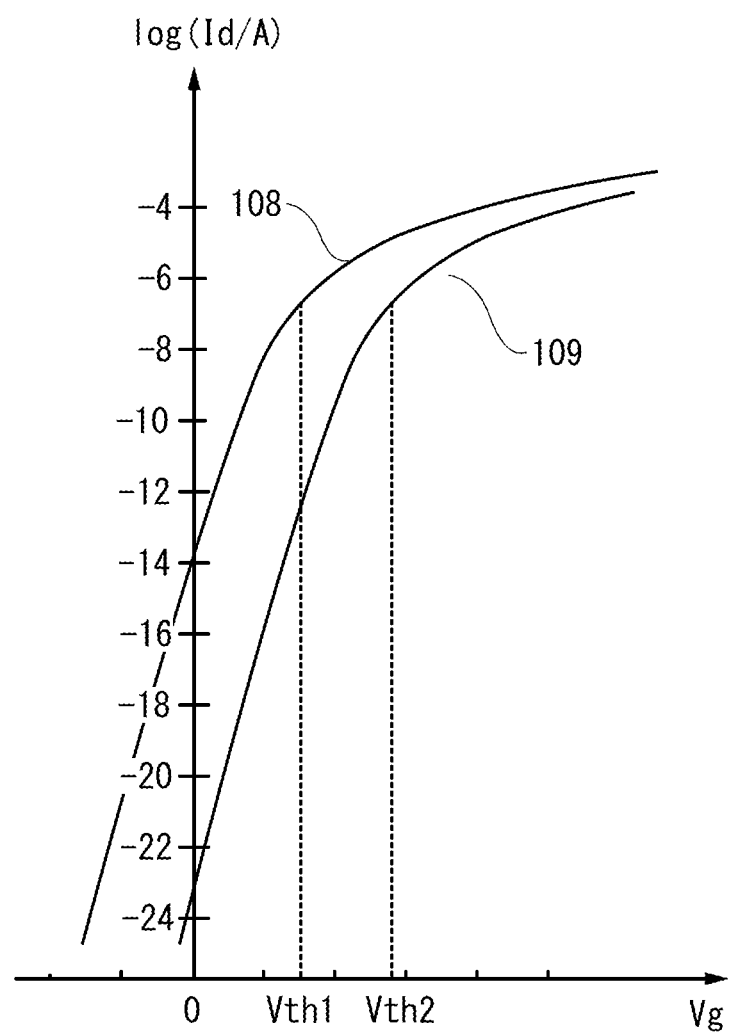
FIGS. 60A and 60B illustrate electrical characteristics of a transistor.

The threshold voltage of a semiconductor device is increased as shown in FIG. 60A by the trap of electrons in the electron trap layer 102. In particular, when the semiconductor layer 101 is formed using a wide band gap material, a source-drain current (cut-off current, Icut) when the potential of the gate electrode 103 is equal to the potential of the source electrode can be significantly decreased.

For example, the Icut density (a current value per micrometer of a channel width) of an In—Ga—Zn-based oxide whose band gap is 3.2 eV is 1 zA/μm ($1 \times 10^{-21}$ A/μm) or less, typically 1 yA/μm ($1 \times 10^{-24}$ A/μm) or less.

FIG. 60A schematically shows dependence of current per micrometer of channel width (Id/A) between source and drain electrodes on the potential of the gate electrode 103 (Vg) at room temperature, before and after electron trap in the electron trap layer 102. Note that each potential of the source electrode and the gate electrode 103 is 0 V and the potential of the drain electrode is +1 V. Although current smaller than 1 fA cannot be measured directly, it can be estimated from a value measured by another method, that is, the subthreshold value, and the like.

As indicated by a curve 108, the threshold voltage of the semiconductor device is Vth1 at first. After electron trapping, the threshold voltage increases (shifts in the positive direction) to become Vth2. As a result, the current density when Vg=0 becomes 1 aA/μm ($1 \times 10^{-18}$ A/μm) or less, for example, greater than or equal to 1 zA/μm and less than or equal to 1 yA/μm.

Figure 60B:
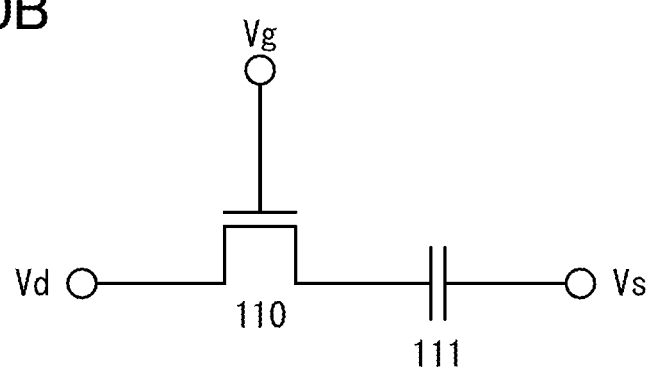

FIG. 60B illustrates a circuit in which charge stored in a capacitor 111 is controlled by a transistor 110. Leakage current between electrodes of the capacitor 111 is ignored here. The capacitance of the capacitor 111 is 1 fF, the potential of the capacitor 111 on the transistor 110 side is +1 V, and the potential of Vd is 0 V.

The curve 108 in FIG. 60A denotes the Id-Vg characteristics of the transistor 110. When the channel width is 0.1 μm, the Icut density is approximately 1 fA and the resistivity of the transistor 110 at this time is approximately $1 \times 10^{15} \Omega$. Accordingly, the time constant of a circuit composed of the transistor 110 and the capacitor 111 is approximately one second. This means that most of the charge stored in the capacitor 111 is lost in approximately one second.

The curve 109 in FIG. 60A denotes the Id-Vg characteristics of the transistor 110. When the channel width is 0.1 μm, the Icut density is approximately 1 yA and the resistivity of the transistor 110 at this time is approximately $1 \times 10^{24} \Omega$. Accordingly, the time constant of the circuit composed of the transistor 110 and the capacitor 111 is approximately $1 \times 10^9$ seconds (=approximately 31 years). This means that one-third of the charge stored in the capacitor 111 is left after 10 years.

From this, charge can be held for 10 years in a simple circuit composed of a transistor and a capacitor without applying such a large voltage. This can be applied to various kinds of memory devices, such as memory cells illustrated in FIG. 63 described later.

As the semiconductor layer 101, it is effective to use a layer whose hole effective mass is extremely large or substantially localized such as an intrinsic or substantially intrinsic oxide semiconductor film. In this case, hole injection from the semiconductor layer 101 to the electron trap layer 102 does not occur and consequently a phenomenon in which electrons trapped by the electron trap states 106 bond to holes and disappear does not occur. Accordingly, the charge retention characteristics can be improved.

For the gate electrode 410, a conductive film formed using Al, Ti, Cr, Co, Ni, Cu, Y, Zr, Mo, Ru, Ag, Ta, W, or the like can be used. The gate electrode may be a stack of any of the above materials. Alternatively, a conductive film containing nitrogen may be used for the gate electrode 410.

The oxide insulating film 412 may be formed over the gate insulating film 408 and the gate electrode 410. The oxide insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The oxide insulating film may have a stacked structure of any of the above materials.

The oxide insulating film 412 preferably contains excess oxygen. An oxide insulating film containing excess oxygen refers to an oxide insulating film from which oxygen can be released by heat treatment or the like. A film in which the amount of released oxygen when converted into oxygen atoms is $1.0 \times 10^{19}$ atoms/cm$^3$ or more in thermal desorption spectroscopy analysis is preferable. Note that the substrate temperature in the thermal desorption spectroscopy analysis is preferably higher than or equal to 100° C. and lower than or equal to 700° C., or higher than or equal to 100° C. and lower than or equal to 500° C. Oxygen released from the oxide insulating film can be diffused to the channel formation region in the multilayer film 404 through the gate insulating film 408, so that oxygen vacancies formed in the channel formation region can be filled with the oxygen. As a result, stable electrical characteristics of the transistor can be achieved.

High integration of a semiconductor device requires miniaturization of a transistor. However, it is known that miniaturization of a transistor causes deterioration of the electrical characteristics of the transistor. In particular, on-state current, which is directly caused by a decrease in channel width, is significantly reduced.

However, in the transistor of one embodiment of the present invention, as described above, the third oxide semiconductor film 404*c* is formed so as to cover a region where the channel is formed in the second oxide semiconductor film 404*b*, and a channel formation layer and the gate insulating film are not in contact with each other. Accordingly, scattering of carriers at the interface between the channel formation layer and the gate insulating film can be reduced and the field-effect mobility of the transistor can be increased.

In the case where an oxide semiconductor film is an intrinsic or substantially intrinsic oxide semiconductor film, it is concerned that the field-effect mobility is decreased because of a reduction in the number of carriers in the oxide semiconductor film. However, in the transistor of one embodiment of the present invention, a gate electric field is applied to the oxide semiconductor film not only in the vertical direction but also in the side surface directions. That is, the gate electric field is applied to the whole of the oxide semiconductor film, whereby current flows in the bulk of the oxide semiconductor film. Consequently, a change in the electrical characteristics can be suppressed owing to the highly purified intrinsic oxide semiconductor layer and the field-effect mobility of the transistor can be increased.

In the transistor of one embodiment of the present invention, the second oxide semiconductor film 404b is formed over the first oxide semiconductor film 404a, so that an interface state is less likely to be formed. In addition, impurities do not enter the second oxide semiconductor film 404b from above and below because the second oxide semiconductor film 404b is an intermediate layer in a three-layer structure. With the structure in which the second oxide semiconductor film 404b is surrounded by the first oxide semiconductor film 404a and the third oxide semiconductor film 404c, on-state current of the transistor is increased as described above, and in addition, threshold voltage can be stabilized and an S value can be reduced. Thus, Icut (drain current when gate voltage is 0 V) can be reduced and power consumption can be reduced. Moreover, the threshold voltage of the transistor becomes stable; thus, long-term reliability of the semiconductor device can be improved.

Figure 3A:
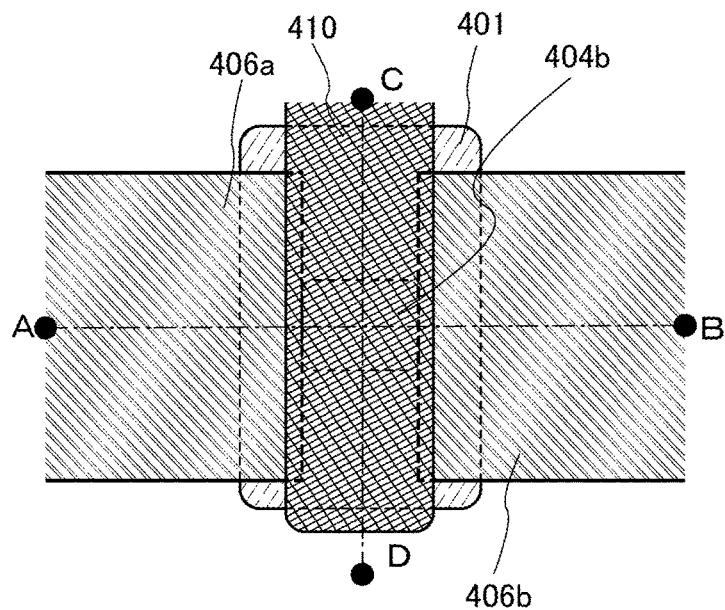
FIGS. 3A to 3C are a top view and cross-sectional views of a transistor.
Figure 3B:
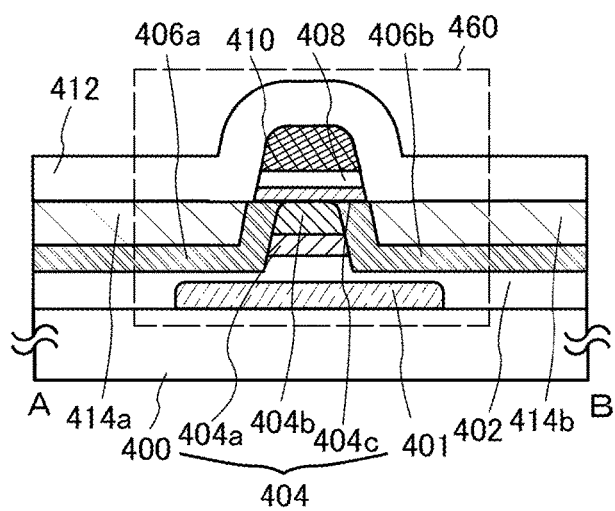
Figure 3C:
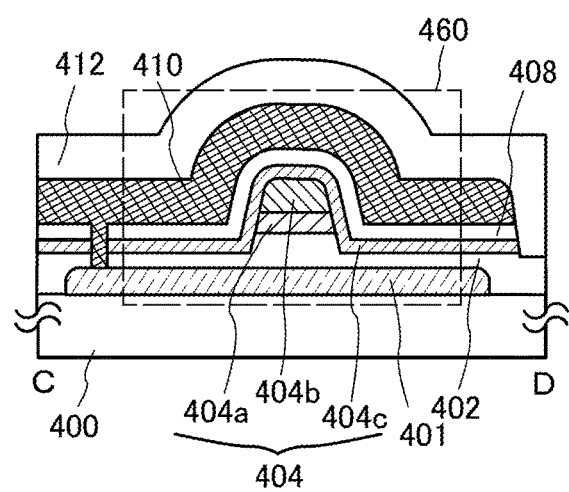

A transistor 460 illustrated in FIGS. 3A to 3C can be used. FIGS. 3A to 3C are a top view and cross-sectional views which illustrate the transistor 460. FIG. 3A is the top view. FIG. 3B illustrates a cross section taken along the dashed-dotted line A-B in FIG. 3A. FIG. 3C illustrates a cross section taken along the dashed-dotted line C-D in FIG. 3A. Note that for simplification of the drawing, some components in the top view in FIG. 3A are not illustrated.

In the transistor 460 shown in FIGS. 3A to 3C, a conductive film 401 is provided between the base insulating film 402 and the substrate 400. When the conductive film 401 is used as a second gate electrode, the on-state current can be further increased or the threshold voltage can be controlled. In order to increase the on-state current, for example, as shown in FIGS. 3A to 3C, the gate electrode 410 and the conductive film 401 are electrically connected to each other to have the same potential, and the transistor is driven as a dual-gate transistor. Alternatively, to control the threshold voltage, the gate electrode 410 and the conductive film 401 are not electrically connected to each other, so that a fixed potential, which is different from a potential of the gate electrode 410, is supplied to the conductive film 401.

Figure 4A:
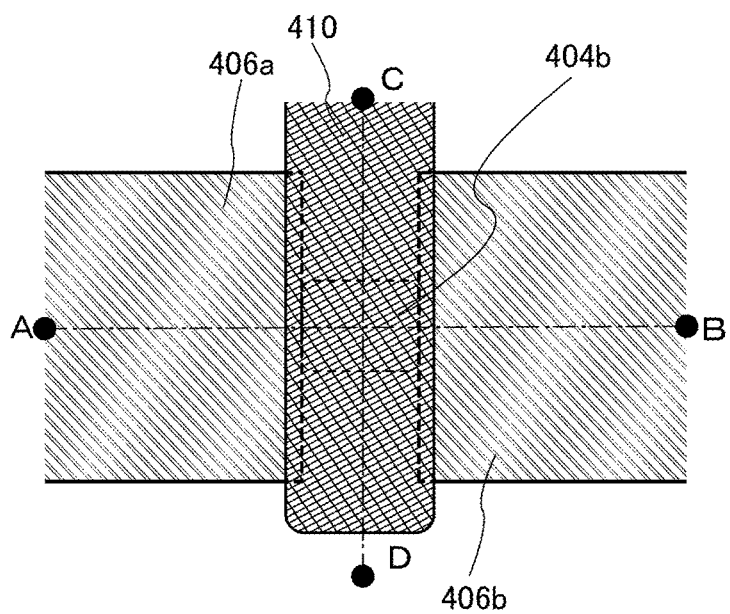
FIGS. 4A to 4C are a top view and cross-sectional views of a transistor.
Figure 4B:
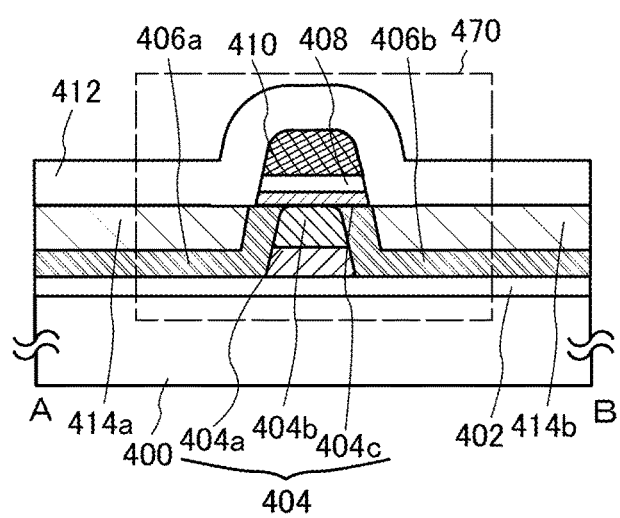
Figure 4C:
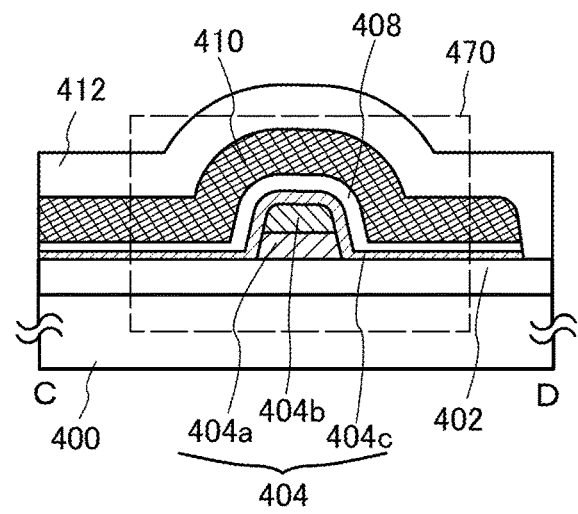

A transistor 470 illustrated in FIGS. 4A to 4C can be used. FIGS. 4A to 4C are a top view and cross-sectional views which illustrate the transistor 470. FIG. 4A illustrates the top view. FIG. 4B illustrates a cross section taken along the dashed-dotted line A-B in FIG. 4A. FIG. 4C illustrates a cross section taken along the dashed-dotted line C-D in FIG. 4A. Note that for simplification of the drawing, some components in the top view in FIG. 4A are not illustrated.

In the transistor 470, overetching of the base insulating film 402 is suppressed when the first oxide semiconductor film 404a and the second oxide semiconductor film 404b are formed and thus the base insulating film 402 is not etched.

In order to prevent the base insulating film 402 from being overetched when the oxide semiconductor films are etched, the etching rate of the base insulating film 402 is sufficiently lower than the etching rate of the oxide semiconductor film.

Note that the conductive film 401 may be provided in FIGS. 4A to 4C as in FIGS. 3A to 3C.

Figure 5A:
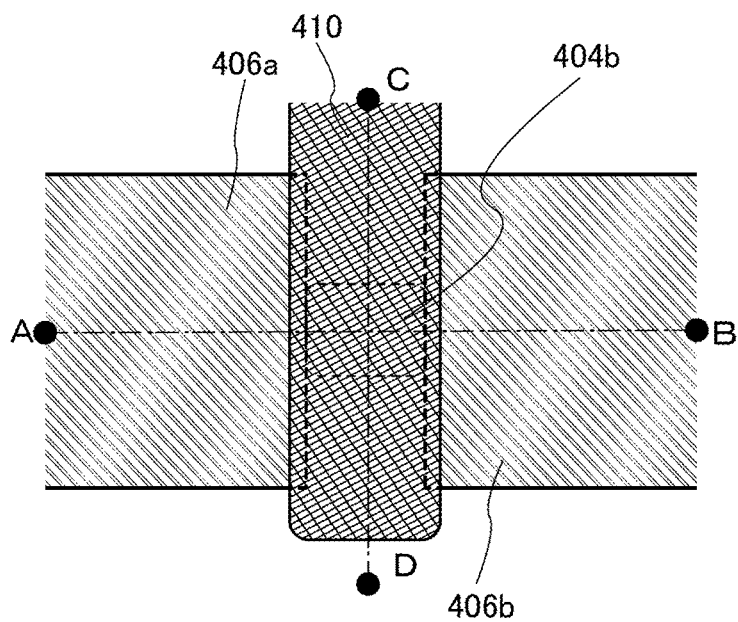
FIGS. 5A to 5C are a top view and cross-sectional views of a transistor.
Figure 5B:
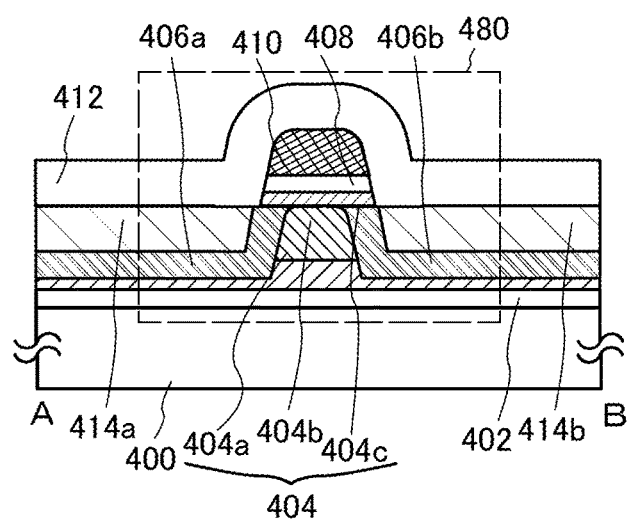
Figure 5C:
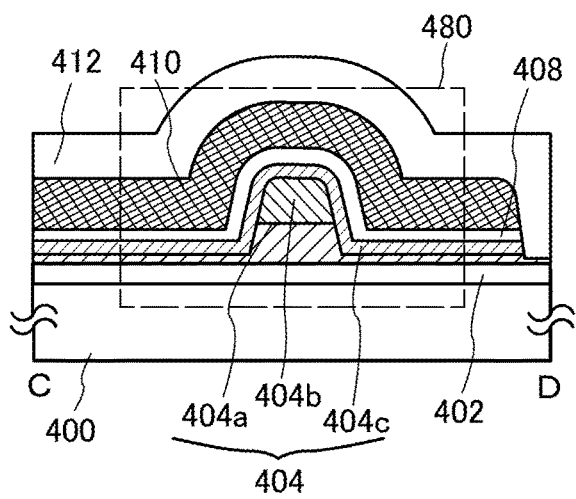

A transistor 480 illustrated in FIGS. 5A to 5C can be used. FIGS. 5A to 5C are a top view and cross-sectional views which illustrate the transistor 480. FIG. 5A is the top view. FIG. 5B illustrates a cross section taken along the dashed-dotted line A-B in FIG. 5A. FIG. 5C illustrates a cross section taken along the dashed-dotted line C-D in FIG. 5A. Note that for simplification of the drawing, some components are not illustrated in the top view of FIG. 5A.

In etching to form the first oxide semiconductor film 404a and the second oxide semiconductor film 404b of the transistor 480, the first oxide semiconductor film is not entirely etched to have a projected shape.

Note that the conductive film 401 may be provided in FIGS. 5A to 5C as in FIGS. 3A to 3C.

The structure in which the second oxide semiconductor film is surrounded between the first oxide semiconductor film and the third oxide semiconductor film is described in this embodiment. Note that one embodiment is not limited to this, a structure in which any one or two of the films is/are not provided. Another oxide semiconductor film may be additionally provided. For example, a structure may be used in which the first oxide semiconductor film and the third oxide semiconductor film are not provided and only the second oxide semiconductor film is electrically surrounded by the gate electrode. Alternatively, a structure in which only the first oxide semiconductor film and the second oxide semiconductor film are electrically surrounded by the gate electrode or a structure in which only the second oxide semiconductor film and the third oxide semiconductor film are electrically surrounded by the gate electrode may be used.

The electrode and the oxide semiconductor film may have angular end portions. In order to obtain the angular end portions, when a film is processed using a resist mask or a hard mask, the etching rate of the film is greatly different from that of the resist mask or the hard mask. A specific structure example is described below.

Figure 6A:
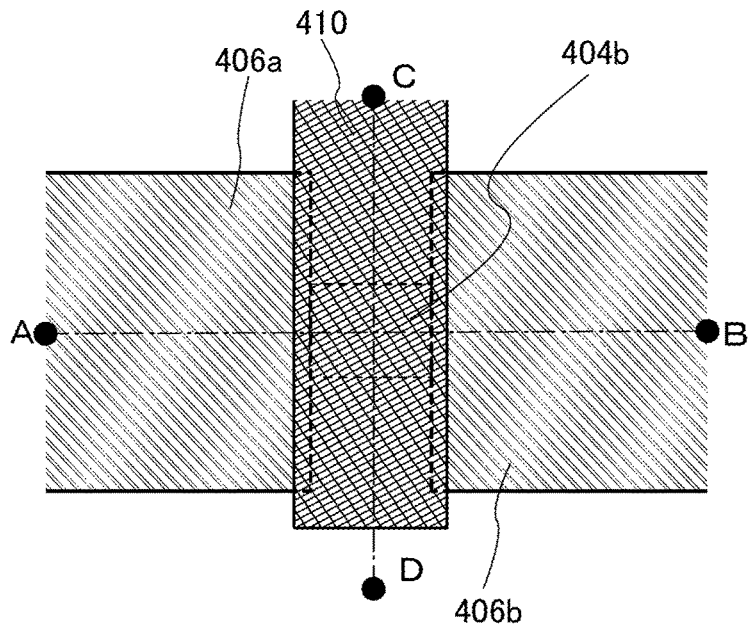
FIGS. 6A to 6C are a top view and cross-sectional views of a transistor.
Figure 6B:
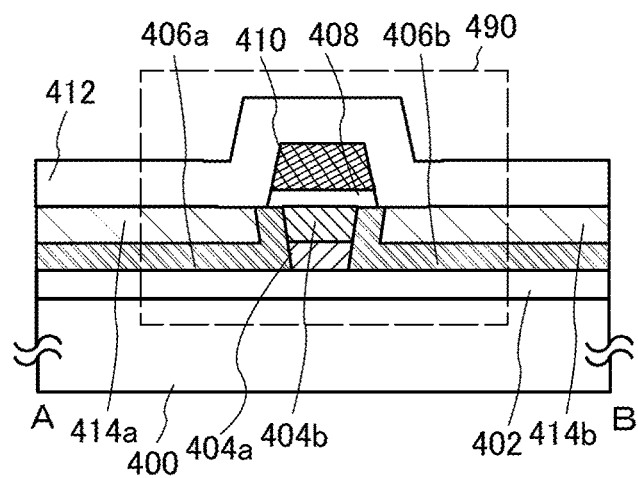
Figure 6C:
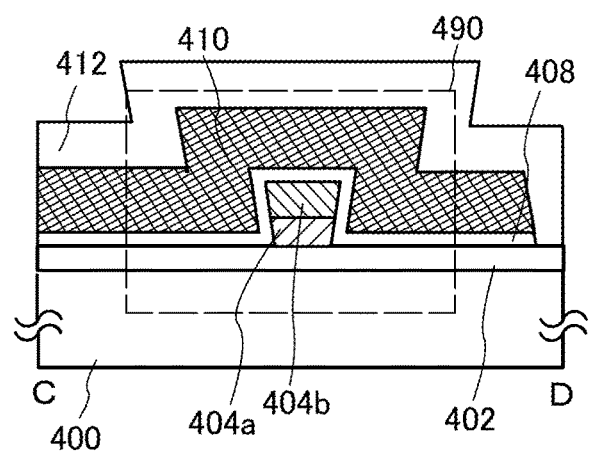

A transistor 490 illustrated in FIGS. 6A to 6C can be used. FIGS. 6A to 6C are a top view and cross-sectional views of the transistor 490. FIG. 6B illustrates a cross section taken along the dashed-dotted line A-B in FIG. 6A. FIG. 6C illustrates a cross section taken along the dashed-dotted line C-D in FIG. 6A. Note that for simplification of the drawing, some components are not illustrated in the top view of FIG. 6A.

In the transistor 490, only the first oxide semiconductor film 404a and the second oxide semiconductor film 404b are electrically surrounded by a gate electrode. The first and second oxide semiconductor films 404a and 404b may have what is called a reverse tapered shape in which the distance between the ends becomes longer from the bottom surface toward the upper surface (here, the upper surface on the gate insulating film 408 side).

Note that the conductive film 401 may be provided in FIGS. 6A to 6C as in FIGS. 3A to 3C.

Figure 7A:
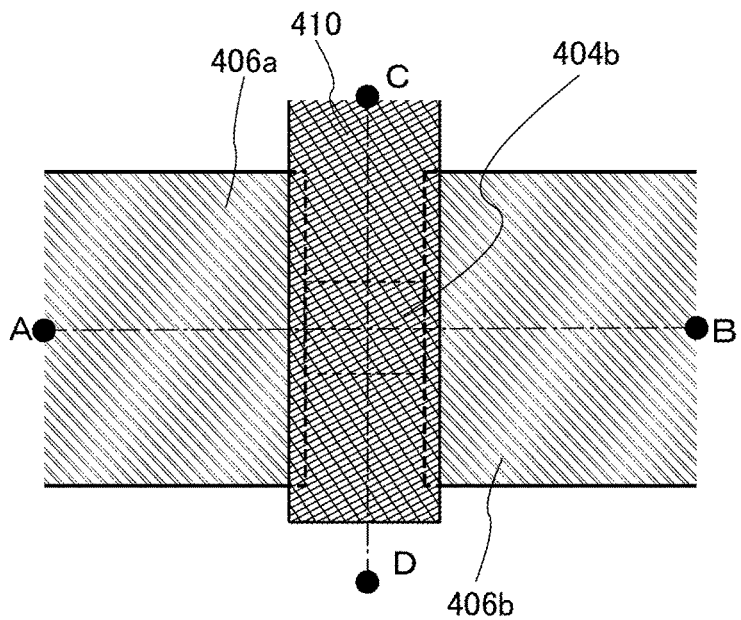
FIGS. 7A to 7C are a top view and cross-sectional views of a transistor.
Figure 7B:
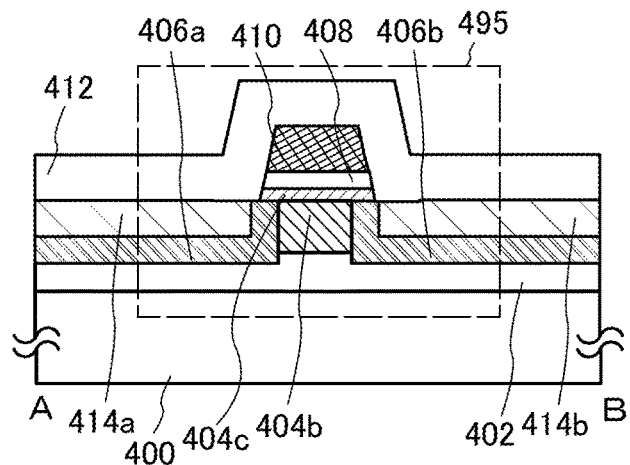
Figure 7C:
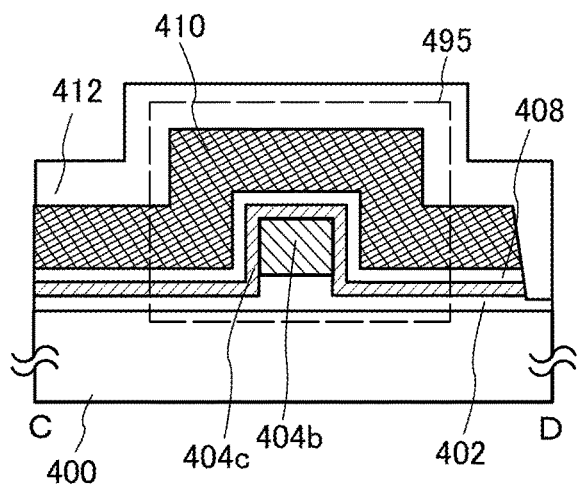
Figure 8A:
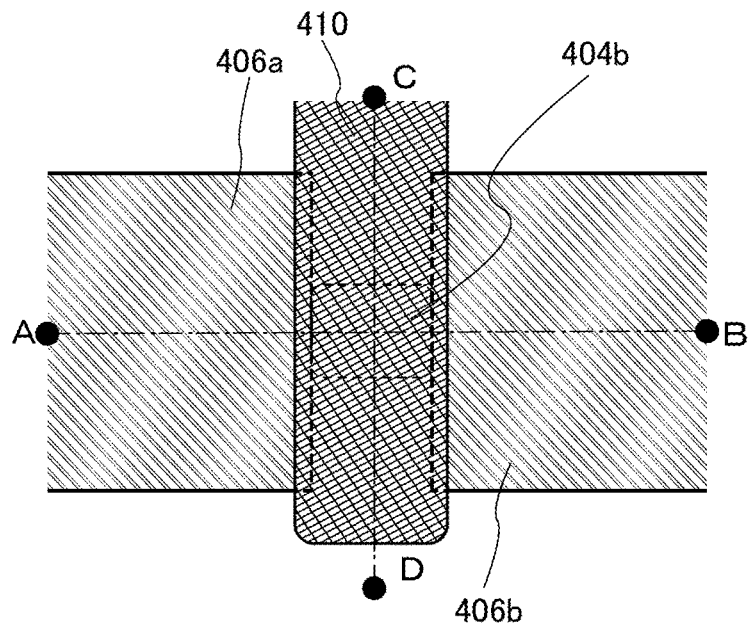
FIGS. 8A to 8C are a top view and cross-sectional views of a transistor.
Figure 8B:
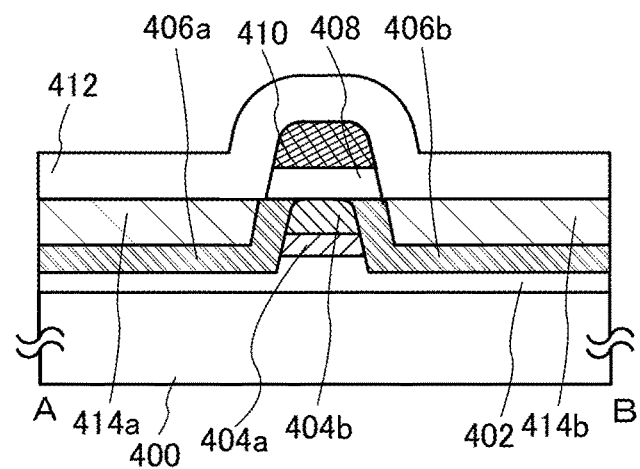
Figure 8C:
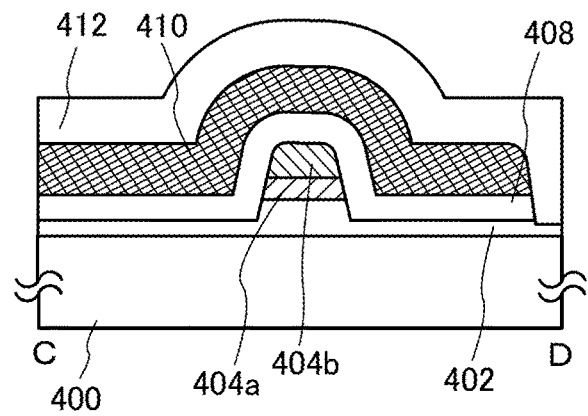
Figure 9A:
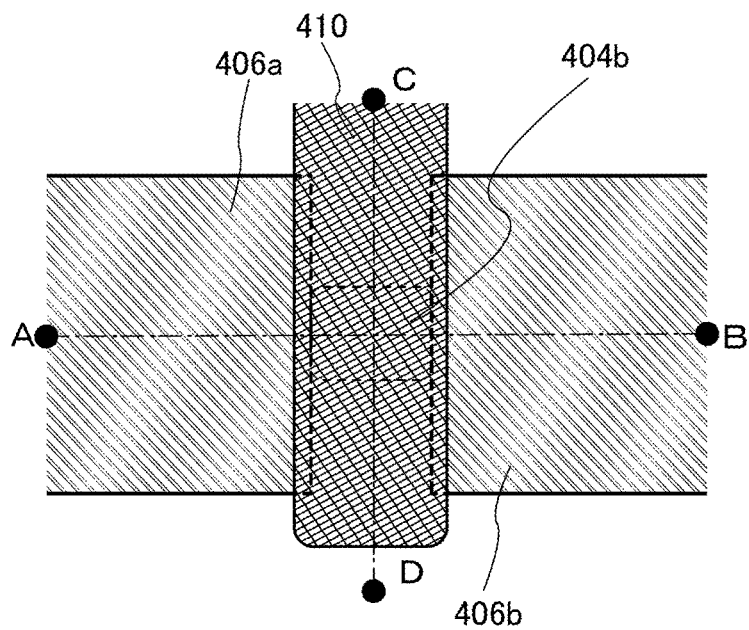
FIGS. 9A to 9C are a top view and cross-sectional views of a transistor.
Figure 9B:
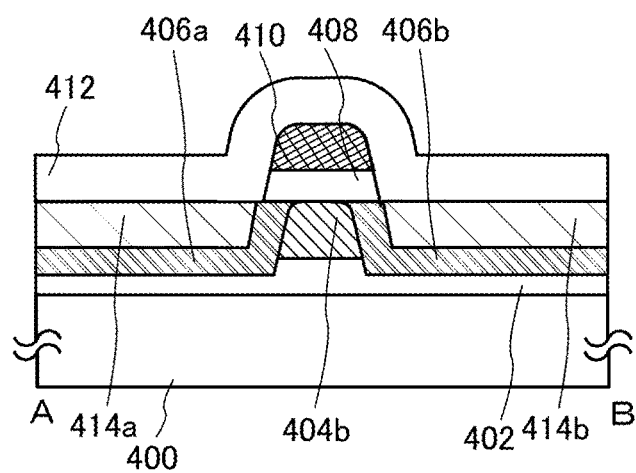
Figure 9C:
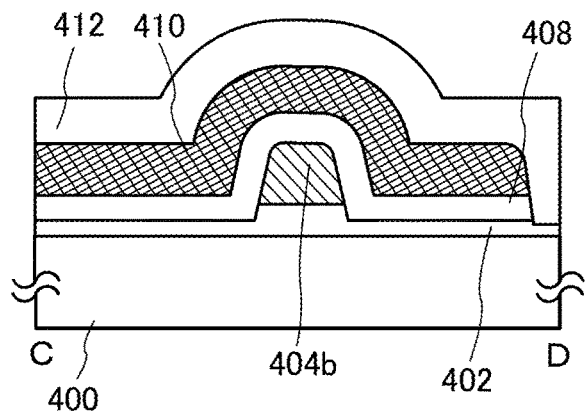
Figure 10A:
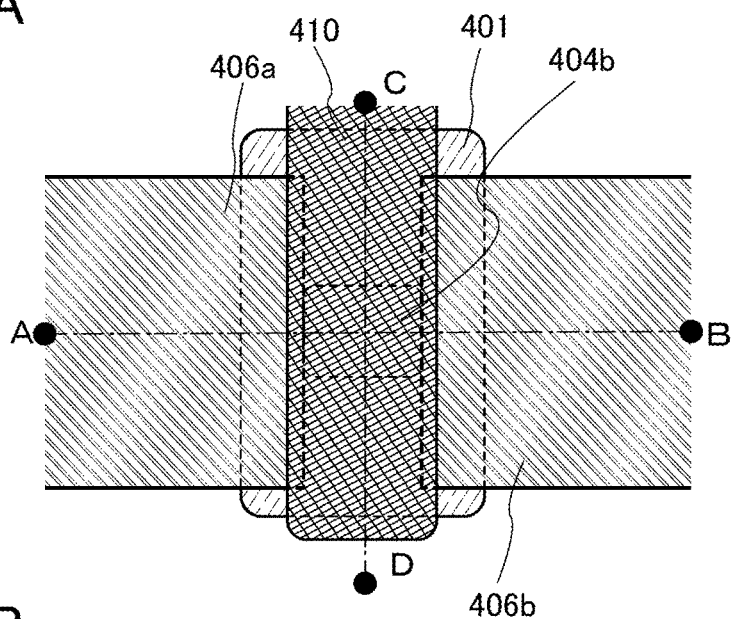
FIGS. 10A to 10C are a top view and cross-sectional views of a transistor.
Figure 10B:
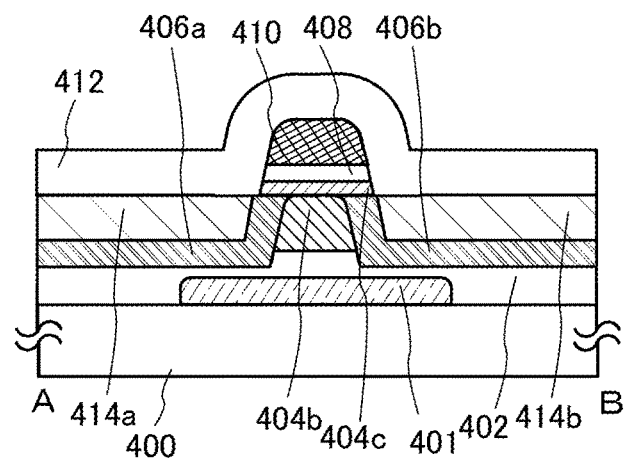
Figure 10C:
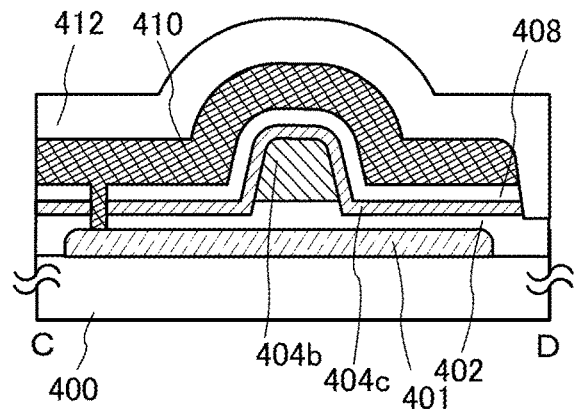
Figure 11A:
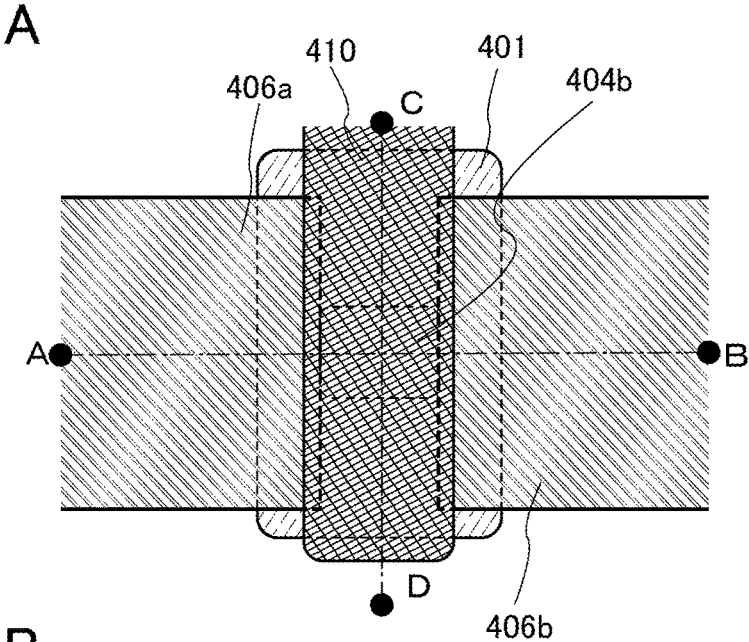
FIGS. 11A to 11C are a top view and cross-sectional views of a transistor.
Figure 11B:
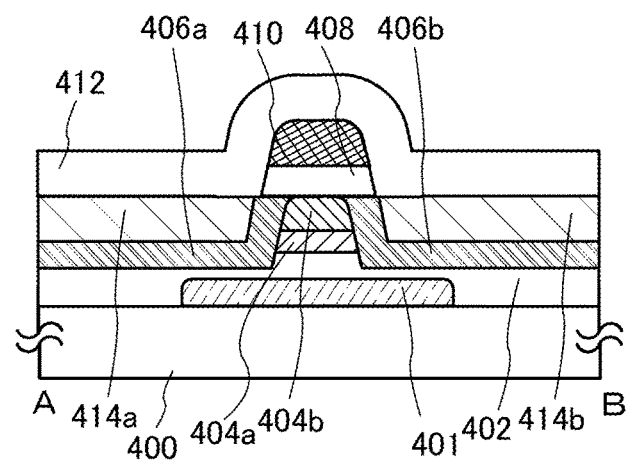
Figure 11C:
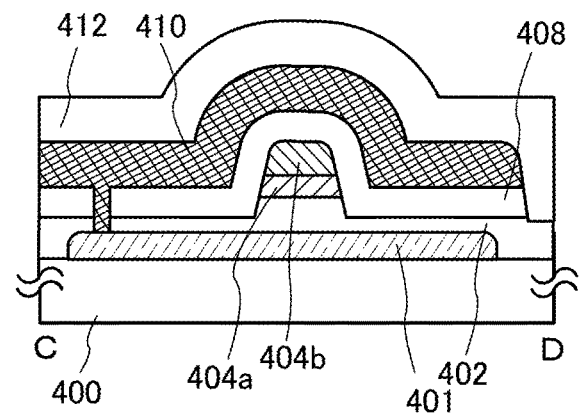
Figure 12A:
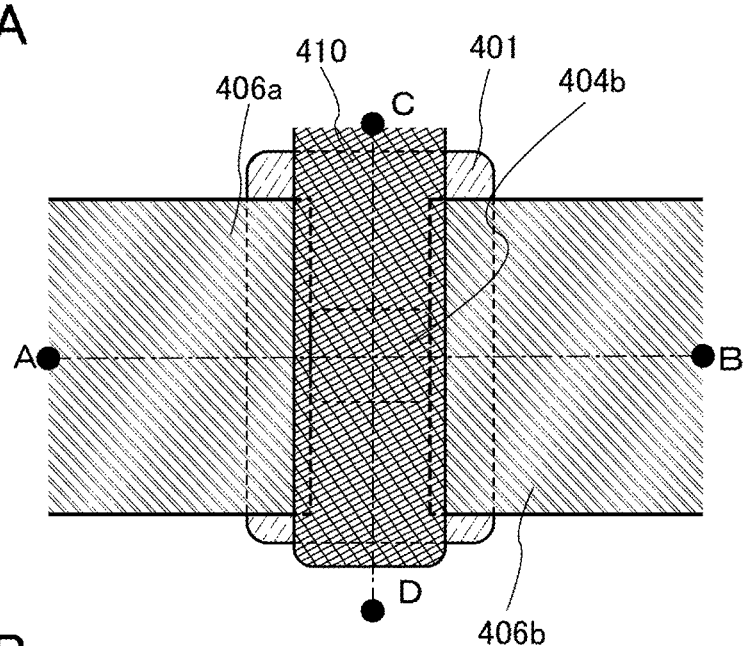
FIGS. 12A to 12C are a top view and cross-sectional views of a transistor.
Figure 12B:
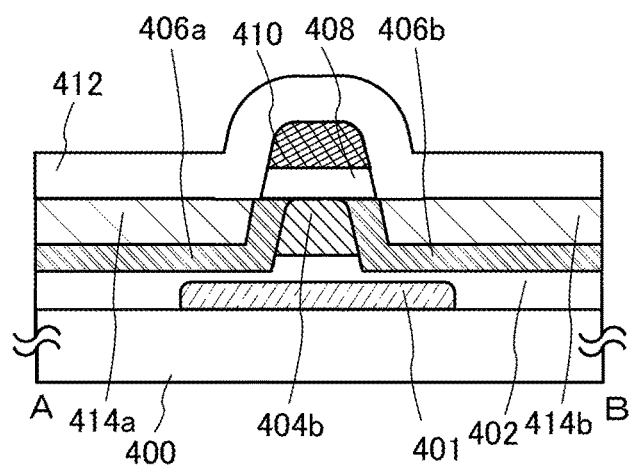
Figure 12C:
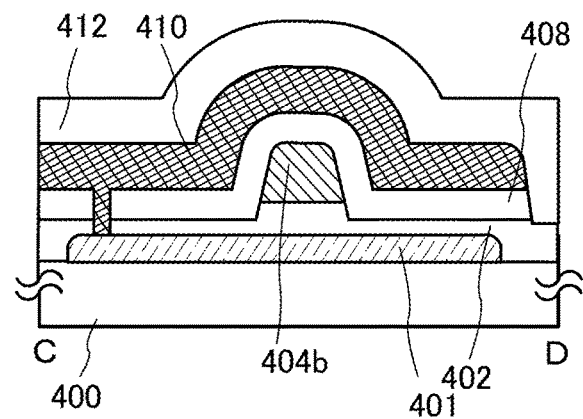

A transistor 495 illustrated in FIGS. 7A to 7C can be used. FIGS. 7A to 7C are a top view and cross-sectional views of the transistor 495. FIG. 7B illustrates a cross section taken along the dashed-dotted line A-B in FIG. 7A. FIG. 7C illustrates a cross section taken along the dashed-dotted line C-D in FIG. 7A. Note that for simplification of the drawing, some components in the top view in FIG. 7A are not illustrated.

In the transistor 495, only the second oxide semiconductor film 404b and the third oxide semiconductor film 404c are electrically surrounded by the gate electrode.

Note that the conductive film 401 may be provided in FIGS. 7A to 7C as in FIGS. 3A to 3C.

Alternatively, transistors illustrated in FIGS. 8A to 8C and FIGS. 9A to 9C can be used.

Not only the transistors shown in FIGS. 1A to 1C, FIGS. 4A to 4C, and FIGS. 5A to 5C, but also transistors shown in other drawings can have first to third oxide semiconductor films as FIGS. 7A to 7C, FIGS. 8A to 8C, and FIGS. 9A to 9C. For example, FIGS. 10A to 10C, FIGS. 11A to 11C, and FIGS. 12A to 12C are modification examples of FIGS. 3A to 3C.

This embodiment can be combined with any of the other embodiments in this specification as appropriate.

Embodiment 2

In this embodiment, a method for forming the transistor 450 described in Embodiment 1 with reference to FIGS. 1A to 1C will be described with reference to FIGS. 13A to 13C, FIGS. 14A to 14C, and FIGS. 15A to 15C.

Figure 13A:
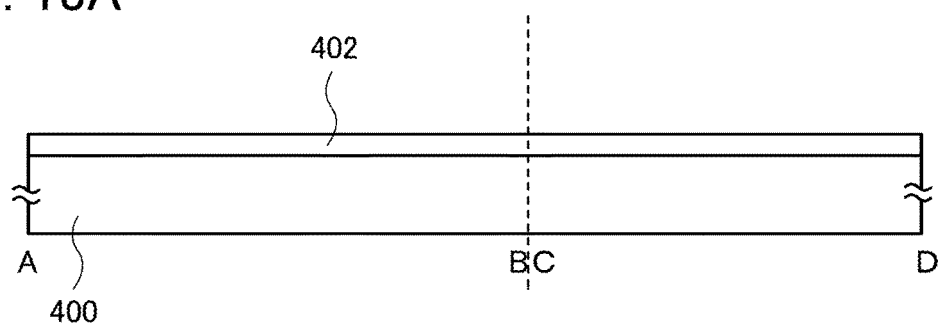
FIGS. 13A to 13C illustrate a method for manufacturing a transistor.

First, the base insulating film 402 is formed over the substrate 400 (see FIG. 13A).

For the substrate 400, a glass substrate, a ceramic substrate, a quartz substrate, a sapphire substrate, or the like can be used. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used. Still alternatively, any of these substrates further provided with a semiconductor element may be used.

The base insulating film 402 can be formed by a plasma CVD method, a sputtering method, or the like using an oxide insulating film of aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film of silicon nitride, silicon nitride oxide, aluminum nitride, aluminum nitride oxide, or the like; or a film in which any of the above materials are mixed. Alternatively, a film may be formed by mixing the above materials, and at least an upper layer of the base insulating film 402 which is in contact with the multilayer film 404 is preferably formed using a material containing excess oxygen that might serve as a supply source of oxygen to the multilayer film 404.

Oxygen may be added to the base insulating film 402 by an ion implantation method, an ion doping method, a plasma immersion ion implantation method, or the like. Adding oxygen enables the base insulating film 402 to supply oxygen much easily to the multilayer film 404.

In the case where a surface of the substrate 400 is made of an insulator and there is no influence of impurity diffusion to the multilayer film 404 to be formed later, the base insulating film 402 is not necessarily provided.

Figure 13B:
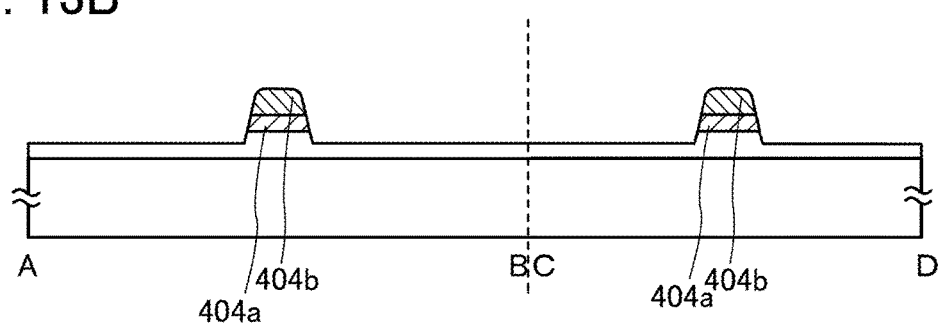

Next, the first oxide semiconductor film 404a and the second oxide semiconductor film 404b are formed over the base insulating film 402 by a sputtering method, a CVD method, an MBE method, an ALD method, or a PLD method (see FIG. 13B). At this time, as shown in the drawing, the base insulating film 402 can be slightly overetched. By overetching of the base insulating film 402, the gate electrode 410 to be formed later can cover the third oxide semiconductor film 404c easily.

For processing the first oxide semiconductor film 404a and the second oxide semiconductor film 404b into island shapes, first, a film to be a hard mask (e.g., a tungsten film) and a resist mask are provided over the second oxide semiconductor film 404b, and the film to be a hard mask is etched to form a hard mask. Then, the resist mask is removed and the first oxide semiconductor film 404a and the second oxide semiconductor film 404b are etched by using the hard mask as a mask. After that, the hard mask is removed. At the time of the etching, the hard mask is gradually reduced as the etching progresses; as a result, the end portion of the hard mask may be rounded to have a curved surface. At this step, the hard mask is gradually reduced as the etching progresses; as a result, end portions of the second oxide semiconductor film 404b may become round and to have a curved surface. With this structure, the coverage with the third oxide semiconductor film 404c, the gate insulating film 408, the gate electrode 410, and the oxide insulating film 412, which are to be formed over the second oxide semiconductor film 404b, can be improved; thus, a shape defect such as disconnection can be inhibited. In addition, electric field concentration which might occur at end portions of the source electrode 406a and the drain electrode 406b can be reduced, which can suppress deterioration of the transistor.

Figure 16A:
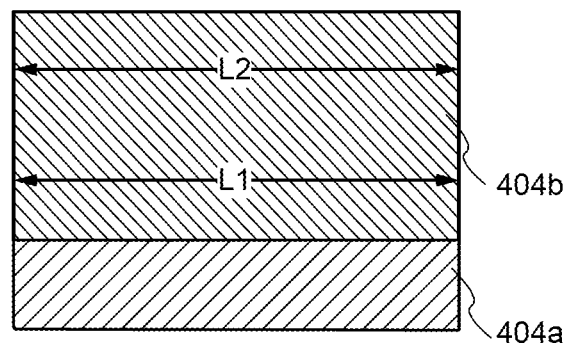
FIGS. 16A to 16C illustrate the shape of oxide semiconductor film.

The shape of the oxide semiconductor film is described with reference to FIGS. 16A to 16C. FIG. 16A illustrates the second oxide semiconductor film 404b is stacked over the first oxide semiconductor film 404a. The length in the channel length direction of the bottom surface of the second oxide semiconductor film 404b is L1. The length in the channel length direction of the upper surface of the second oxide semiconductor film 404b is L2.

Figure 16B:
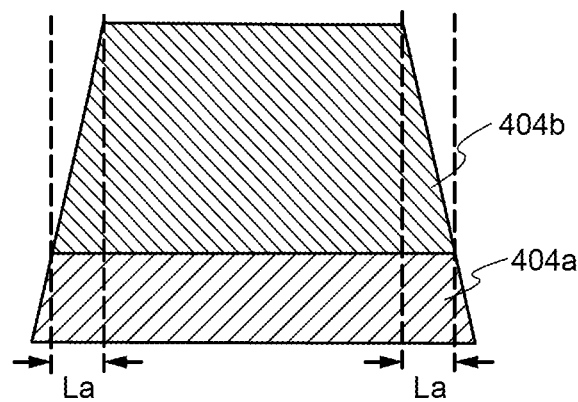
Figure 16C:
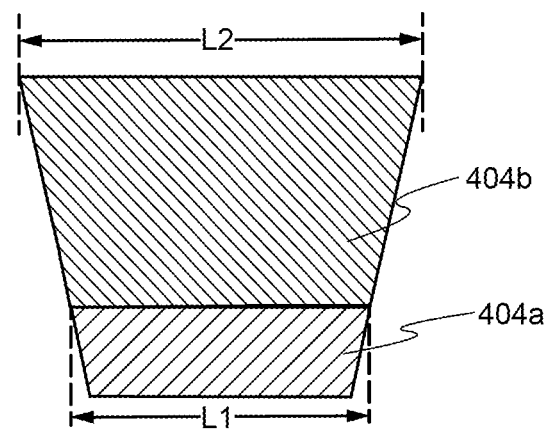

After etching of the staked body in FIG. 16A, the oxide semiconductor film illustrated in FIG. 16B has what is called a forward tapered shape in which the distance between the ends becomes shorter toward the upper surface (L1≥L2). As shown in FIG. 16C, the oxide semiconductor film may have what is called a reverse tapered shape in which the distance between the ends becomes longer toward the upper surface (L1≤L2).

Half the difference between L1 and L2 shown in FIG. 16B is La. La is preferably greater than 0 and less than half of L2 (0<La<L2/2). In FIG. 16C, L1 is greater than 0 (0<L1).

The stacked body preferably has a forward tapered shape in consideration of coverage with a film which is to be stacked thereon (e.g., the gate insulating film 408).

In order to form a continuous energy band in a stack including the first oxide semiconductor film 404a and the second oxide semiconductor film 404b, or a stack including the first oxide semiconductor film 404a, the second oxide semiconductor film 404b, and the third oxide semiconductor film 404c to be formed in a later step, the layers need to be formed successively without exposure to the air with the use of a multi-chamber deposition apparatus (e.g., a sputtering apparatus) including a load lock chamber. It is preferable that each chamber of the sputtering apparatus be able to be evacuated to a high vacuum (to about $5\times10^{-7}$ Pa to $1\times10^{-4}$ Pa) by an adsorption vacuum pump such as a cryopump and that the chamber be able to heat a substrate over which a film is to be deposited to 500° C. or higher so that water and the like acting as impurities of the oxide semiconductor are removed as much as possible. Alternatively, a combination of a turbo molecular pump and a cold trap is preferably used to prevent back-flow of a gas containing a carbon component, moisture, or the like from an exhaust system into the chamber.

Not only high vacuum evacuation of the chamber but also high purity of a sputtering gas is necessary to obtain a highly purified intrinsic oxide semiconductor. When a highly purified gas having a dew point of −40° C. or lower, preferably −80° C. or lower, more preferably −100° C. or lower is used as an oxygen gas or an argon gas used as a sputtering gas, moisture or the like can be prevented from entering an oxide semiconductor as much as possible. The state in which impurity concentration is low and density of defect states is low (the number of oxygen vacancies is small) is referred to as "highly purified intrinsic" or "substantially highly purified intrinsic".

The materials described in Embodiment 1 can be used for the first oxide semiconductor film 404a, the second oxide semiconductor film 404b, and the third oxide semiconductor film 404c that is to be formed in a later step. For example, an In—Ga—Zn oxide whose atomic ratio of In to Ga and Zn is 1:3:4 or 1:3:2 can be used for the first oxide semiconductor film 404a, an In—Ga—Zn oxide whose atomic ratio of In to Ga and Zn is 1:1:1 can be used for the second oxide semiconductor film 404b, and an In—Ga—Zn oxide whose atomic ratio of In to Ga and Zn is 1:3:4 or 1:3:2 can be used for the third oxide semiconductor film 404c.

An oxide semiconductor that can be used for each of the first oxide semiconductor film 404a, the second oxide semiconductor film 404b, and the third oxide semiconductor film 404c preferably contains at least indium (In) or zinc (Zn). Alternatively, both In and Zn are preferably contained. In order to reduce fluctuations in electrical characteristics of the transistors including the oxide semiconductor, the oxide semiconductor preferably contains a stabilizer in addition to In and Zn.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

As the oxide semiconductor, for example, any of the following can be used: indium oxide, tin oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, or an In—Hf—Al—Zn oxide.

For example, "In—Ga—Zn oxide" means an oxide containing In, Ga, and Zn as its main components. The In—Ga—Zn oxide may contain another metal element in addition to In, Ga, and Zn. Note that in this specification, a film containing the In—Ga—Zn oxide is also referred to as an IGZO film.

A material represented by $InMO_3(ZnO)_m$ (m>0 is satisfied, and m is not an integer) may be used. Note that M represents one or more metal elements selected from Ga, Fe, Mn, or Co. A material represented by $In_2SnO_5(ZnO)_n$ (n>0, n is an integer) may be used.

Note that as described in Embodiment 1 in detail, materials are selected so that the first oxide semiconductor film 404a and the third oxide semiconductor film 404c each have an electron affinity lower than that of the second oxide semiconductor film 404b.

Note that the oxide semiconductor film is preferably deposited by a sputtering method. As a sputtering method, an RF sputtering method, a DC sputtering method, an AC sputtering method, or the like can be used. In particular, a DC sputtering method is preferably used because dust generated in the deposition can be reduced and the film thickness can be uniform.

When In—Ga—Zn oxide is used for the first to third oxide semiconductor films 404a to 404c, a material whose atomic ratio of In to Ga and Zn is any of 1:1:1, 2:2:1, 3:1:2, 1:3:2, 1:3:4, 1:4:3, 1:5:4, 1:6:6, 2:1:3 1:6:4, 1:9:6, 1:1:4, and 1:1:2 is used so that the first oxide semiconductor film 404a and the third oxide semiconductor film 404c each have an electron affinity lower than that of the second oxide semiconductor film 404b.

Note that the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The indium content in the second oxide semiconductor film 404b is preferably higher than those in the first and third oxide semiconductor films 404a and 404c. In an oxide semiconductor, the s orbital of heavy metal mainly contributes to carrier transfer, and when the proportion of In in the oxide semiconductor is increased, overlap of the s orbitals is likely to be increased. Therefore, an oxide having a composition in which the proportion of In is higher than that of Ga has higher mobility than an oxide having a composition in which the proportion of In is equal to or lower than that of Ga. Thus, with use of an oxide having a high indium content for the second oxide semiconductor film 404b, a transistor having high mobility can be achieved.

Here, a structure of an oxide semiconductor film will be described.

In this specification, a term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

In this specification, trigonal and rhombohedral crystal systems are included in a hexagonal crystal system.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First of all, a CAAC-OS film is described.

The CAAC-OS film is an oxide semiconductor film including a plurality of crystal parts. Most of the crystal parts each fit inside a cube whose one side is less than 100 nm. Thus, the CAAC-OS film may include a crystal part that fits inside a cube whose one side is less than 10 nm, less than 5 nm, or less than 3 nm.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is unlikely to occur.

In the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC- OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In the TEM image of the CAAC-OS film observed in a direction substantially perpendicular to the sample surface (plan TEM image), metal atoms are arranged in a triangular or hexagonal configuration in the crystal parts. However, there is no regularity in arrangement of metal atoms between different crystal parts.

From the cross-sectional TEM image and the plan TEM image, orientation characteristics are found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Analysis (φ scan) is performed under conditions where the sample is rotated around a normal vector of the sample surface as an axis (φ axis) with 2θ fixed at around 56°. When the sample is a single-crystal oxide semiconductor film of InGaZnO$_4$, six peaks appear. The six peaks are derived from crystal planes equivalent to the (110) plane. In contrast, when the sample is the CAAC-OS layer, a peak is not clearly observed.

The above results mean that in the CAAC-OS film having c-axis alignment, the directions of a-axes and b-axes are different between crystal parts, but the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is oriented in a direction parallel to a normal vector of a formation surface or a normal vector of a top surface. Thus, for example, when the shape of the CAAC-OS film is changed by etching or the like, the c-axis might not be necessarily parallel to a normal vector of a formation surface or a normal vector of a top surface of the CAAC-OS film.

Furthermore, the degree of crystallinity in the CAAC-OS film is not necessarily uniform. For example, if crystal growth leading to the CAAC-OS film occurs from the vicinity of the top surface of the film, the degree of the crystallinity in the vicinity of the top surface may be higher than that in the vicinity of the formation surface. Moreover, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may be observed at around 36°, in addition to the peak of 2θ at around 31°. The peak of 2θ at around 36° indicates that a crystal having no c-axis alignment is included in part of the CAAC-OS film. It is preferable that a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. A heavy metal such as iron or nickel, argon, carbon dioxide, or the like has a large atomic radius (molecular radius), and thus disturbs the atomic arrangement of the oxide semiconductor film and causes a decrease in crystallinity if contained in the oxide semiconductor film. Note that the impurity contained in the oxide semiconductor film might serve as a carrier trap or a carrier generation source.

The CAAC-OS film is an oxide semiconductor film having a low density of defect states. Oxygen vacancies in the oxide semiconductor film may serve as carrier traps or carrier generation sources when hydrogen is captured therein.

A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and thus may behave like fixed electric charge. Accordingly, the transistor which includes the oxide semiconductor film having high impurity concentration and a high density of defect states can have unstable electrical characteristics.

In a transistor using the CAAC-OS film, change in electrical characteristics due to irradiation with visible light or ultraviolet light is small.

Next, a microcrystalline oxide semiconductor film will be described.

In a TEM image, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a TEM image of the nc-OS film, for example, a crystal grain boundary cannot clearly found in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film.

Thus, the orientation of the whole film is not observed. Accordingly, the nc-OS film sometimes cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter (e.g., greater than or equal to 1 nm and smaller than or equal to 30 nm) close to, or smaller than or equal to a diameter of a crystal part. In a nanobeam electron diffraction pattern of the nc-OS film, regions with high luminance in a circular (ring) pattern may be shown, and a plurality of spots may be shown in the ring-like region.

The nc-OS film is an oxide semiconductor film that has high regularity as compared with an amorphous oxide semiconductor film. For this reason, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

For example, the CAAC-OS film can be deposited by a sputtering method using a polycrystalline oxide semiconductor sputtering target. When ions collide with the sputtering target, a crystal region included in the sputtering target is sometimes separated from the target along an a-b plane; in other words, a sputtered particle having a plane parallel to an a-b plane (flat-plate-like sputtered particle or pellet-like sputtered particle) flakes off from the sputtering target. The flat-plate-like sputtered particle or pellet-like sputtered particle is electrically charged and thus reaches the substrate while maintaining its crystal state, without being aggregation in plasma, forming a CAAC-OS film.

First heat treatment may be performed after the second oxide semiconductor film 404b is formed. The first heat treatment may be performed at a temperature higher than or equal to 250° C. and lower than or equal to 650° C., typically higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor film 404b can be improved, and in addition, impurities such as hydrogen and water can be removed from the base insulating film 402 and the first oxide semiconductor film 404a. Note that the first heat treatment may be performed before etching for formation of the second oxide semiconductor film 404b.

Figure 13C:
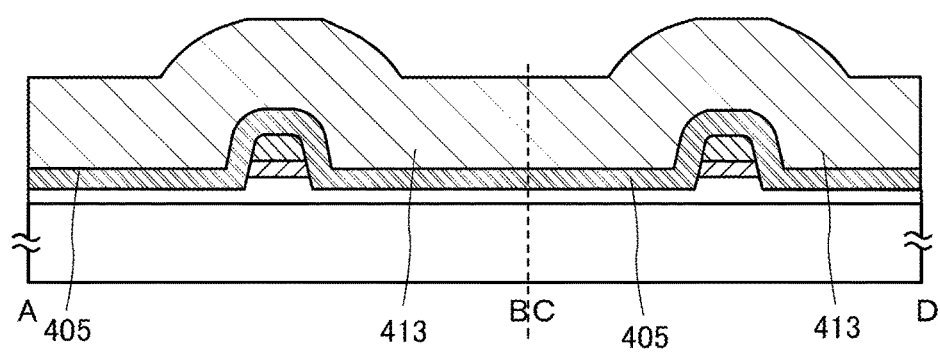

A conductive film 405 to be the source electrode 406a and the drain electrode 406b is formed over the first oxide semiconductor film 404a and the second oxide semiconductor film 404b and then an insulating film 413 is formed over the conductive film 405 (see FIG. 13C). For the conductive film 405, Al, Cr, Cu, Ta, Ti, Mo, W, or an alloy material containing any of these as a main component can be used. For example, a 100-nm-thick titanium film is formed by a sputtering method or the like. Alternatively, a tungsten film may be formed by a CVD method. The insulating film 413 can be formed using a material and a method similar to those for the base insulating film.

Figure 14A:
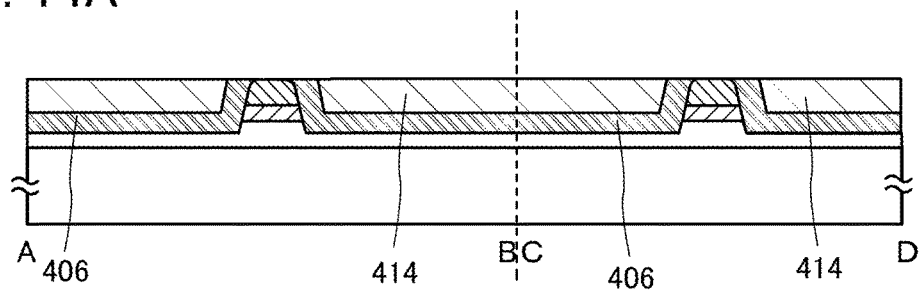
FIGS. 14A to 14C illustrate a method for manufacturing a transistor.

Then, removing (polishing) treatment is performed on the conductive film 405 and the insulating film 413 to remove part of the conductive film 405 and the insulating film 413 and expose the second oxide semiconductor film 404b, whereby a conductive film 406 and an insulating film 414 are formed (see FIG. 14A).

For the removing treatment, chemical mechanical polishing (CMP) treatment can be preferably used. Another removing treatment may be used. Alternatively, the polishing treatment such as CMP treatment may be combined with etching (dry etching or wet etching) treatment or plasma treatment. For example, after the CMP treatment, dry etching treatment or plasma treatment (e.g., reverse sputtering) may be performed in order to improve the flatness of a surface to be processed. In the case where in the removing treatment, the etching treatment, the plasma treatment, or the like is combined with the CMP treatment, the order of steps may be, without any particular limitation, determined as appropriate depending on the material, thicknesses, and surface roughness. Alternatively, a large part of the conductive film 405 and the insulating film 413 may be removed by CMP treatment and the other part of the conductive film 405 and the insulating film 413 may be removed by dry etching treatment.

Note that CMP treatment may be performed only once or plural times. When CMP treatment is performed plural times, first polishing is preferably performed with a high polishing rate followed by final polishing with a low polishing rate. By combining polishing treatment with different polishing rates, the flatness of the surfaces of the conductive film 405 and the insulating film 413 can be further increased.

Figure 14B:
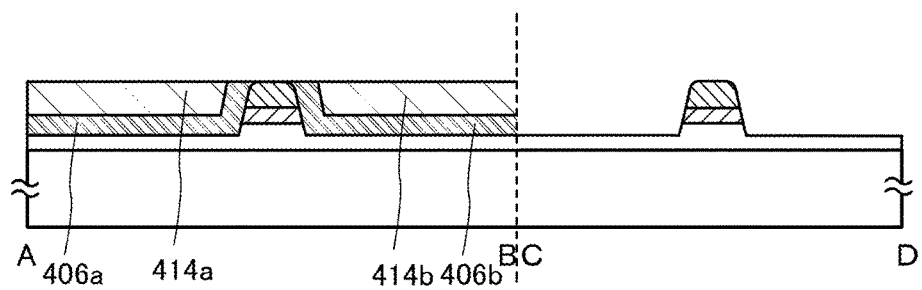

Next, the conductive film 406 and the insulating film 414 are divided by etching to form a source electrode 406a and a drain electrode 406b, and insulating films 414a and 414b (see FIG. 14B). In this embodiment, the upper surface of the second oxide semiconductor film is aligned with the upper surface of the source and drain electrodes. Note that one embodiment is not limited to this structure; the upper surface of the source and drain electrodes may be lower than the upper surface of the second oxide semiconductor film. In the cross section of the base insulating film 402, the base insulating film 402 in the C-D direction may be lower than that in the A-B direction.

Figure 14C:
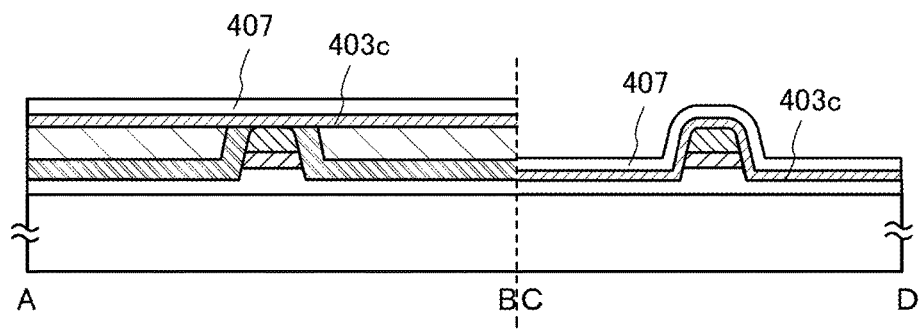

Next, a third oxide semiconductor film 403c and an insulating film 407 which is to be a gate insulating film 408 are deposited over the second oxide semiconductor film 404b, the insulating films 414a and 414b, and the source and drain electrodes 406a and 406b (see FIG. 14C).

Note that second heat treatment may be performed after the third oxide semiconductor film 403c is formed. The second heat treatment can be performed in a condition similar to that of the first heat treatment. The second heat treatment can remove impurities such as hydrogen and water from the third oxide semiconductor film 403c. In addition, impurities such as hydrogen and water can be further removed from the first oxide semiconductor film 404a and the second oxide semiconductor film 404b.

The insulating film 407 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. The insulating film 407 may have a stacked-layer structure of any of the above materials. The insulating film 407 can be formed by a sputtering method, a CVD method, an MBE method, an ALD method, a PLD method, or the like.

Figure 15A:
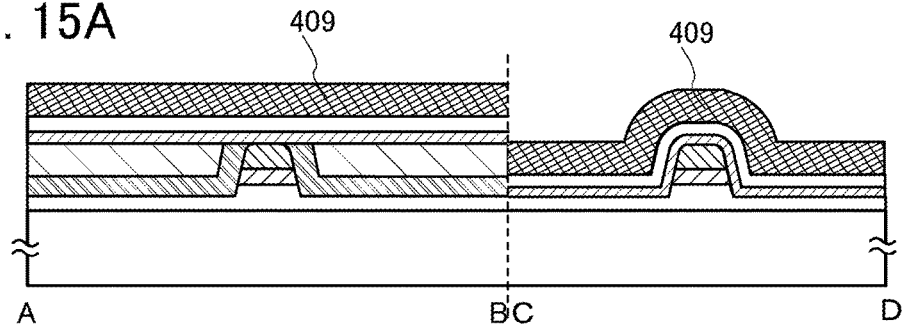
FIGS. 15A to 15C illustrate a method for manufacturing a transistor.

Next, a conductive film 409 to be a gate electrode 410 is formed over the third oxide semiconductor film 403c and the insulating film 407 (see FIG. 15A). For the conductive film 409, Al, Ti, Cr, Co, Ni, Cu, Y, Zr, Mo, Ru, Ag, Ta, W, or an alloy material containing any of these as its main component can be used. The conductive film 409 can be formed by a sputtering method, a CVD method, or the like. The conductive film 409 may be formed using a conductive film containing nitrogen or a stack including the conductive film and a conductive film containing nitrogen.

Figure 15B:
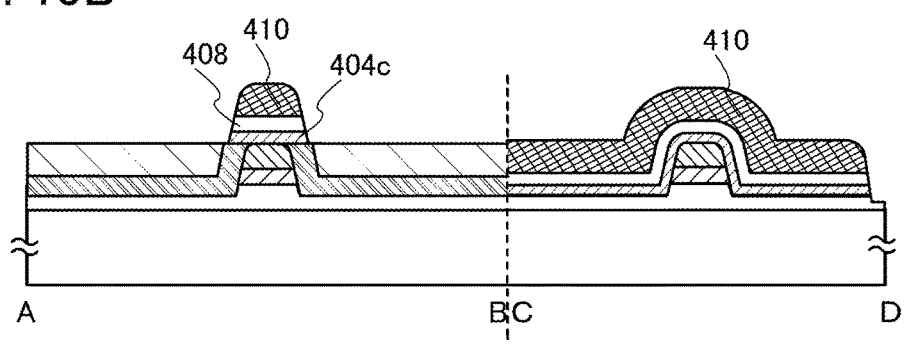

Then, the conductive film 409 is selectively etched using a resist mask to form the gate electrode 410 (see FIG. 15B). Note that the second oxide semiconductor film 404b is electrically surrounded by the gate electrode 410.

Then, the insulating film 407 is selectively etched using the resist mask or using the gate electrode 410 as a mask to form the gate insulating film 408.

Next, the third oxide semiconductor film 403c is etched using the resist mask or the gate electrode 410 as a mask to form the third oxide semiconductor film 404c.

A top end portion of the third oxide semiconductor film 404c is aligned with a bottom end portion of the gate insulating film 408. A top end portion of the gate insulating film 408 is aligned with a bottom end portion of the gate electrode 410. Although the gate insulating film 408 and the third oxide semiconductor film 404c are formed using the gate electrode 410 as a mask, the gate insulating film 408 and the third oxide semiconductor film 404c may be formed before the conductive film 409 is formed, for example.

It is preferable that the insulating film 407 and the conductive film 409 be deposited by CVD, then, the conductive film 409 is selectively etched to form the gate electrode 410, and then, the third oxide semiconductor film 404c and the gate insulating film 408 are formed. The insulating film 407 and the conductive film 409 can be deposited successively.

Figure 15C:
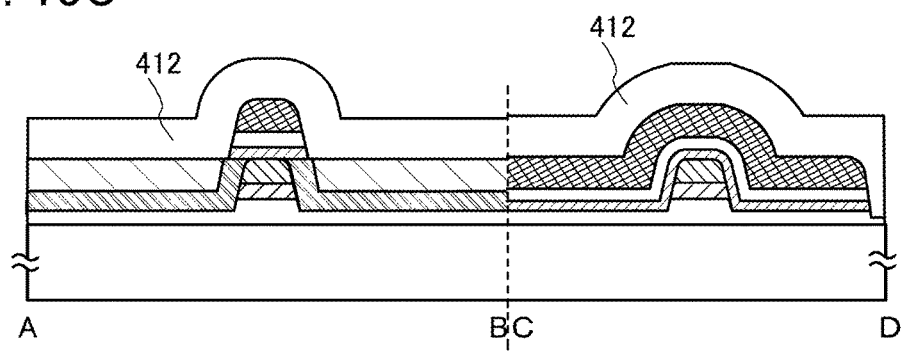

Next, the oxide insulating film 412 is formed over the source and drain electrodes 406a and 406b, the insulating films 414a and 414b, the third oxide semiconductor film 404c, the gate insulating film 408, and the gate electrode 410 (see FIG. 15C). A material and a method for the oxide insulating film 412 can be similar to those of the base insulating film 402. The oxide insulating film 412 may be formed using aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, tantalum oxide, or an oxide insulating film containing nitrogen. The oxide insulating film 412 can be formed by a sputtering method, a CVD method, an MBE method, an ALD method, or a PLD method, and is preferably formed to contain excess oxygen so as to be able to supply oxygen to the multilayer film 404.

Oxygen may be added to the oxide insulating film 412 by an ion implantation method, an ion doping method, a plasma immersion ion implantation method, or the like. Adding oxygen enables the oxide insulating film 412 to supply oxygen much easily to the multilayer film 404.

Third heat treatment may be performed next. The third heat treatment can be performed under a condition similar to that of the first heat treatment. By the third heat treatment, excess oxygen is easily released from the base insulating film 402, the gate insulating film 408, and the oxide insulating film 412, so that oxygen vacancies in the multilayer film 404 can be reduced.

Through the above process, the transistor 450 illustrated in FIGS. 1A to 1C can be fabricated.

This embodiment can be combined with any of the other embodiments in this specification as appropriate.

Embodiment 3

In this embodiment, a transistor having a structure different from that of the transistor described in Embodiment 1 will be described.

Figure 17A:
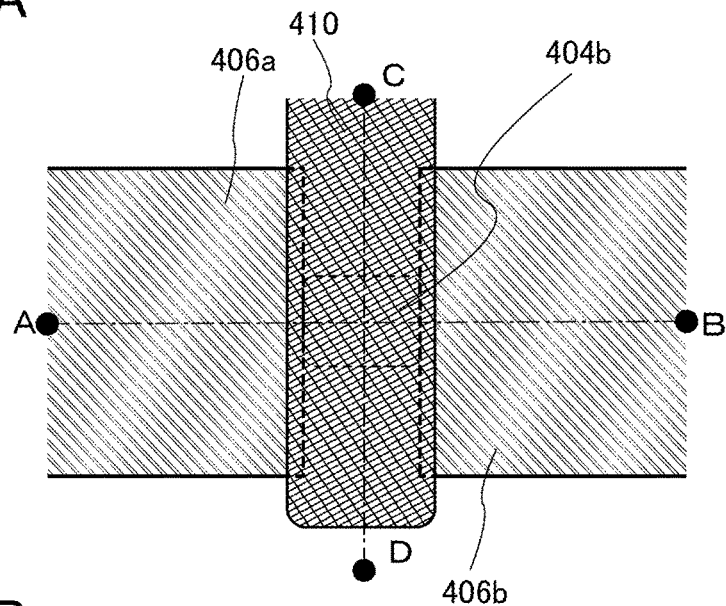
FIGS. 17A to 17C are a top view and cross-sectional views of a transistor.
Figure 17B:
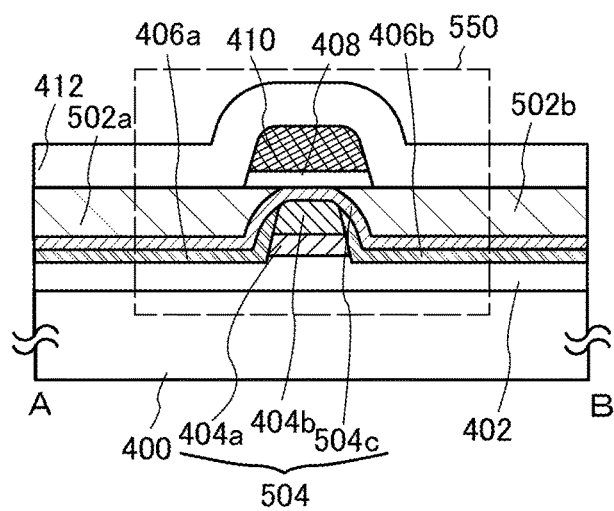
Figure 17C:
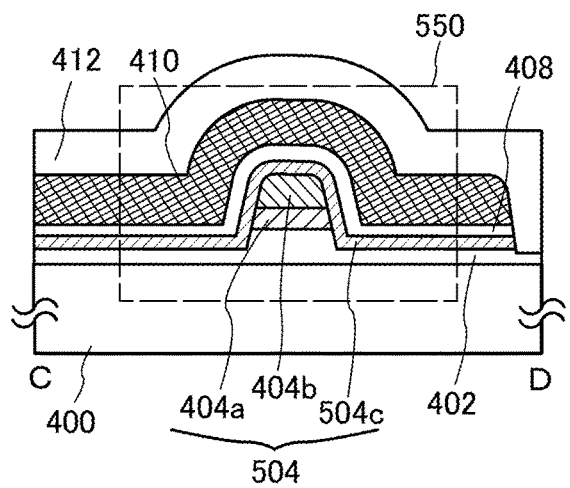

FIGS. 17A to 17C are a top view and cross-sectional views which illustrate a transistor of one embodiment of the present invention. FIG. 17A is the top view. FIG. 17B illustrates a cross section taken along the dashed-dotted line A-B in FIG. 17A. FIG. 17C illustrates a cross section taken along the dashed-dotted line C-D in FIG. 17A. Note that for simplification of the drawing, some components in the top view in FIG. 17A are not illustrated. In some cases, the direction of the dashed-dotted line A-B is referred to as a channel length direction, and the direction of the dashed-dotted line C-D is referred to as a channel width direction.

A transistor 550 illustrated in FIGS. 17A to 17C includes the base insulating film 402 having a depressed portion and a projected portion over the substrate 400; the first oxide semiconductor film 404a and the second oxide semiconductor film 404b over the projected portion of the base insulating layer 402; the source electrode 406a and the drain electrode 406b in contact with the side surfaces of the first oxide semiconductor film 404a and the second oxide semiconductor film 404b; a third oxide semiconductor film 504c in contact with the bottom surface of the depressed portion of the base insulating film 402, the side surface of the projected portion (or depressed portion) of the base insulating film 402, the side surface of the first oxide semiconductor film 404a, the side surface of the second oxide semiconductor film 404a, the top surface of the second oxide semiconductor film 404b, the source electrode 406a, and the drain electrode 406b; insulating films 502a and 502b over the third oxide semiconductor film 504c; the gate insulating film 408 over the third oxide semiconductor film 504c and the insulating films 502a and 502b; the gate electrode 410 which is over and in contact with the gate insulating film 408 and faces the top and side surfaces of the second oxide semiconductor film 404b; and the oxide insulating film 412 over the insulating films 502a and 502b and the gate electrode 410. The first oxide semiconductor film 404a, the second oxide semiconductor film 404b, and the third oxide semiconductor film 504c are collectively referred to as a multilayer film 504.

FIGS. 17A to 17C illustrate an example in which the end portions of the source and drain electrodes 406a and 406b of the transistor 550 are curved (have a curved surface) by etching of a conductive film to be the source and drain electrodes 406a and 406b.

Note that the conductive film 401 may be provided in FIGS. 17A to 17C as in FIGS. 3A to 3C.

Although this embodiment includes the first to third oxide semiconductor films, one embodiment is not limited to this.

Figure 18A:
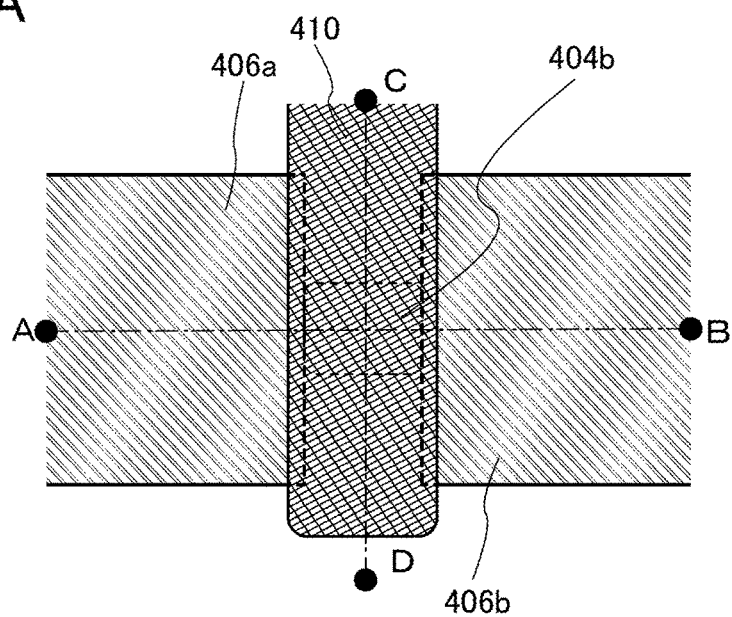
FIGS. 18A to 18C are a top view and cross-sectional views of a transistor.
Figure 18B:
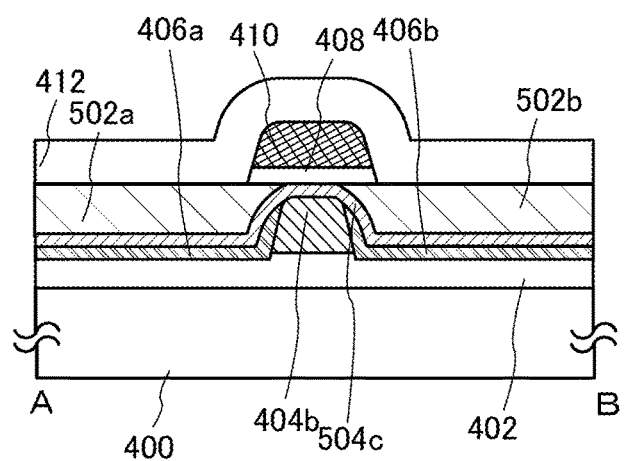
Figure 18C:
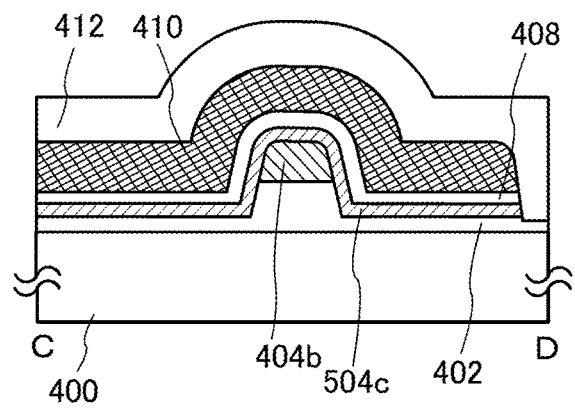

A structure in which any one or two of the films is/are not provided. Another oxide semiconductor film may be additionally provided. FIGS. 18A to 18C show the example.

This embodiment can be combined with any of the other embodiments in this specification as appropriate.

Embodiment 4

In this embodiment, a method for forming the transistor 550, which is described in Embodiment 3 with reference to FIGS. 17A to 17C, is described with reference to FIGS. 19A to 19C, FIGS. 20A to 20C, and FIGS. 21A to 21C.

Figure 19A:
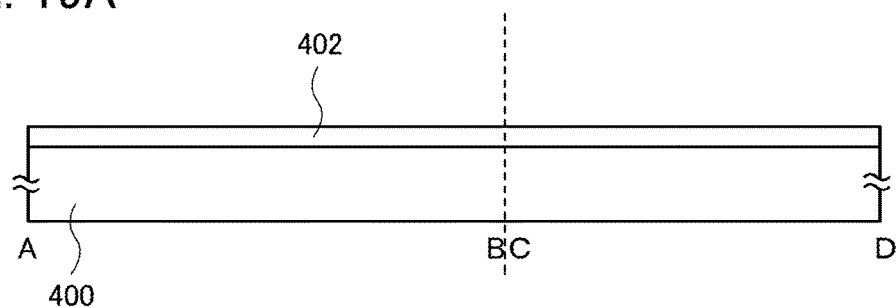
FIGS. 19A to 19C illustrate a method for manufacturing a transistor.

First, the base insulating film 402 is formed over the substrate 400 (see FIG. 19A). The above embodiments can be referred to for materials and formation methods of the substrate 400 and the base insulating film 402.

Figure 19B:
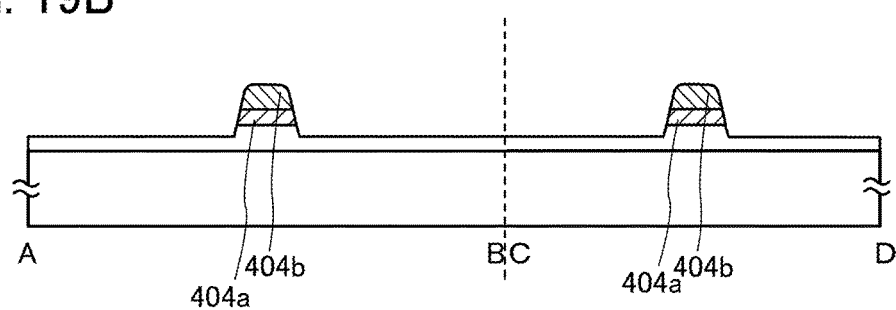

Next, the first oxide semiconductor film 404a and the second oxide semiconductor film 404b are formed over the base insulating film 402 by a sputtering method, a CVD method, an MBE method, an ALD method, or a PLD method (see FIG. 19B). The above embodiments can be referred to for materials and formation methods of the first oxide semiconductor film 404a and the second oxide semiconductor film 404b.

Figure 19C:
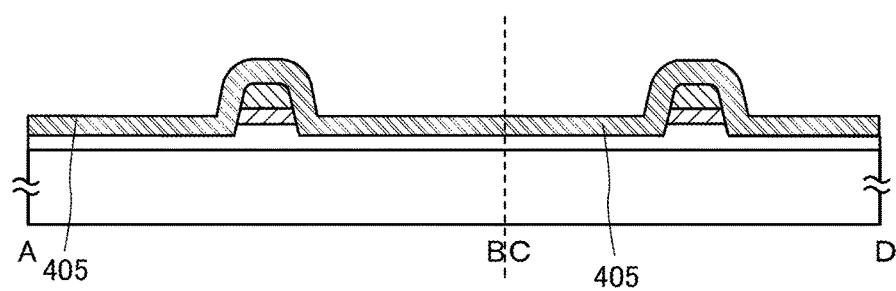

The conductive film 405 to be the source electrode 406a and the drain electrode 406b is formed over the first oxide semiconductor film 404a and the second oxide semiconductor film 404b (see FIG. 19C). The above embodiments can be referred to for materials and formation methods of the conductive film 405.

Figure 20A:
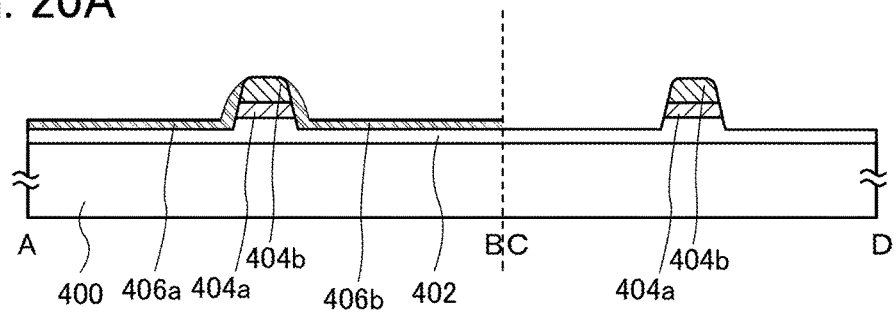
FIGS. 20A to 20C illustrate a method for manufacturing a transistor.

Next, the conductive film 405 is etched to form the source and drain electrodes 406a and 406b (see FIG. 20A). Note that the end portions of the conductive film 405 are curved (have a curved surface) by etching. In this embodiment, the upper surface of the second oxide semiconductor film is aligned with the upper surface of the source and drain electrodes. Note that one embodiment is not limited to this structure; the upper surface of the source and drain electrodes may be lower than the upper surface of the second oxide semiconductor film. In the cross section, the base insulating film 402 in the C-D direction may be lower than that in the A-B direction.

Figure 20B:
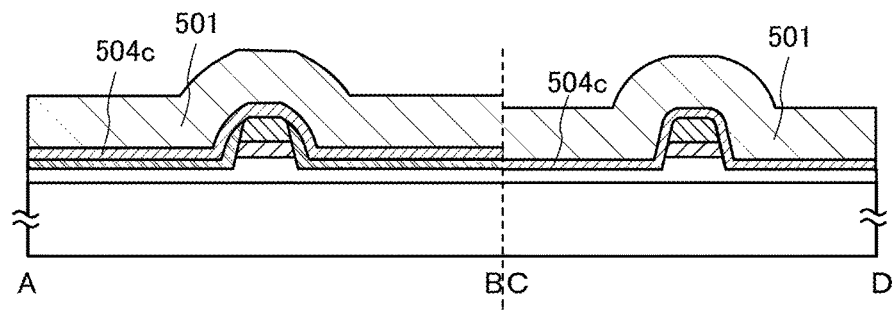

Next, the third oxide semiconductor film 504c and an insulating film 501 are formed over the second oxide semiconductor film 404b and the source and drain electrodes 406a and 406b (see FIG. 20B). The third oxide semiconductor film 404c and the insulating film 413 in the above embodiment can be referred to for the materials and formation methods of the third oxide semiconductor film 504c and the insulating film 501.

Figure 20C:
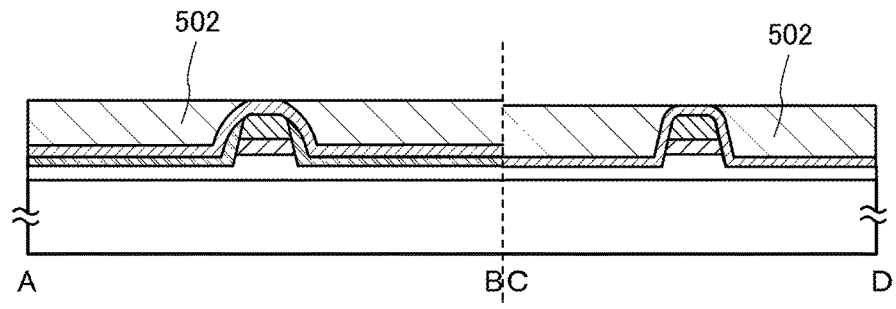

Then, removing (polishing) treatment is performed on the insulating film 501 to remove part of the insulating film 501 and expose the third oxide semiconductor film 504c, whereby an insulating film 502 is formed (see FIG. 20C). The above embodiment can be referred to for the removing (polishing) treatment.

Figure 21A:
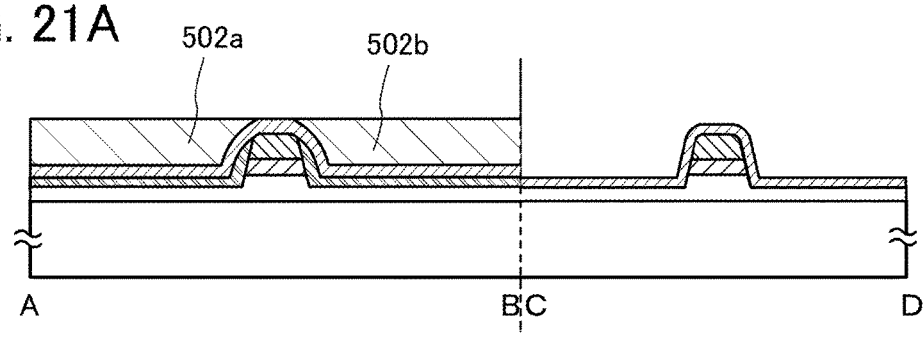
FIGS. 21A to 21C illustrate a method for manufacturing a transistor.

Next, the insulating film 502 is divided by etching to form the insulating films 502a and 502b (see FIG. 21A).

Figure 21B:
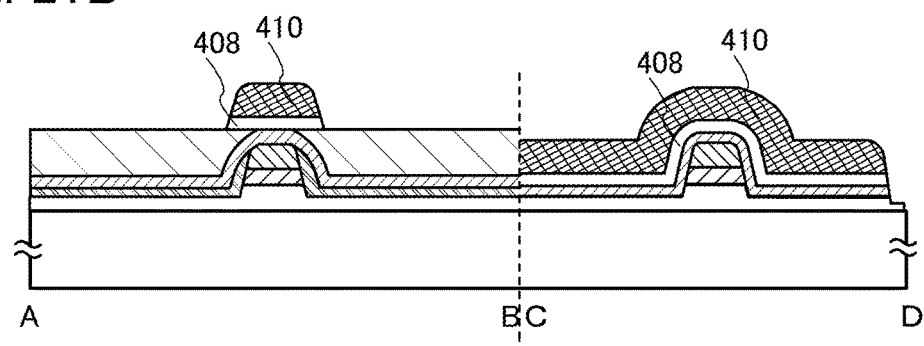

Next, the gate insulating film 408 and the gate electrode 410 are formed over the third oxide semiconductor film 504c and the insulating films 502a and 502b (see FIG. 21B). The above embodiments can be referred to for the materials and formation methods of the gate insulating film 408 and the gate electrode 410.

Figure 21C:
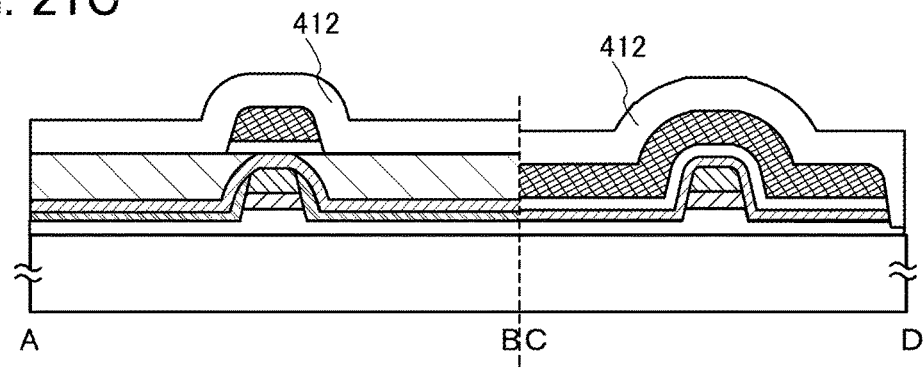

Lastly, the oxide insulating film 412 is formed over the insulating films 502a and 502b, the gate insulating film 408, and the gate electrode 410 (see FIG. 21C). The above embodiments can be referred to for materials and formation methods of the oxide insulating film 412.

Through the above process, the transistor 550 illustrated in FIGS. 17A to 17C can be fabricated.

This embodiment can be combined with any of the other embodiments in this specification as appropriate.

Embodiment 5

In this embodiment, a transistor having a structure different from those of the transistors described in the above embodiment is described.

Figure 22A:
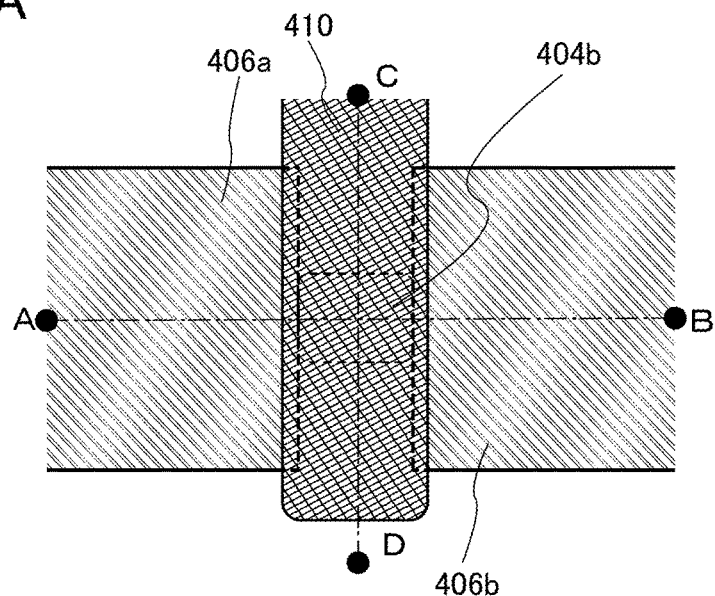
FIGS. 22A to 22C are a top view and cross-sectional views of a transistor.
Figure 22B:
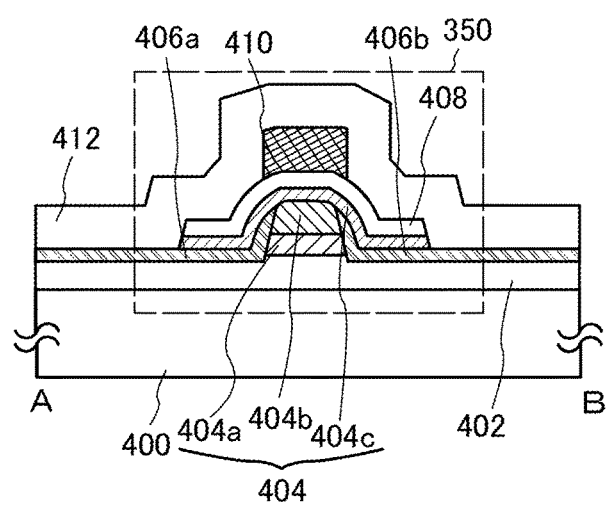
Figure 22C:
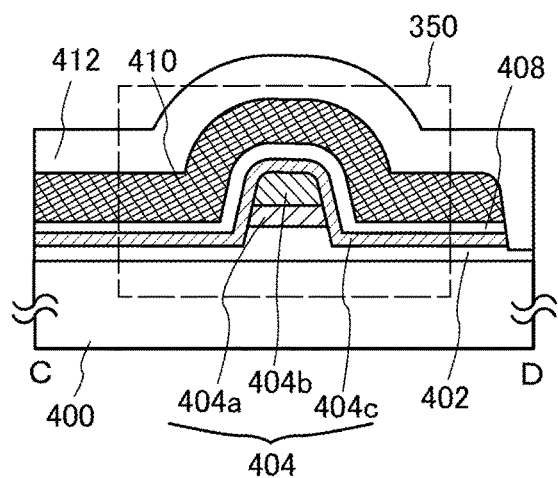

FIGS. 22A to 22C are a top view and cross-sectional views which illustrate a transistor of one embodiment of the present invention. FIG. 22A is the top view, FIG. 22B is a cross section taken along the dashed-dotted line A-B in FIG. 22A, and FIG. 22C is a cross section taken along the dashed-dotted line C-D in FIG. 22A. Note that for simplification of the drawing, some components are not illustrated in the top view of FIG. 22A. The direction of the dashed-dotted line A-B can be referred to as a channel length direction, and the direction of the dashed-dotted line C-D can be referred to as a channel width direction.

A transistor 350 illustrated in FIGS. 22A to 22C includes the base insulating film 402 having a depressed portion and a projected portion over the substrate 400; the first oxide semiconductor film 404a and the second oxide semiconductor film 404b over the projected portion of the base insulating layer 402; the source electrode 406a and the drain electrode 406b in contact with the side surfaces of the first oxide semiconductor film 404a and the second oxide semiconductor film 404b; the third oxide semiconductor film 404c in contact with the bottom surface of the depressed portion of the base insulating film 402, the side surface of the projected portion (or depressed portion) of the base insulating film 402, the side surface of the first oxide semiconductor film 404a, the side surface of the second oxide semiconductor film 404b, the top surface of the second oxide semiconductor film 404b, the source electrode 406a, and the drain electrode 406b; the gate insulating film 408 over the third oxide semiconductor film 404c; the gate electrode 410 which is over and in contact with the gate insulating film 408 and faces the top and side surfaces of the second oxide semiconductor film 404b; and the oxide insulating film 412 over the source electrode 406a, the drain electrode 406b, and the gate electrode 410. The first oxide semiconductor film 404a, the second oxide semiconductor film 404b, and the third oxide semiconductor film 404c are collectively referred to as a multilayer film 404.

FIGS. 22A to 22C illustrate an example in which the end portions of the source and drain electrodes 406a and 406b of the transistor 350 are curved (have a curved surface) by etching of a conductive film to be the source and drain electrodes 406a and 406b.

Figure 23A:
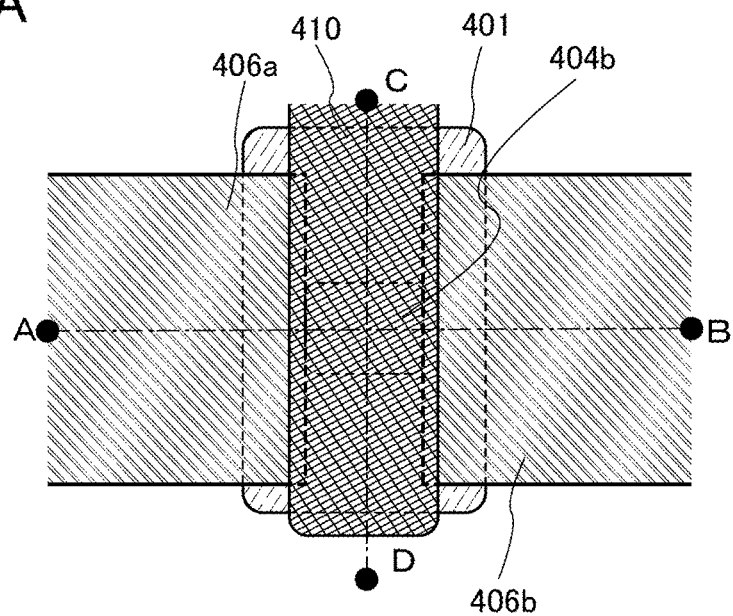
FIGS. 23A to 23C are a top view and cross-sectional views of a transistor.
Figure 23B:
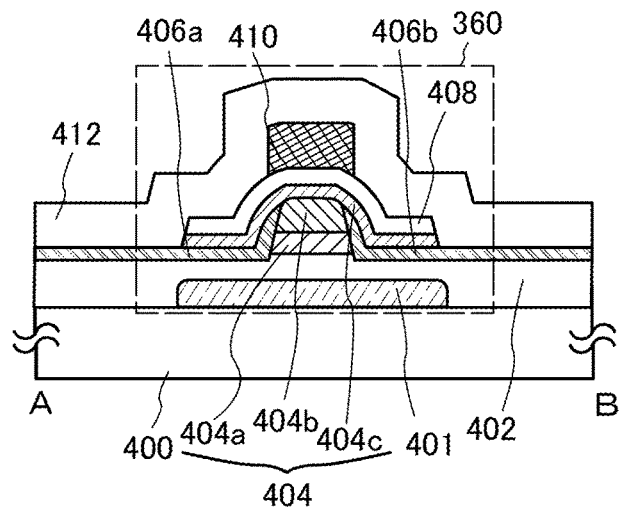
Figure 23C:
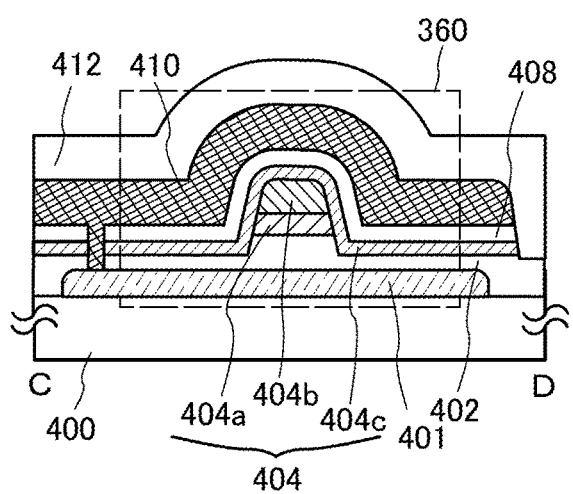

A transistor 360 illustrated in FIGS. 23A to 23C can be used. FIGS. 23A to 23C are a top view and cross-sectional views which illustrate the transistor 360. FIG. 23A is the top view. FIG. 23B illustrates a cross section taken along the dashed-dotted line A-B in FIG. 23A. FIG. 23C illustrates a cross section taken along the dashed-dotted line C-D in FIG. 23A. Note that for simplification of the drawing, some components are not illustrated in the top view of FIG. 23A.

In the transistor 360 shown in FIGS. 23A to 23C, the conductive film 401 is provided between the base insulating film 402 and the substrate 400. When the conductive film 401 is used as a second gate electrode, the on-state current can be further increased or the threshold voltage can be controlled. In order to increase the on-state current, for example, as shown in FIGS. 23A to 23C, the gate electrode 410 and the conductive film 401 are electrically connected to each other to have the same potential, and the transistor is driven as a dual-gate transistor. To control the threshold voltage, the gate electrode 410 and the conductive film 401 are not electrically connected to each other, so that a fixed potential, which is different from a potential of the gate electrode 410, is supplied to the conductive film 401.

Figure 24A:
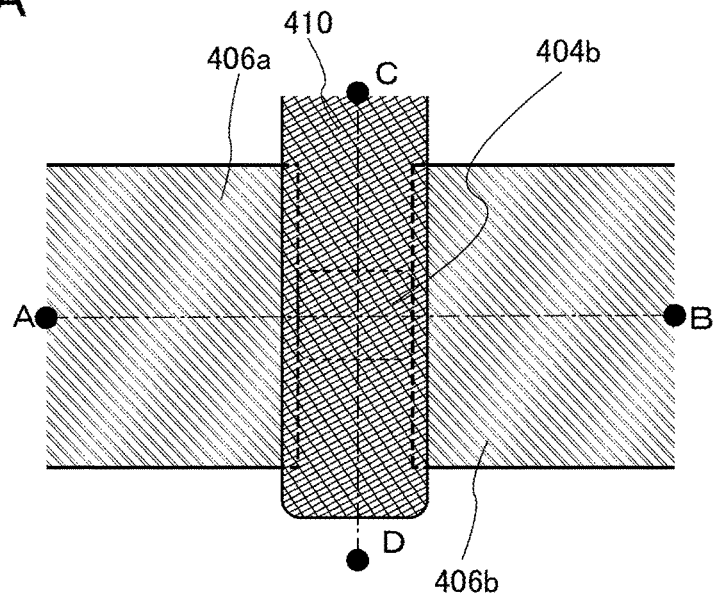
FIGS. 24A to 24C are a top view and cross-sectional views of a transistor.
Figure 24B:
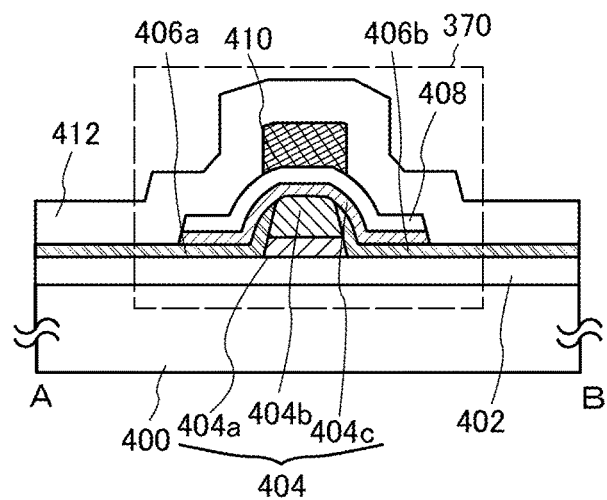
Figure 24C:
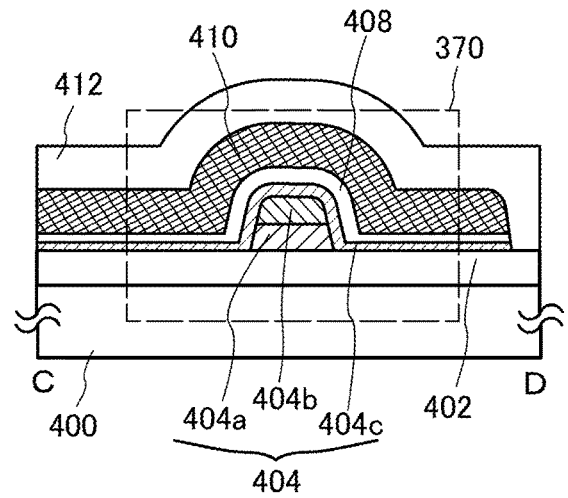

A transistor 370 illustrated in FIGS. 24A to 24C can be used. FIGS. 24A to 24C are a top view and cross-sectional views which illustrate the transistor 370. FIG. 24A is the top view. FIG. 24B illustrates a cross section taken along the dashed-dotted line A-B in FIG. 24A. FIG. 24C illustrates a cross section taken along the dashed-dotted line C-D in FIG. 24A. Note that for simplification of the drawing, some components in the top view of FIG. 24A are not illustrated.

In the transistor 370, the base insulating film 402 is not etched because overetching of the base insulating film 402 is suppressed when the first oxide semiconductor film 404a and the second oxide semiconductor film 404b are formed.

In order to prevent the base insulating film 402 from being overetched when the oxide semiconductor films are etched, the etching rate of the base insulating film 402 is sufficiently lower than the etching rate of the oxide semiconductor film.

Note that the conductive film 401 may be provided in FIGS. 24A to 24C as in FIGS. 23A to 23C.

Figure 25A:
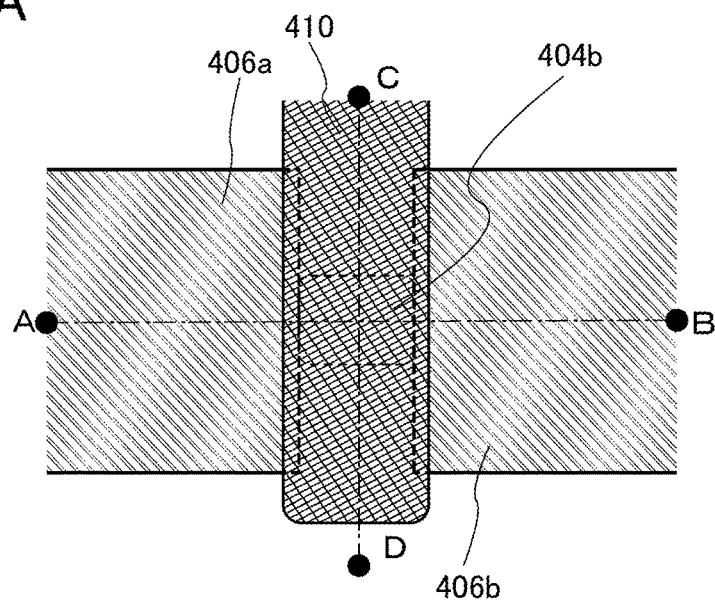
FIGS. 25A to 25C are a top view and cross-sectional views of a transistor.
Figure 25B:
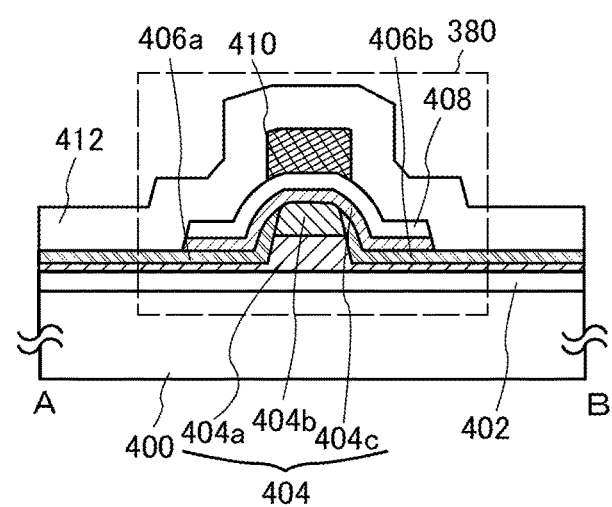
Figure 25C:
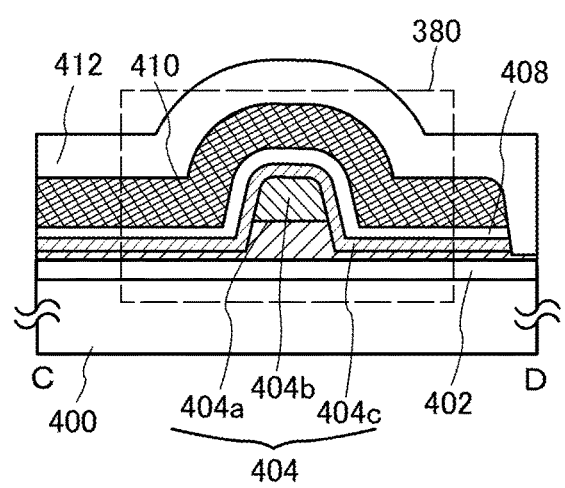

A transistor 380 illustrated in FIGS. 25A to 25C can be used. FIGS. 25A to 25C are a top view and cross-sectional views which illustrate the transistor 480. FIG. 25A is the top view. FIG. 25B illustrates a cross section taken along the dashed-dotted line A-B in FIG. 25A. FIG. 25C illustrates a cross section taken along the dashed-dotted line C-D in FIG. 25A. Note that for simplification of the drawing, some components are not illustrated in the top view of FIG. 25A.

In etching to form the first oxide semiconductor film 404a and the second oxide semiconductor film 404b of the transistor 380, the first oxide semiconductor film is not entirely etched to have a projected shape.

Note that the conductive film 401 may be provided in FIGS. 25A to 25C as in FIGS. 23A to 23C.

The structure in which the second oxide semiconductor film is sandwiched between the first oxide semiconductor film and the third oxide semiconductor film is described in this embodiment. Note that one embodiment is not limited to this, a structure in which any one or two of the films is/are not provided. Another oxide semiconductor film may be additionally provided. For example, a structure may be used in which the first oxide semiconductor film and the third oxide semiconductor film are not provided and only the second oxide semiconductor film is electrically surrounded by the gate electrode. Alternatively, a structure in which only the first oxide semiconductor film and the second oxide semiconductor film are electrically surrounded by the gate electrode or a structure in which only the second oxide semiconductor film and the third oxide semiconductor film are electrically surrounded by the gate electrode may be used.

The electrode and the oxide semiconductor film may have angular end portions. In order to obtain the angular end portions, when a film is processed using a resist mask or a hard mask, the etching rate of the film is greatly different from that of the resist mask or the hard mask. A specific structure example is described below.

Figure 26A:
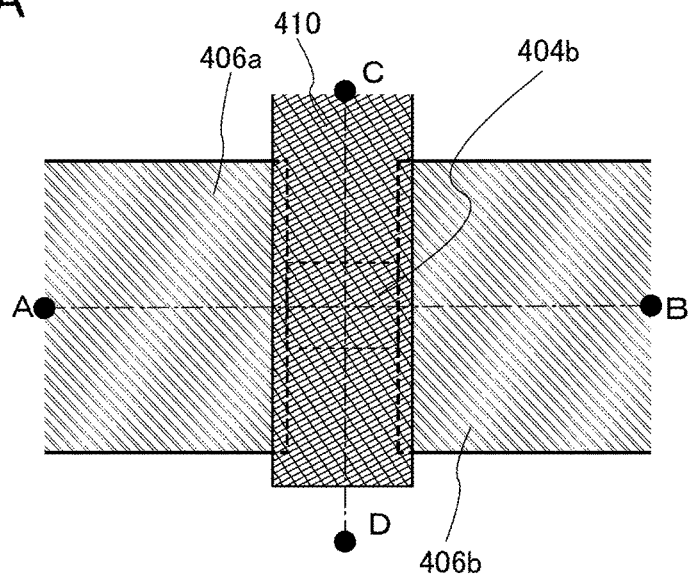
FIGS. 26A to 26C are a top view and cross-sectional views of a transistor.
Figure 26B:
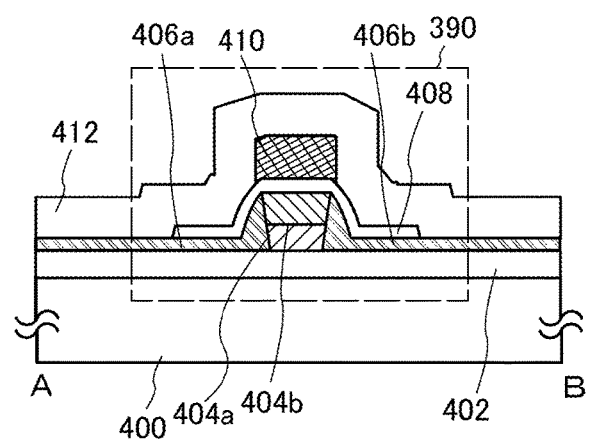
Figure 26C:
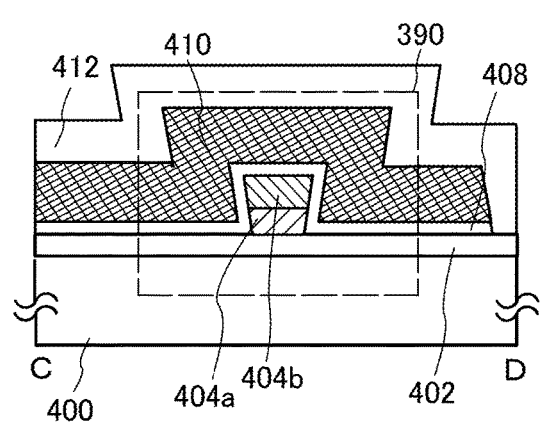

A transistor 390 illustrated in FIGS. 26A to 26C can be used. FIGS. 26A to 26C are a top view and cross-sectional views which illustrate the transistor 390. FIG. 26B illustrates a cross section taken along the dashed-dotted line A-B in FIG. 26A. FIG. 26C illustrates a cross section taken along the dashed-dotted line C-D in FIG. 26A. Note that for simplification of the drawing, some components are not illustrated in the top view of FIG. 26A.

In the transistor 390, only the first oxide semiconductor film 404a and the second oxide semiconductor film 404b are electrically surrounded by a gate electrode. The first and second oxide semiconductor films 404a and 404b may have what is called a reverse tapered shape in which the distance between the ends becomes longer from the bottom surface toward the upper surface (here, the upper surface on the gate insulating film 408 side).

Note that the conductive film 401 may be provided in FIGS. 26A to 26C as in FIGS. 23A to 23C.

Figure 27A:
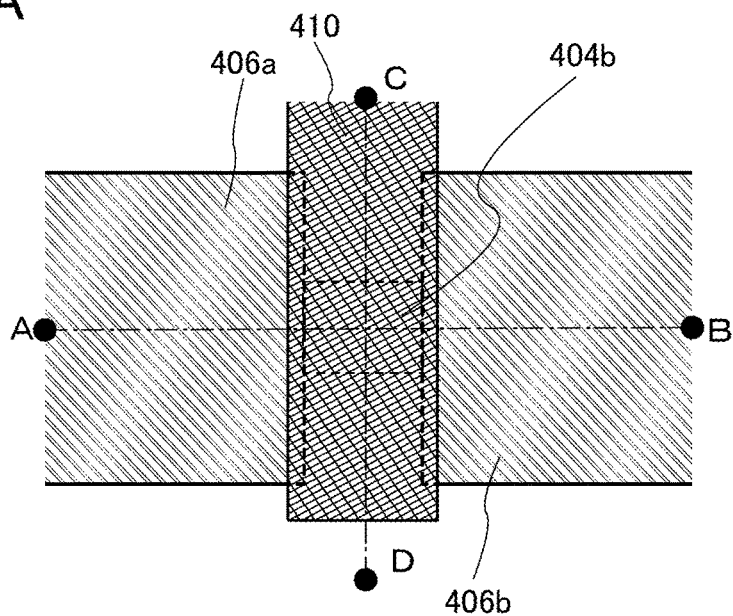
FIGS. 27A to 27C are a top view and cross-sectional views of a transistor.
Figure 27B:
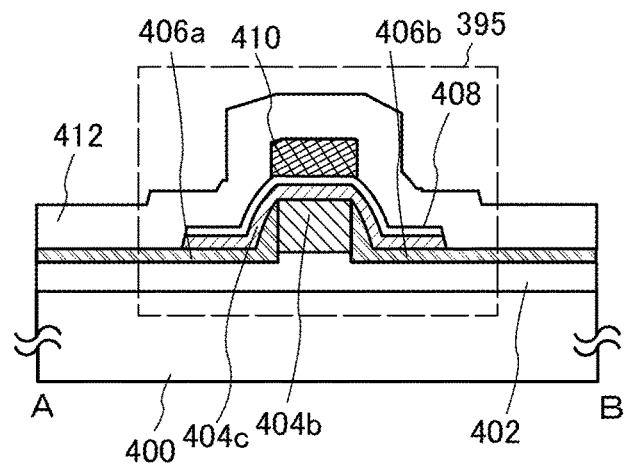
Figure 27C:
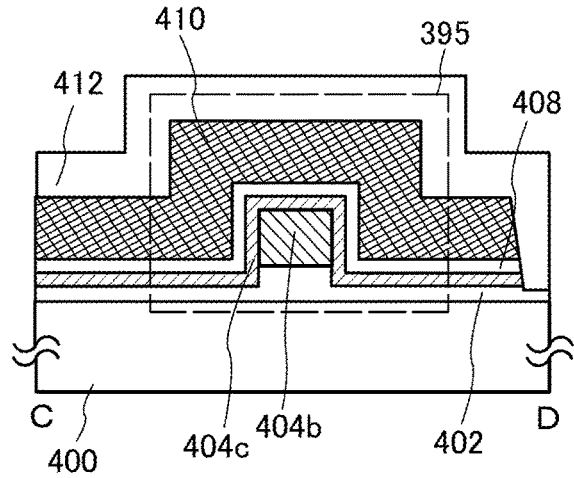
Figure 28A:
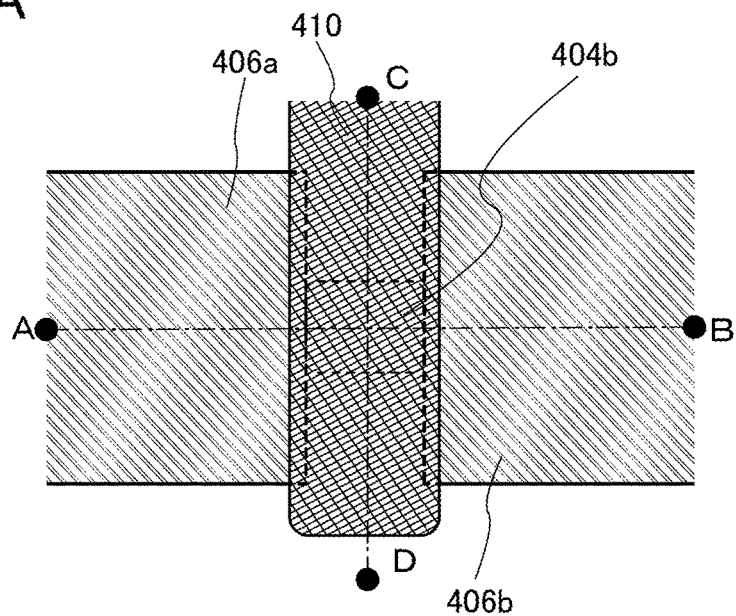
FIGS. 28A to 28C are a top view and cross-sectional views of a transistor.
Figure 28B:
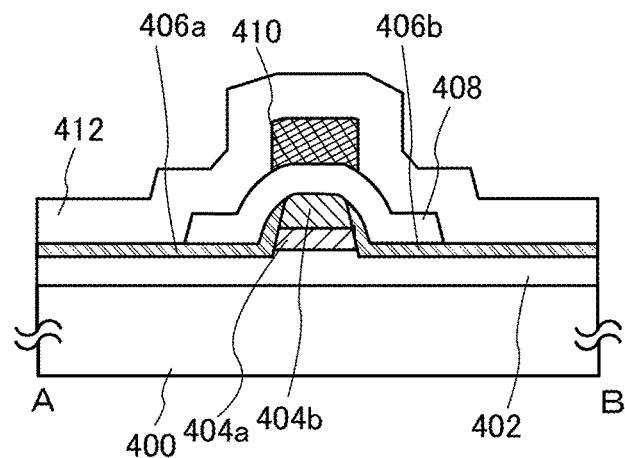
Figure 28C:
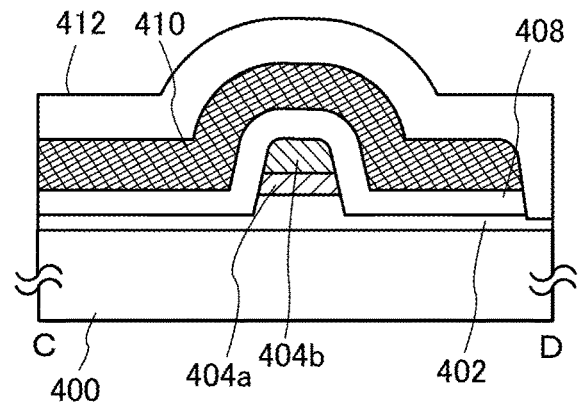
Figure 29A:
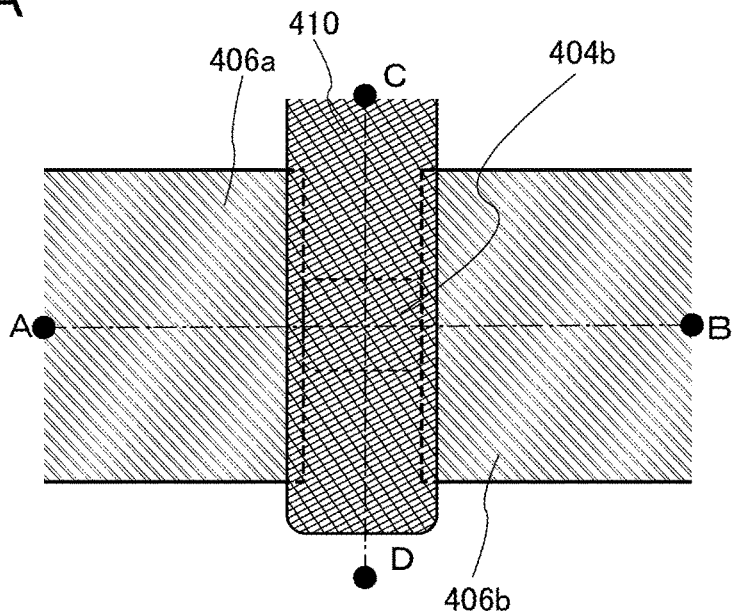
FIGS. 29A to 29C are a top view and cross-sectional views of a transistor.
Figure 29B:
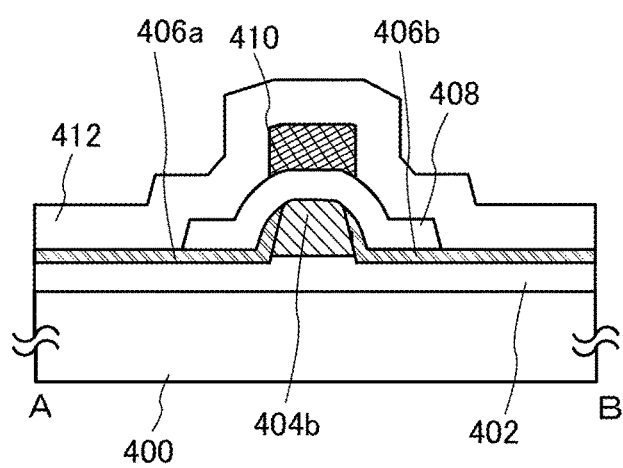
Figure 29C:
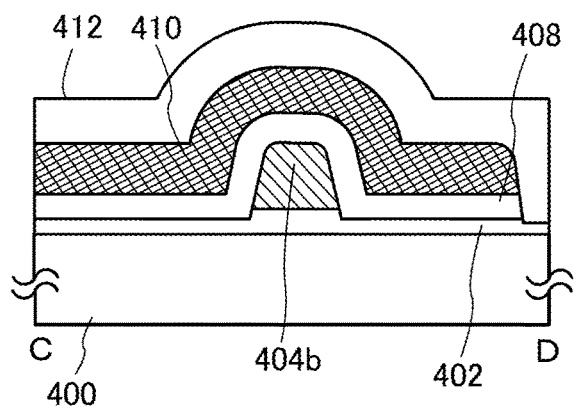
Figure 30A:
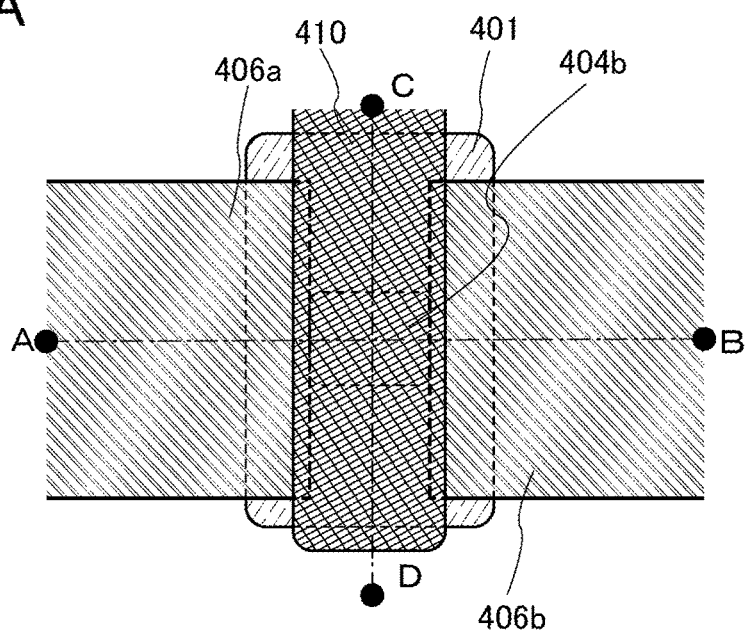
FIGS. 30A to 30C are a top view and cross-sectional views of a transistor.
Figure 30B:
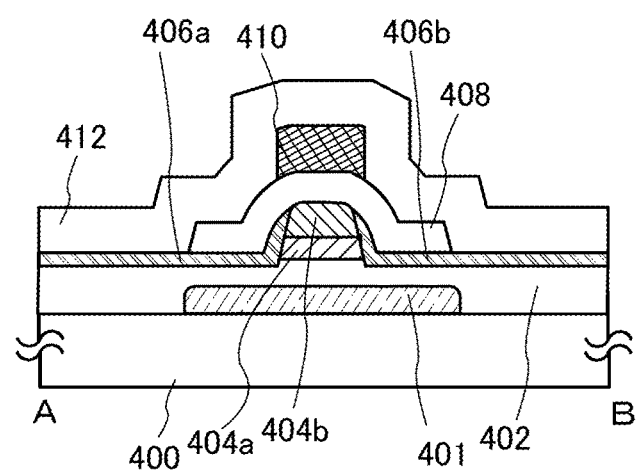
Figure 30C:
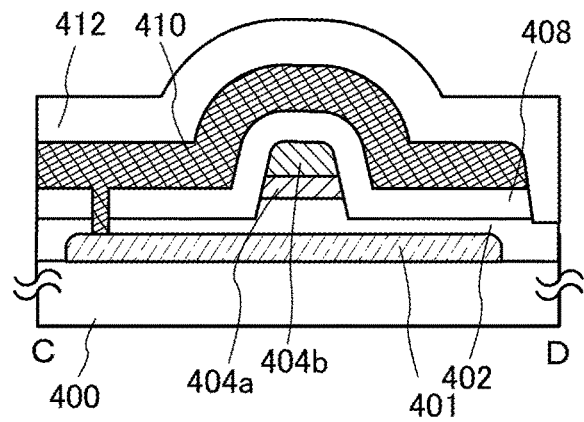
Figure 31A:
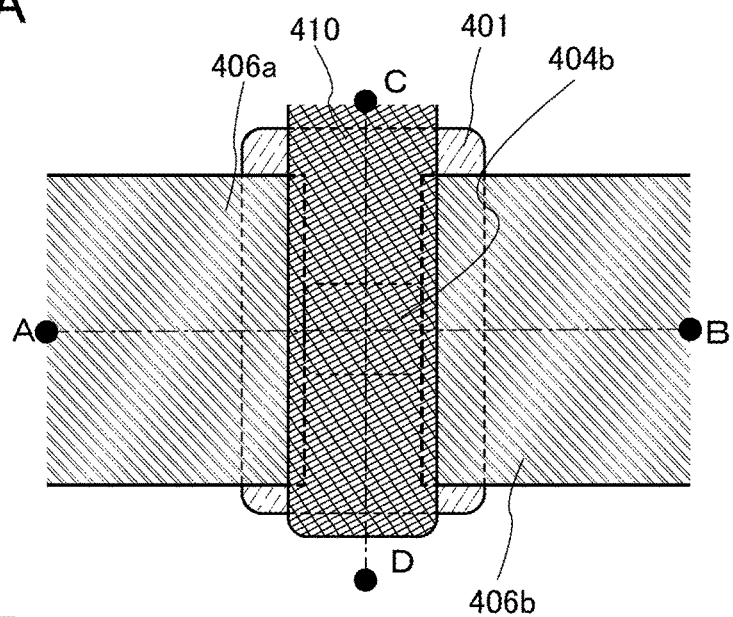
FIGS. 31A to 31C are a top view and cross-sectional views of a transistor.
Figure 31B:
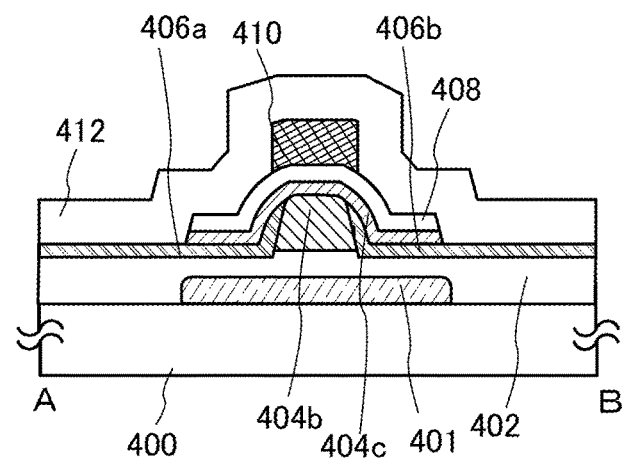
Figure 31C:
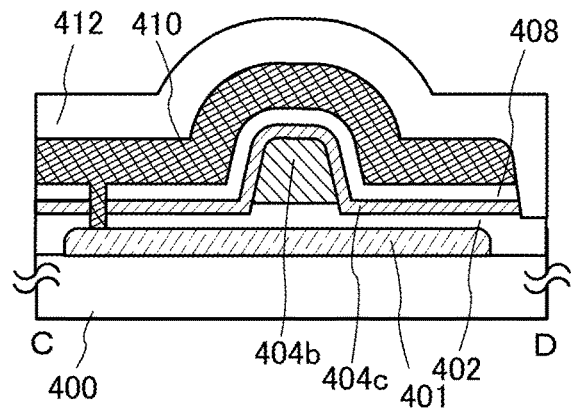
Figure 32A:
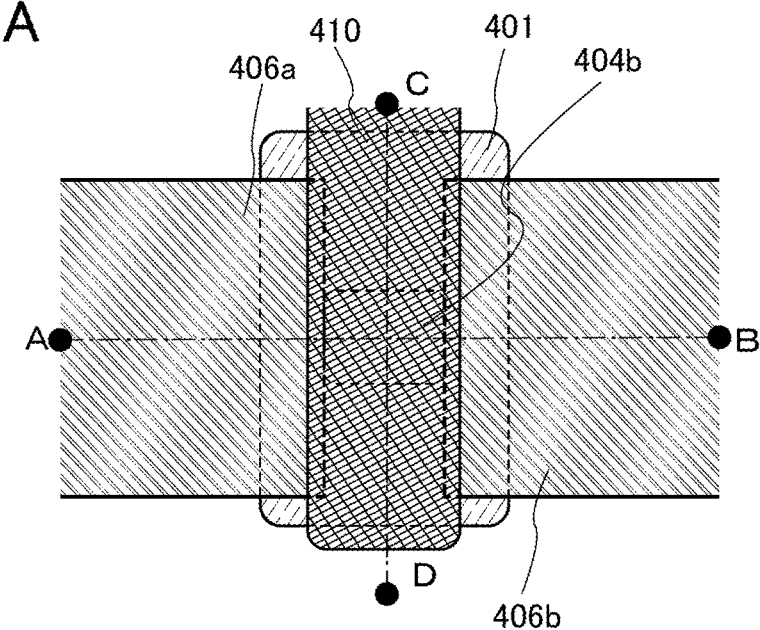
FIGS. 32A to 32C are a top view and cross-sectional views of a transistor.
Figure 32B:
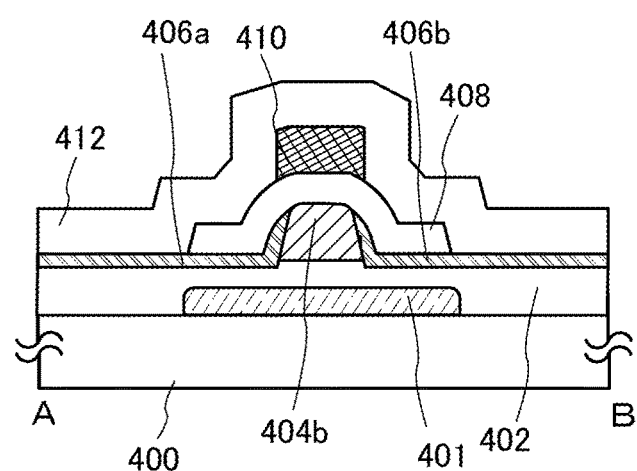
Figure 32C:
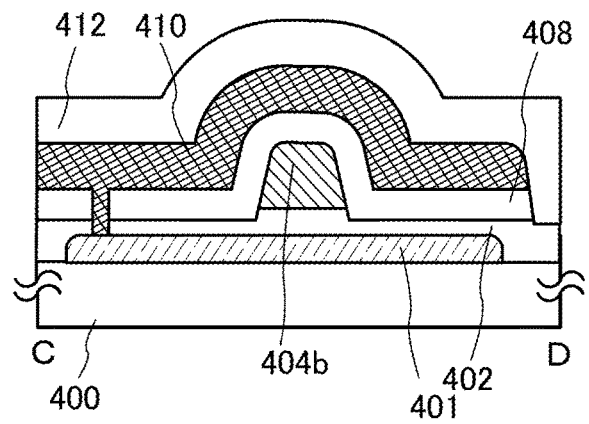

A transistor 395 illustrated in FIGS. 27A to 27C can be used. FIGS. 27A to 27C are a top view and cross-sectional views which illustrate the transistor 395. FIG. 27B illustrates a cross section taken along the dashed-dotted line A-B in FIG. 27A. FIG. 27C illustrates a cross section taken along the dashed-dotted line C-D in FIG. 27A. Note that for simplification of the drawing, some components in the top view in FIG. 2A are not illustrated.

In the transistor 395, only the second oxide semiconductor film 404b and the third oxide semiconductor film 404c are electrically surrounded by the gate electrode.

Note that the conductive film 401 may be provided in FIGS. 27A to 27C as in FIGS. 23A to 23C.

Alternatively, transistors illustrated in FIGS. 28A to 28C and FIGS. 29A to 29C can be used.

Not only the transistors shown in FIGS. 22A to 22C, FIGS. 24A to 24C, FIGS. 25A to 25C, and the like, but also transistors shown in other drawings can have first to third oxide semiconductor films as FIGS. 27A to 27C, FIGS. 28A to 28C, and FIGS. 29A to 29C. For example, FIGS. 30A to 30C, FIGS. 31A to 31C, and FIGS. 32A to 32C are modification examples of FIGS. 23A to 23C.

This embodiment can be combined with any of the other embodiments in this specification as appropriate.

Embodiment 6

In this embodiment, a method for forming the transistor 350 described in Embodiment 5 with reference to FIGS. 22A to 22C is described with reference to FIGS. 33A to 33C, FIGS. 34A to 34C, and FIGS. 35A to 35C.

Figure 33A:
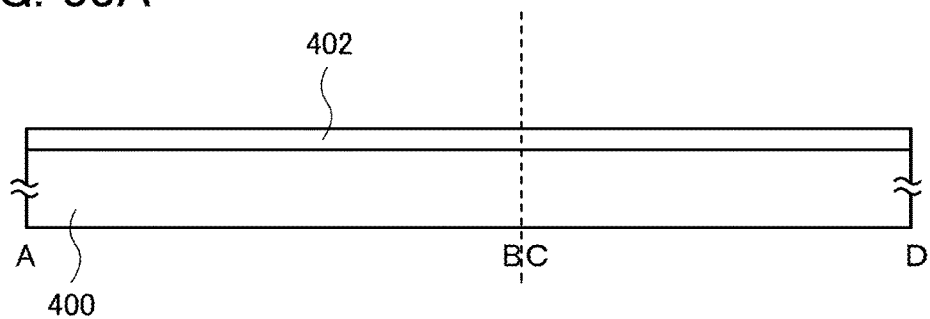
FIGS. 33A to 33C illustrate a method for manufacturing a transistor.

First, a base insulating film 402 is formed over a substrate 400 (see FIG. 33A). The above embodiments can be referred to for materials and formation methods of the substrate 400 and the base insulating film 402.

Figure 33B:
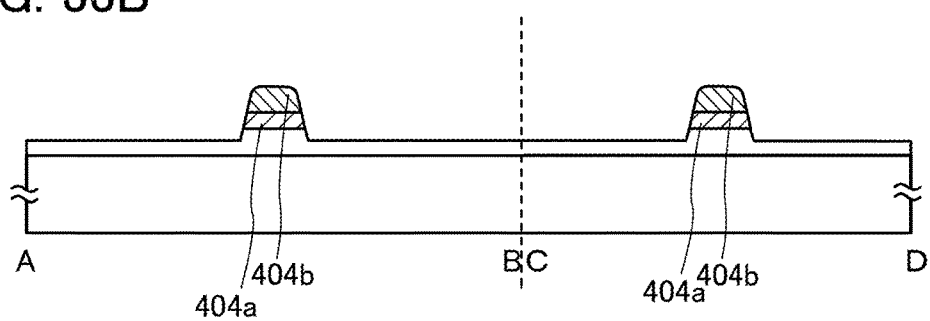

Next, the first oxide semiconductor film 404a and the second oxide semiconductor film 404b are formed over the base insulating film 402 by a sputtering method, a CVD method, an MBE method, an ALD method, or a PLD method (see FIG. 33B). The above embodiments can be referred to for materials and formation methods of the first oxide semiconductor film 404a and the second oxide semiconductor film 404b.

Figure 33C:
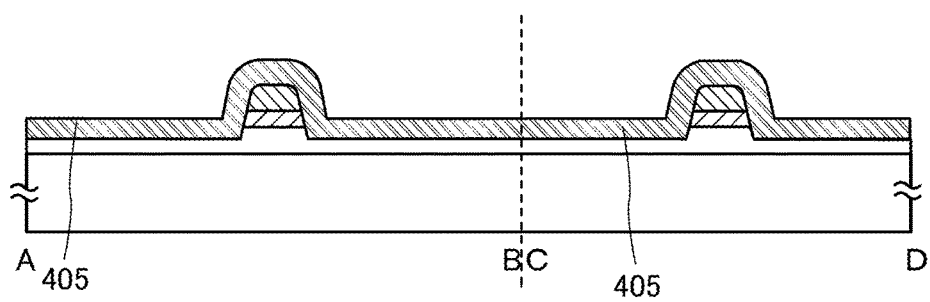

The conductive film 405 to be the source electrode 406a and the drain electrode 406b is formed over the first oxide semiconductor film 404a and the second oxide semiconductor film 404b (see FIG. 33C). The above embodiments can be referred to for materials and formation methods of the conductive film 405.

Figure 34A:
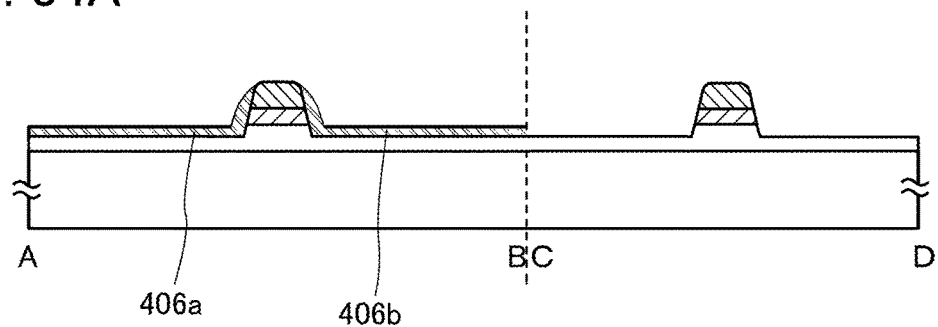
FIGS. 34A to 34C illustrate a method for manufacturing a transistor.

Next, the conductive film 405 is etched to form the source and drain electrodes 406a and 406b (see FIG. 34A). Note that the end portions of the conductive film 405 are curved (have a curved surface) by etching. In this embodiment, the upper surface of the second oxide semiconductor film is aligned with the upper surface of the source and drain electrodes. Note that one embodiment is not limited to this structure; the upper surface of the source and drain electrodes may be lower than the upper surface of the second oxide semiconductor film. In the cross section, the base insulating film 402 in the C-D direction may be lower than that in the A-B direction.

Figure 34B:
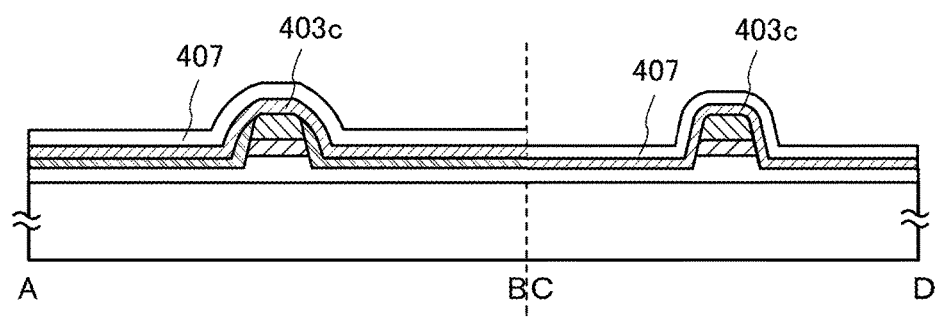

Next, the third oxide semiconductor film 403*c* and the insulating film 407 to be the gate insulating film 408 is formed over the second oxide semiconductor film 404*b*, the source electrode 406*a*, and the drain electrode 406*b* (see FIG. 34B). The above embodiments can be referred to for the materials and formation methods of the third oxide semiconductor film 403*c* and the insulating film 407.

Figure 34C:
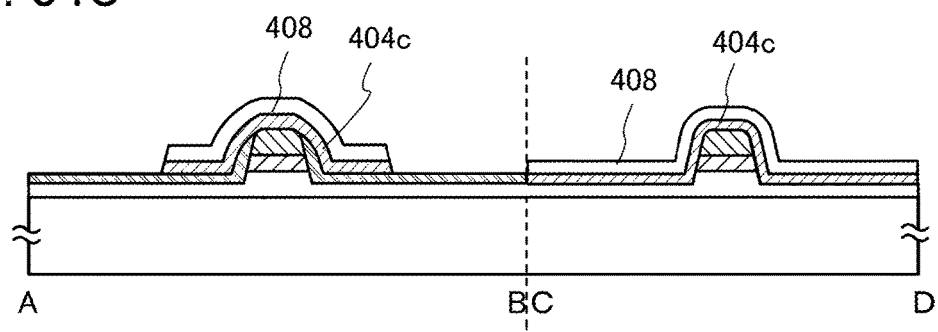

Next, the third oxide semiconductor film 403*c* and the insulating film 407 are etched to form the third oxide semiconductor film 404*c* and the gate insulating film 408 (see FIG. 34C).

Figure 35A:
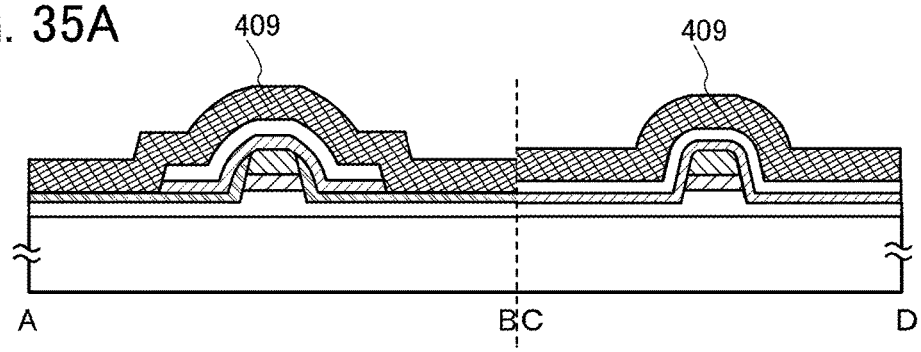
FIGS. 35A to 35C illustrate a method for manufacturing a transistor.

Then, the conductive film 409 to be the gate electrode 410 is formed over the source and drain electrodes 406*a* and 406*b*, the third oxide semiconductor film 404*c*, and the gate insulating film 408 (see FIG. 35A).

Figure 35B:
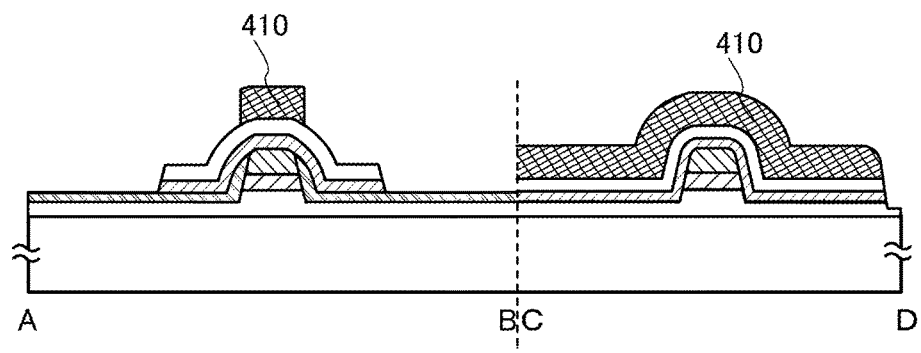

After that, the conductive film 409 is selectively etched using a resist mask to form the gate electrode 410, whereby the gate electrode 410 is formed (see FIG. 35B). Note that the gate electrode 410 is formed so as to electrically surround the second oxide semiconductor film 404*b*.

Figure 35C:
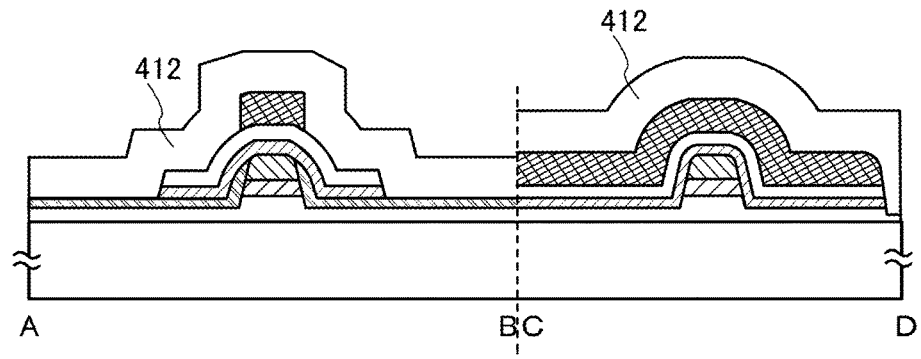

The oxide insulating film 412 are formed over the source and drain electrodes 406*a* and 406*b*, the third oxide semiconductor film 404*c*, the gate insulating film 408, and the gate electrode 410 (see FIG. 35C). The above embodiments can be referred to for materials and formation methods of the oxide insulating film 412.

Through the above process, the transistor 350 illustrated in FIGS. 22A to 22C can be manufactured.

This embodiment can be combined with any of the other embodiments in this specification as appropriate.

Embodiment 7

In this embodiment, a transistor having a structure different from those of the transistors described in the above embodiments is described.

Figure 36A:
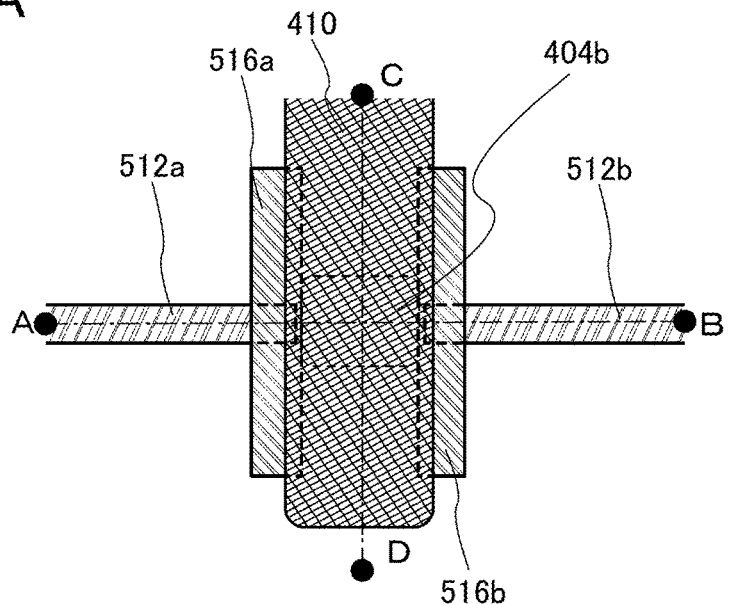
FIGS. 36A to 36C are a top view and cross-sectional views of a transistor.
Figure 36B:
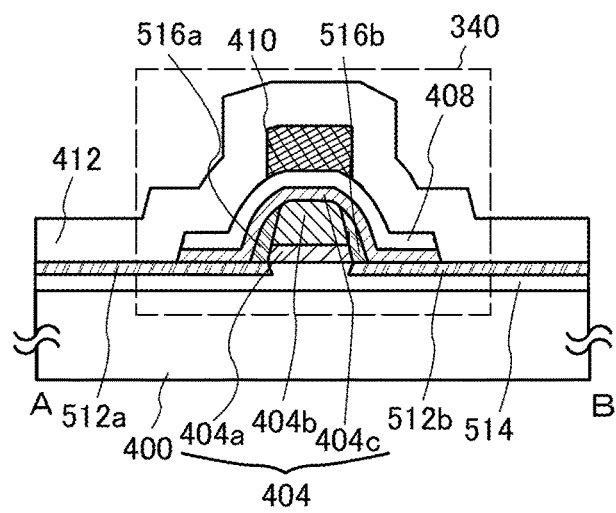
Figure 36C:
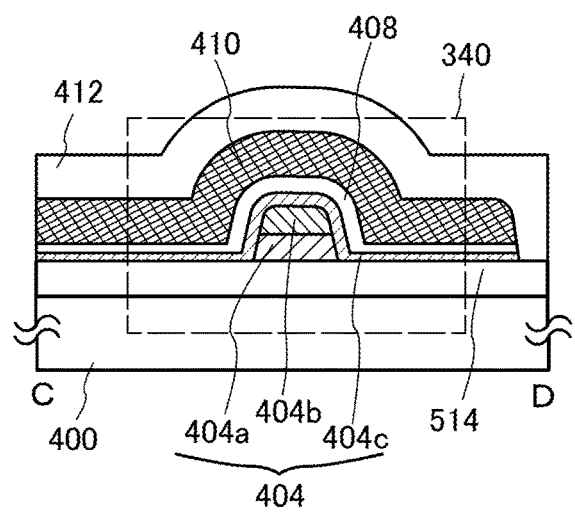

FIGS. 36A to 36C are a top view and cross-sectional views that illustrate a transistor of an embodiment of the present invention. FIG. 36A is the top view. FIG. 36B illustrates a cross section taken along the dashed-dotted line A-B in FIG. 36A. FIG. 36C illustrates a cross section taken along the dashed-dotted line C-D in FIG. 36A. Note that for simplification of the drawing, some components in the top view in FIG. 36A are not illustrated. The direction of the dashed-dotted line A-B can be referred to as a channel length direction, and the direction of the dashed-dotted line C-D can be referred to as a channel width direction.

A transistor 340 illustrated in FIGS. 36A to 36C includes a base insulating film 514 having a depressed portion and a projected portion over the substrate 400; a first wiring 512*a* and a second wiring 512*b* over the depressed portion of the base insulating film 514; the first oxide semiconductor film 404*a* and the second oxide semiconductor film 404*b* over the projected portion of the base insulating film 514; a source electrode 516*a* and a drain electrode 516*b* over the first wiring 512*a* and the second wiring 512*b* and in contact with the side surfaces of the first oxide semiconductor film 404*a* and the second oxide semiconductor film 404*b*; the third oxide semiconductor film 404*c* in contact with a bottom surface of the depressed portion of the base insulating film 514, the side surface of the first oxide semiconductor film 404*a*, the side surface of the second oxide semiconductor film 404*b*, the top surface of the second oxide semiconductor film 404*b*, top surfaces of the first wiring 512*a* and the second wiring 512*b*, and the source and drain electrodes 514*a* and 516*b*; the gate insulating film 408 over the third oxide semiconductor film 404*c*; the gate electrode 410 which is over and in contact with the gate insulating film 408 and faces the top and side surfaces of the second oxide semiconductor film 404*b*; and the oxide insulating film 412 over the gate electrode 410. The first oxide semiconductor film 404*a*, the second oxide semiconductor film 404*b*, and the third oxide semiconductor film 404*c* are collectively referred to as a multilayer film 404.

FIGS. 36A to 36C illustrate an example in which the end portions of the source and drain electrodes 516*a* and 516*b* of the transistor 340 are curved (have a curved surface) by etching of a conductive film to be the source and drain electrodes 406*a* and 406*b*.

This embodiment can be combined with any of the other embodiments in this specification as appropriate.

Embodiment 8

In this embodiment, a method for forming the transistor 340 described in Embodiment 7 with reference to FIGS. 36A to 36D is described with reference to FIGS. 37A to 37C, FIGS. 38A to 38C, and FIGS. 39A to 39C.

First, a base insulating film 511 is formed over the substrate 400. Furthermore, a first wiring 512*a* and a second wiring 512*b* are formed over the base insulating film 511 (see FIG. 37A). The above embodiment can be referred to for the material of the substrate 400. The base insulating film 402 and the source and drain electrodes 406*a* and 406*b* in the above embodiments can be referred to for the materials and formation methods of the base insulating film 511 and the first and second wirings 512*a* and 512*b*, respectively.

Figure 37A:
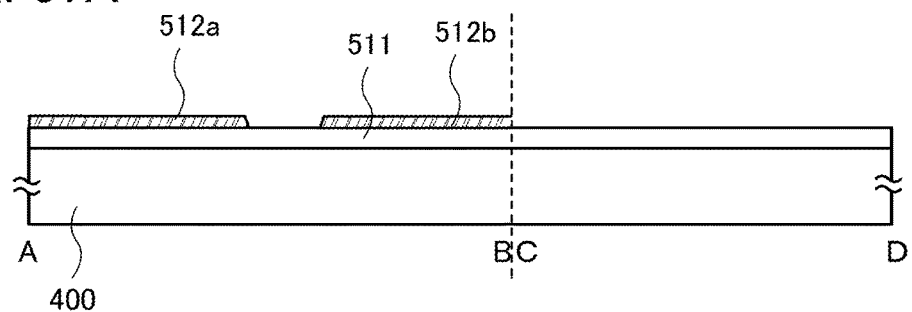
FIGS. 37A to 37C illustrate a method for manufacturing a transistor.
Figure 37B:
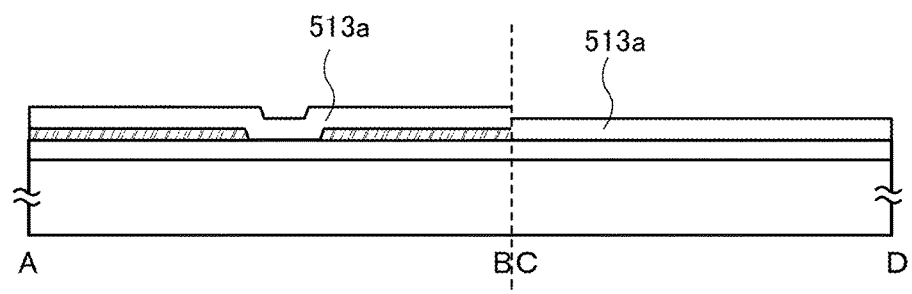

Then, a base insulating film 513*a* is formed over the base insulating film 511, the first wiring 512*a*, and the second wiring 512*b* (see FIG. 37B). A material similar to that of the base insulating film 511 can be used for the base insulating film 513*a*.

Figure 37C:
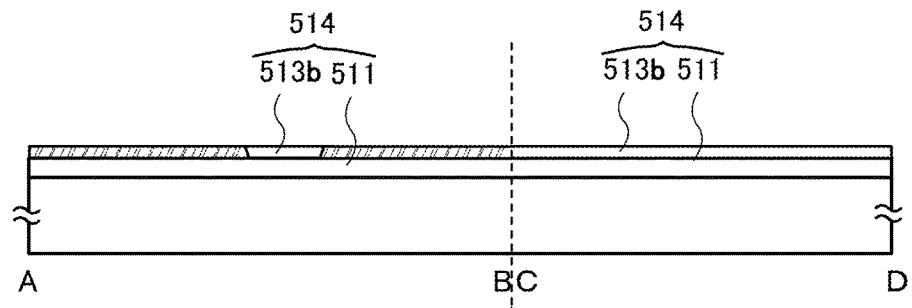

Then, part of the base insulating film 513*a* is removed by removing (polishing) treatment so that the first wiring 512*a* and the second wiring 512*b* are exposed, whereby the base insulating film 513*b* is formed (see FIG. 37C). The base insulating films 511 and 513*a* are collectively referred to as a base insulating film 514.

For the removing treatment, chemical mechanical polishing (CMP) treatment can be preferably used. Another removing treatment may be used. Alternatively, the polishing treatment such as the CMP treatment may be combined with etching (dry etching or wet etching) treatment or plasma treatment. For example, after the CMP treatment, dry etching treatment or plasma treatment (e.g., reverse sputtering) may be performed in order to improve the flatness of a surface to be processed. In the case where in the removing treatment, the etching treatment, the plasma treatment, or the like is combined with the CMP treatment, the order of steps may be, without any particular limitation, set as appropriate depending on the material, thicknesses, and surface roughness. Alternatively, a large part of the base insulating film 513*a* may be removed by CMP treatment and other part of the base insulating film 513*a* may be removed by dry etching treatment.

Note that the CMP treatment may be performed only once or plural times. When the CMP treatment is performed plural times, first polishing is preferably performed with a high polishing rate followed by final polishing with a low polishing rate. By performing polishing steps with different polishing rates in combination, the planarity of the surface of the base insulating film can be further improved.

Next, the first oxide semiconductor film 404a and the second oxide semiconductor film 404b are formed over the base insulating film 514 by a sputtering method, a CVD method, an MBE method, an ALD method, or a PLD method. A first conductive film 405 to be the source electrode 516a and the drain electrode 516b is formed over the first oxide semiconductor film 404a and the second oxide semiconductor film 404b (see FIG. 38A). The above embodiments can be referred to for the materials and formation methods of the first oxide semiconductor film 404a, the second oxide semiconductor film 404b, and the first conductive film 405.

Figure 38A:
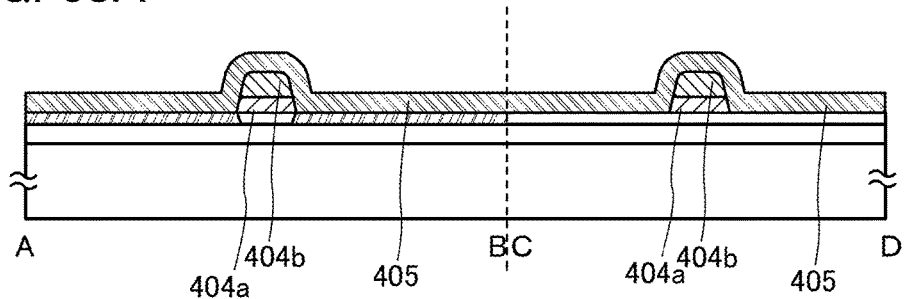
FIGS. 38A to 38C illustrate a method for manufacturing a transistor.
Figure 38B:
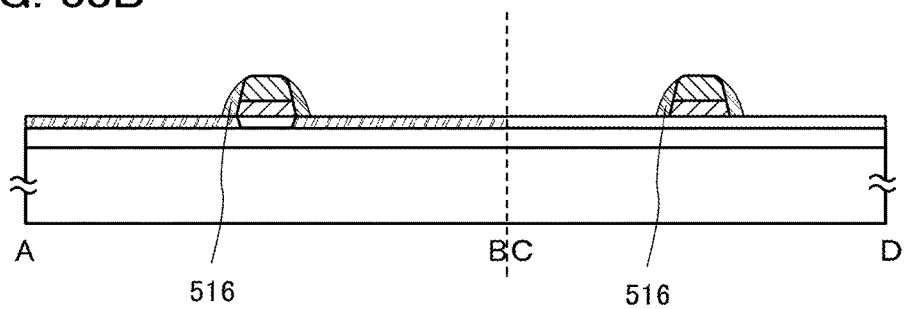

Next, the first conductive film 405 is anisotropically etched to form an electrode 516 (see FIG. 38B).

Figure 38C:
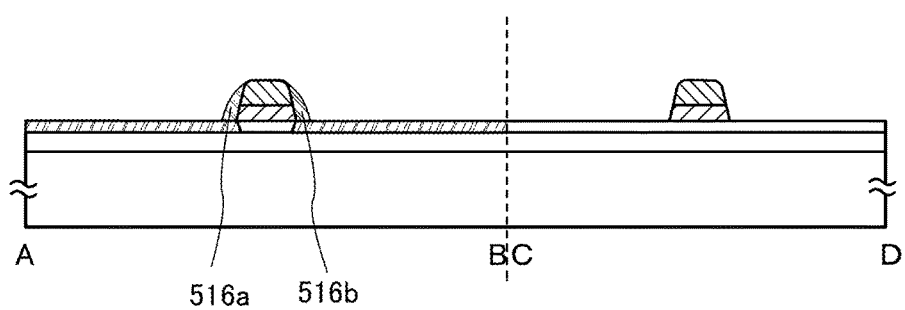

Then, the electrode 516 is divided by etching to form the source electrode 516a and the drain electrode 516b (see FIG. 38C). Note that the end portions of the first conductive film 405 or the electrode 516 may be curved (have a curved surface) by etching. In this embodiment, the upper surface of the second oxide semiconductor film is aligned with the upper surface of the source and drain electrodes. Note that one embodiment is not limited to this structure; the upper surface of the source and drain electrodes may be lower than the upper surface of the second oxide semiconductor film.

Figure 39A:
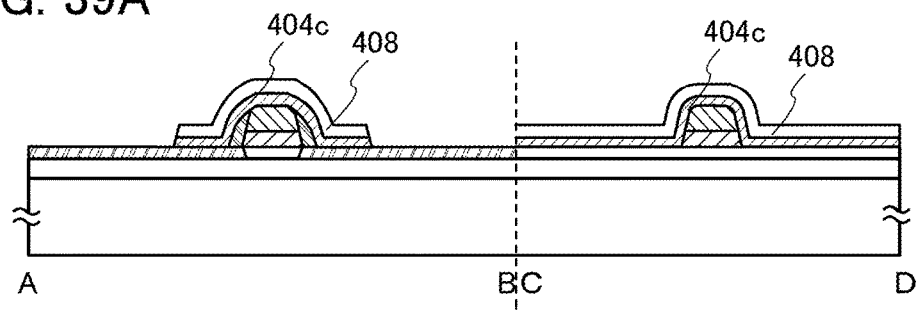
FIGS. 39A to 39C illustrate a method for manufacturing a transistor.

The third oxide semiconductor film 404c and the gate insulating film 408 are formed over the first wiring 512a, the second wiring 512b, the second oxide semiconductor film 404b, and the source and drain electrodes 406a and 406b (see FIG. 39A). The above embodiments can be referred to for the materials and formation methods of the third oxide semiconductor film 404c and the gate insulating film 408.

Figure 39B:
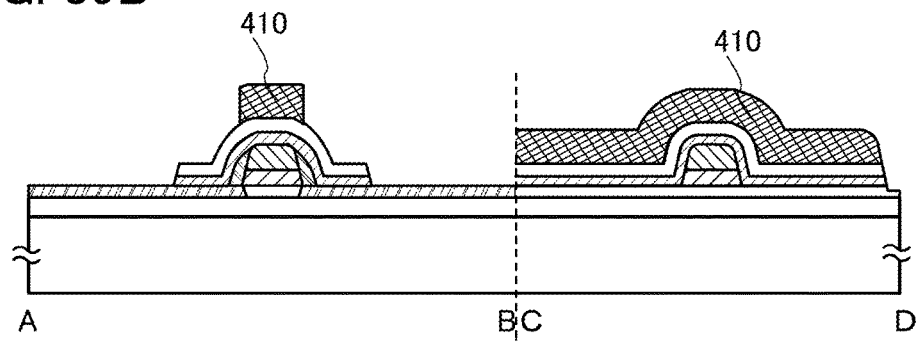

Then, the gate electrode 410 is formed over the third oxide semiconductor film 404c and the gate insulating film 408 (see FIG. 39B). The above embodiments can be referred to for the material and formation method of the gate electrode 410.

Figure 39C:
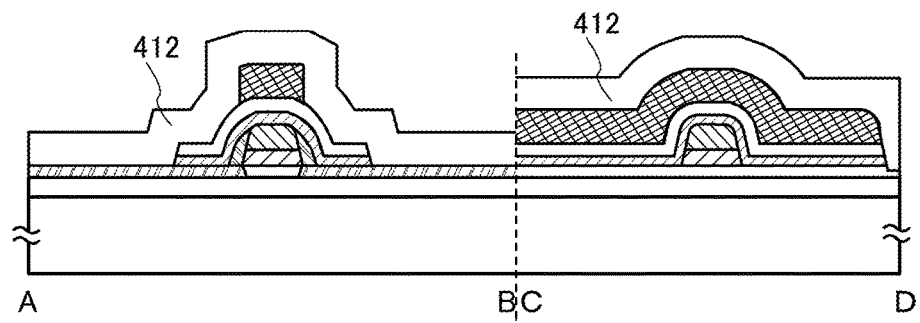

The oxide insulating film 412 is formed over the first wiring 512a, the second wiring 512b, the third oxide semiconductor film 404c, the gate insulating film 408, and the gate electrode 410 (see FIG. 39C). The above embodiments can be referred to for the materials and formation methods of the oxide insulating film 412.

Through the above process, the transistor 340 illustrated in FIGS. 36A to 36C can be fabricated.

This embodiment can be combined with any of the other embodiments in this specification as appropriate.

Embodiment 9

In this embodiment, a semiconductor device which is one embodiment of the present invention is described with reference to drawings.

Figure 40A:
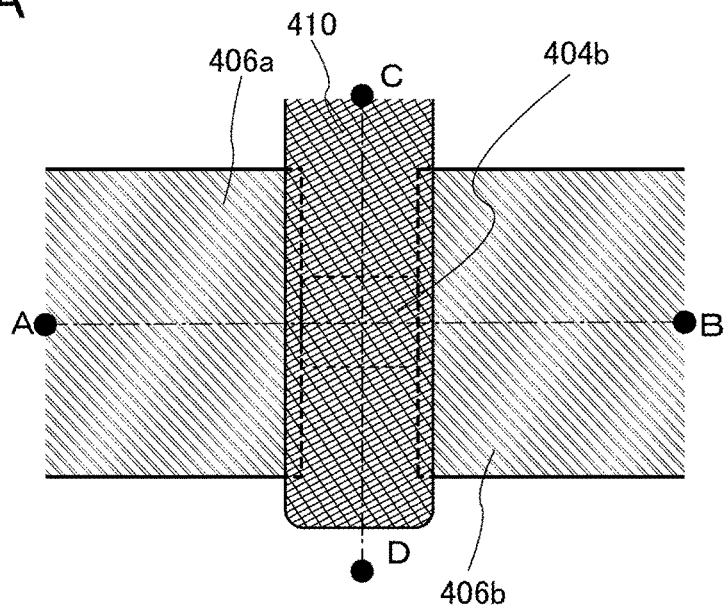
FIGS. 40A to 40C are a top view and cross-sectional views of a transistor.
Figure 40B:
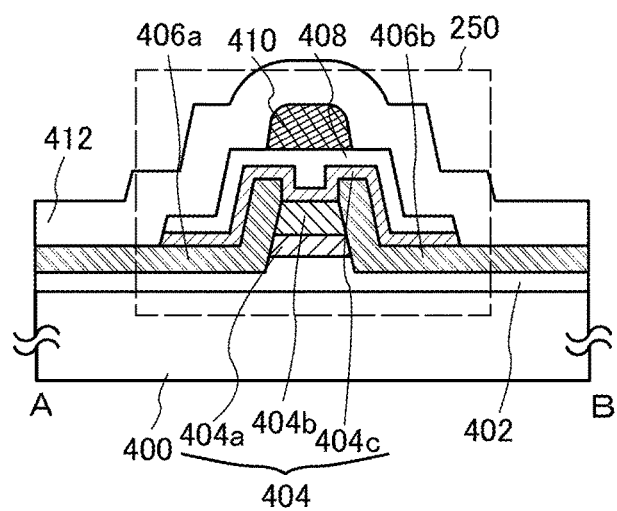
Figure 40C:
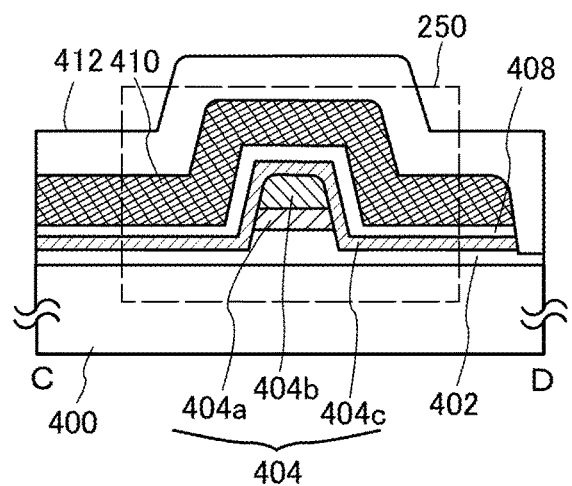

FIGS. 40A, 40B, and 40C are a top view and cross-sectional views of a transistor of one embodiment of the present invention. FIG. 40A is the top view. FIG. 40B is a cross-sectional view taken along the dashed-dotted line A-B in FIG. 40A. FIG. 40C is a cross-sectional view taken along the dashed-dotted line C-D in FIG. 40A. Note that for simplification of the drawing, some components in the top view in FIG. 40A are not illustrated. The direction of the dashed-dotted line A-B and the direction of the dashed-dotted line C-D can be referred to as a channel length direction and a channel width direction, respectively.

A transistor 250 illustrated in FIGS. 40A to 40C includes the base insulating film 402 having a depressed portion and a projected portion over the substrate 400; the first oxide semiconductor film 404a and the second oxide semiconductor film 404b over the projected portion of the base insulating layer 402; the source electrode 406a and the drain electrode 406b in contact with the side surfaces of the first oxide semiconductor film 404a and the second oxide semiconductor film 404b; the third oxide semiconductor film 404c in contact with the bottom surface of the depressed portion of the base insulating film 402, the side surface of the projected portion (or depressed portion) of the base insulating film 402, the side surface of the first oxide semiconductor film 404a, the side surface of the second oxide semiconductor film 404b, the top surface of the second oxide semiconductor film 404b, the source electrode 406a, and the drain electrode 406b; the gate insulating film 408 over the third oxide semiconductor film 404c; the gate electrode 410 which is over and in contact with the gate insulating film 408 and faces the top and side surfaces of the second oxide semiconductor film 404b; and the oxide insulating film 412 over the source electrode 406a, the drain electrode 406b, the third oxide semiconductor film 404c, the gate insulating film 408, and the gate electrode 410. The upper surface of the second oxide semiconductor film 404b is lower than the upper surface of the source and drain electrodes 406a and 406b. The first oxide semiconductor film 404a, the second oxide semiconductor film 404b, and the third oxide semiconductor film 404c are collectively referred to as a multilayer film 404.

The source and drain electrodes 406a and 406b of the transistor 250 in FIGS. 40A to 40C can be formed by performing lift-off process on a conductive film which is to be the source and drain electrodes 406a and 406b.

Note that the term "lift-off" process means such a process that in order to make a desired pattern, a protective mask (also referred to as a sacrificial layer) with the desired pattern is formed, a film is formed over the protective mask, and then the protective mask is removed, so that the desired pattern is formed in a portion of the film which have not been provided with the protective mask.

Figure 41A:
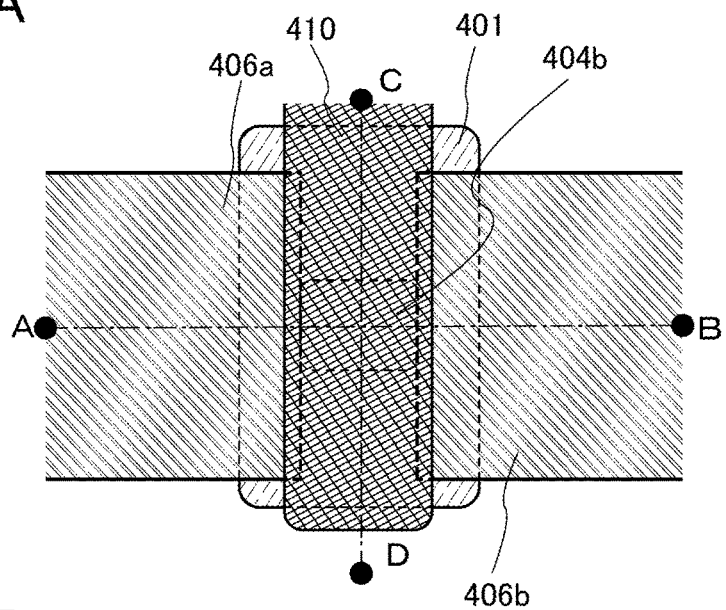
FIGS. 41A to 41C are a top view and cross-sectional views of a transistor.
Figure 41B:
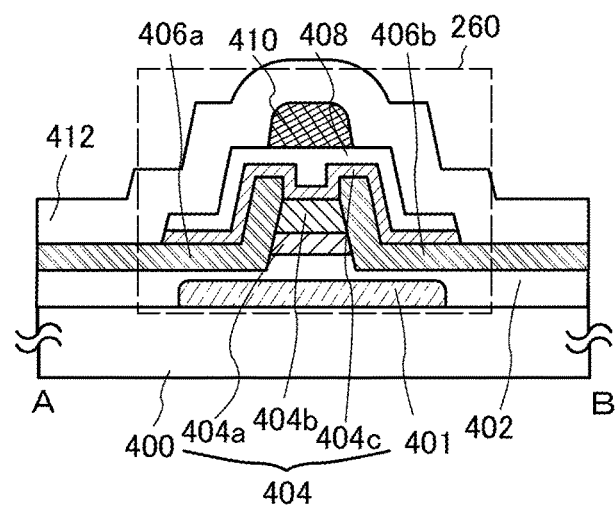
Figure 41C:
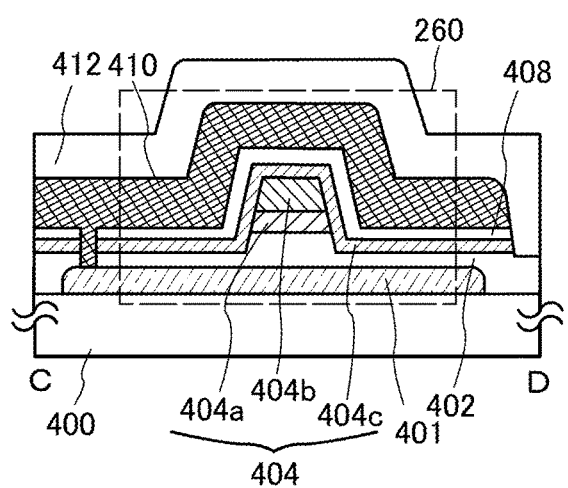

A transistor 260 illustrated in FIGS. 41A to 41C can be used. FIGS. 41A to 41C are a top view and cross-sectional views which illustrate the transistor 260. FIG. 41A is the top view. FIG. 41B is a cross-sectional view taken along the dashed-dotted line A-B in FIG. 41A. FIG. 41C is a cross-sectional view taken along the dashed-dotted line C-D in FIG. 41A. Note that for simplification of the drawing, some components in the top view in FIG. 41A are not illustrated.

The transistor 260 shown in FIGS. 41A to 41C has the conductive film 401 between the base insulating film 402 and the substrate 400. When the conductive film 401 is used as a second gate electrode, the on-state current can be further increased or the threshold voltage can be controlled. In order to increase the on-state current, for example, as shown in FIGS. 41A to 41C, the gate electrode 410 and the conductive film 401 are electrically connected to each other to have the same potential to drive the transistor as a dual-gate transistor. In order to control the threshold voltage, the gate electrode 410 is not electrically connected to the conductive film 401 to supply the conductive film 401a fixed potential, which is different from a potential of the gate electrode 410.

Figure 42A:
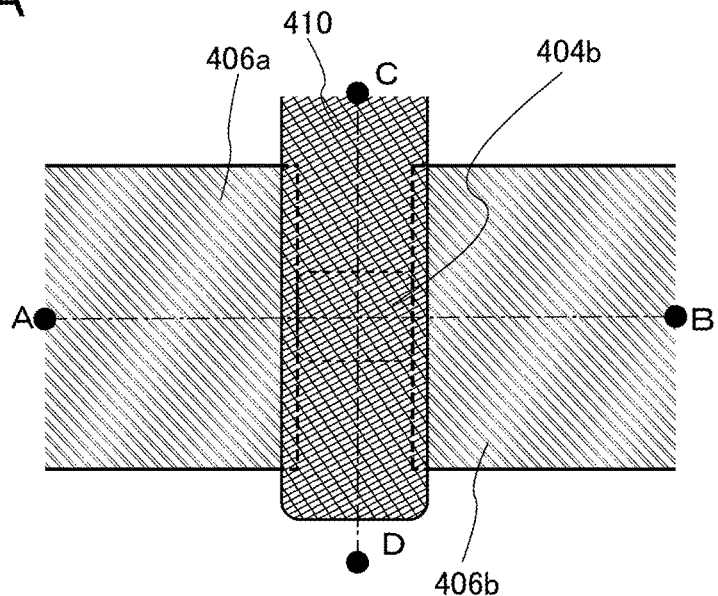
FIGS. 42A to 42C are a top view and cross-sectional views of a transistor.
Figure 42B:
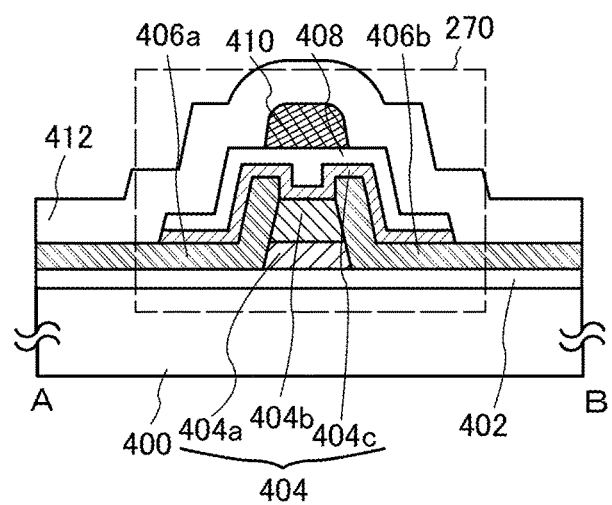
Figure 42C:
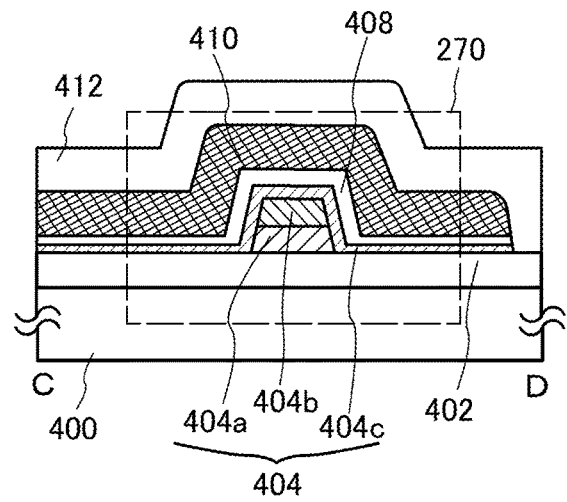

A transistor 270 illustrated in FIGS. 42A to 42C can be used. FIGS. 42A to 42C are a top view and cross-sectional views which illustrate the transistor 270. FIG. 42A is the top view. FIG. 42B is a cross-sectional view taken along the dashed-dotted line A-B in FIG. 42A. FIG. 42C is a cross-sectional view taken along the dashed-dotted line C-D in FIG. 42A. Note that for simplification of the drawing, some components in the top view in FIG. 42A are not illustrated.

In the transistor 270, the base insulating film 402 is not etched because overetching of the base insulating film 402 is suppressed when the first oxide semiconductor film 404a and the second oxide semiconductor film 404b are formed.

In order to prevent the base insulating film 402 from being etched when the oxide semiconductor films are etched, the etching rate of the base insulating film 402 is sufficiently lower than the etching rate of the oxide semiconductor film.

Note that the conductive film 401 may be provided in FIGS. 42A to 42C as in FIGS. 41A to 41C.

Figure 43A:
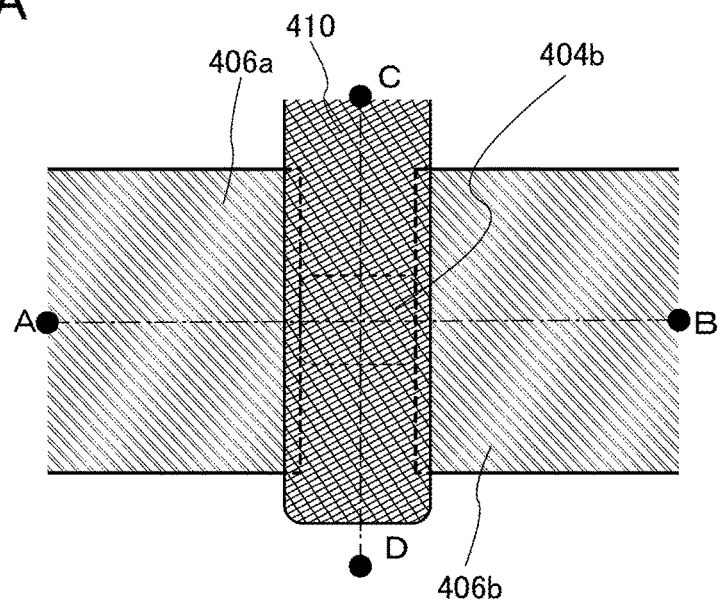
FIGS. 43A to 43C are a top view and cross-sectional views of a transistor.
Figure 43B:
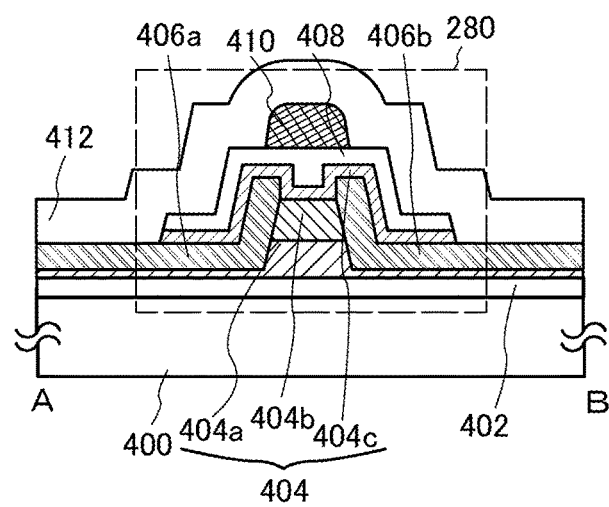
Figure 43C:
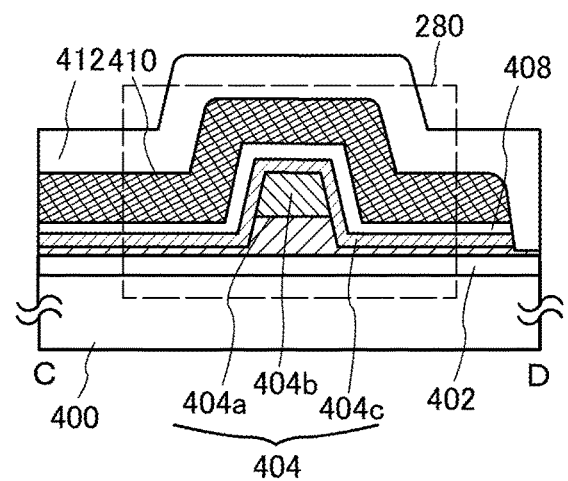

A transistor 280 illustrated in FIGS. 43A to 43C can be used. FIGS. 43A to 43C are a top view and cross-sectional views which illustrate the transistor 280. FIGS. 43A to 43C are a top view and cross-sectional views of the transistor 280. FIG. 43A is the top view. FIG. 43B is a cross-sectional view taken along the dashed-dotted line A-B in FIG. 43A. FIG. 43C is a cross-sectional view taken along the dashed-dotted line C-D in FIG. 43A. Note that for simplification of the drawing, some components in the top view in FIG. 43A are not illustrated.

In etching to form the first oxide semiconductor film 404a and the second oxide semiconductor film 404b of the transistor 280, the first oxide semiconductor film is not entirely etched to have a projected shape.

Note that the conductive film 401 may be provided in FIGS. 43A to 43C as in FIGS. 41A to 41C.

The structure in which the second oxide semiconductor film is sandwiched between the first oxide semiconductor film and the third oxide semiconductor film is described in this embodiment. Note that one embodiment is not limited to this, a structure in which any one or two of the films is/are not provided. Another oxide semiconductor film may be additionally provided. For example, a structure may be used in which the first oxide semiconductor film and the third oxide semiconductor film are not provided and only the second oxide semiconductor film is electrically surrounded by the gate electrode. Alternatively, a structure in which only the first oxide semiconductor film and the second oxide semiconductor film are electrically surrounded by the gate electrode or a structure in which only the second oxide semiconductor film and the third oxide semiconductor film are electrically surrounded by the gate electrode may be used.

The electrode and the oxide semiconductor film may have angular end portions. In order to obtain the angular end portions, when a film is processed using a resist mask or a hard mask, the etching rate of the film is greatly different from that of the resist mask or the hard mask. A specific structure example is described below.

Figure 44A:
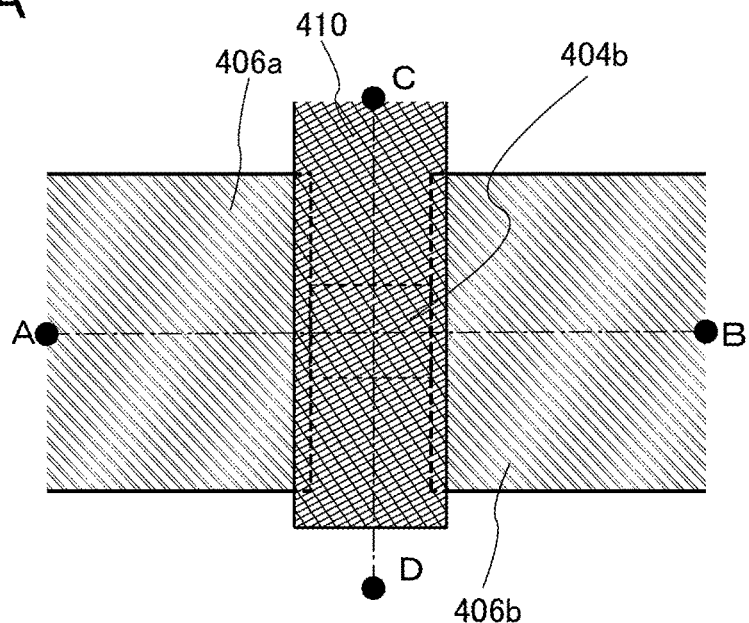
FIGS. 44A to 44C are a top view and cross-sectional views of a transistor.
Figure 44B:
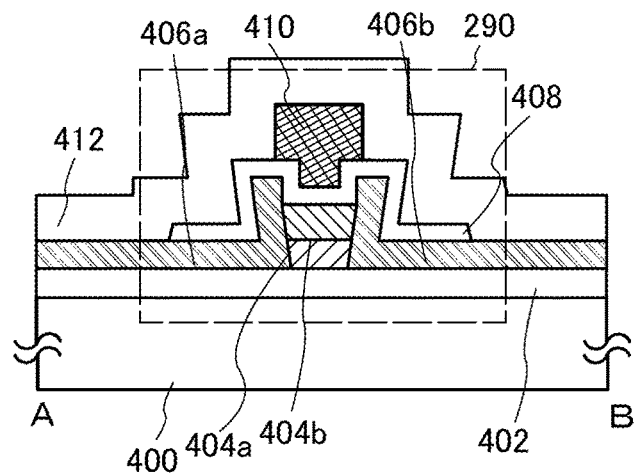
Figure 44C:
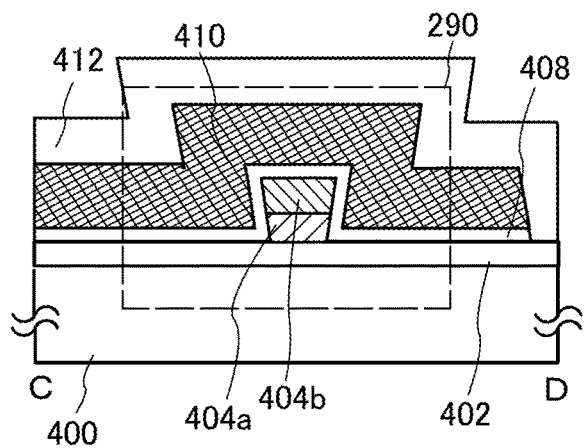

A transistor 290 illustrated in FIGS. 44A to 44C can be used. FIGS. 44 to 44C are a top view and cross-sectional views of the transistor 290. FIG. 44B illustrates a cross section taken along the dashed-dotted line A-B in FIG. 44A. FIG. 44C illustrates a cross section taken along the dashed-dotted line C-D in FIG. 44A. Note that for simplification of the drawing, some components are not illustrated in the top view of FIG. 44A.

In the transistor 290, only the first oxide semiconductor film 404a and the second oxide semiconductor film 404b are electrically surrounded by a gate electrode. The first and second oxide semiconductor films 404a and 404b may have what is called a reverse tapered shape in which the distance between the ends becomes longer from the bottom surface toward the upper surface (here, the upper surface on the gate insulating film 408 side).

Note that the conductive film 401 may be provided in FIGS. 44A to 44C as in FIGS. 41A to 41C.

Figure 45A:
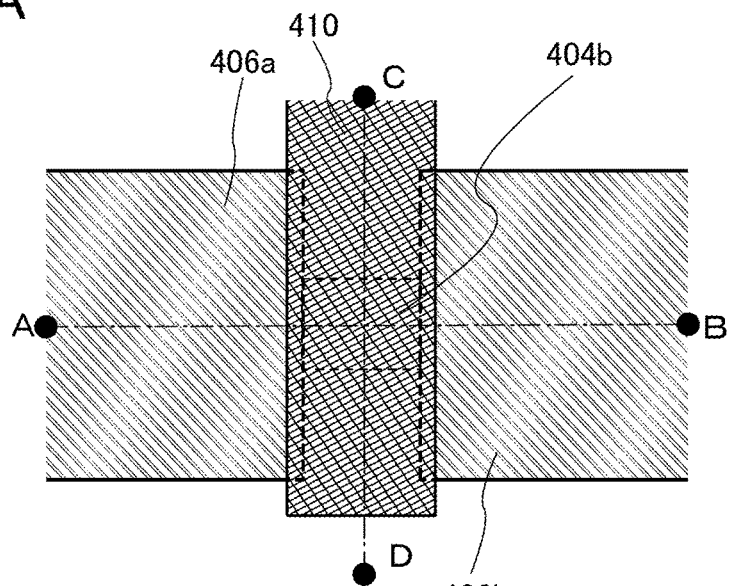
FIGS. 45A to 45C are a top view and cross-sectional views of a transistor.
Figure 45B:
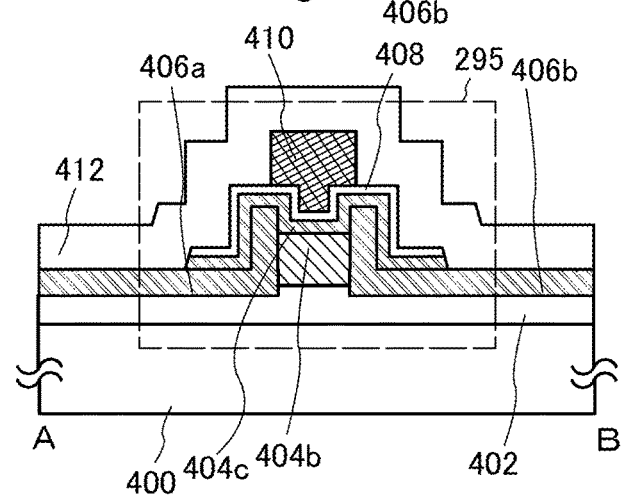
Figure 45C:
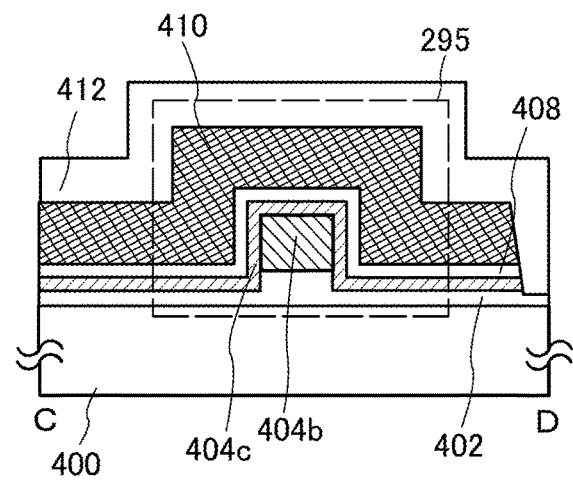
Figure 46A:
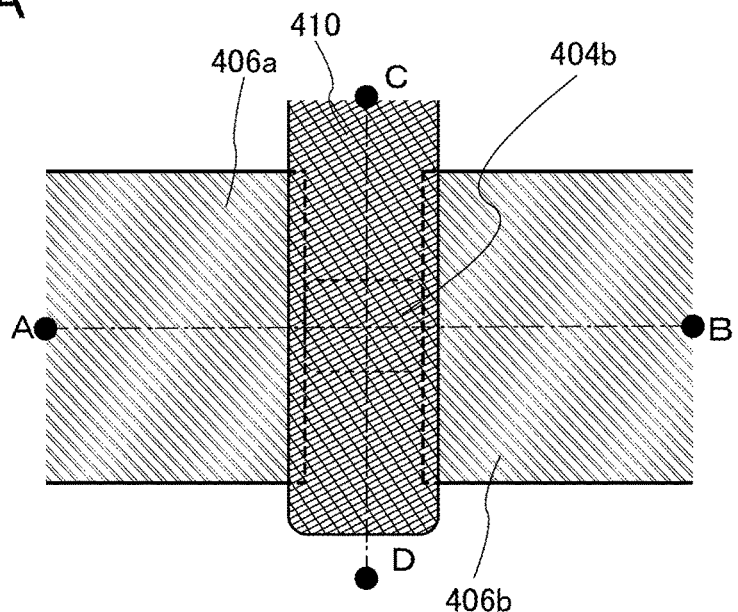
FIGS. 46A to 46C are a top view and cross-sectional views of a transistor.
Figure 46B:
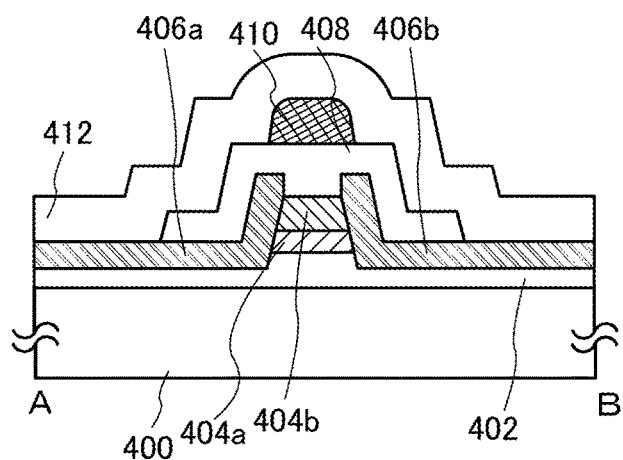
Figure 46C:
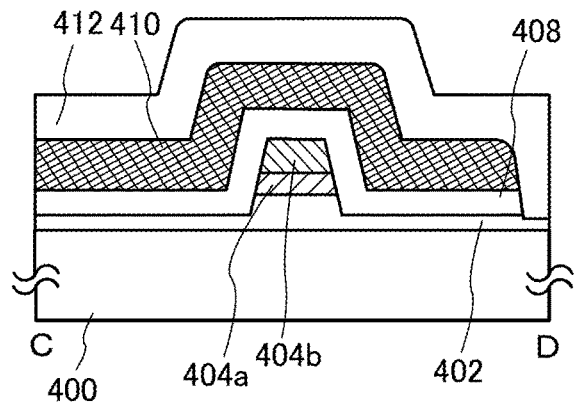
Figure 47A:
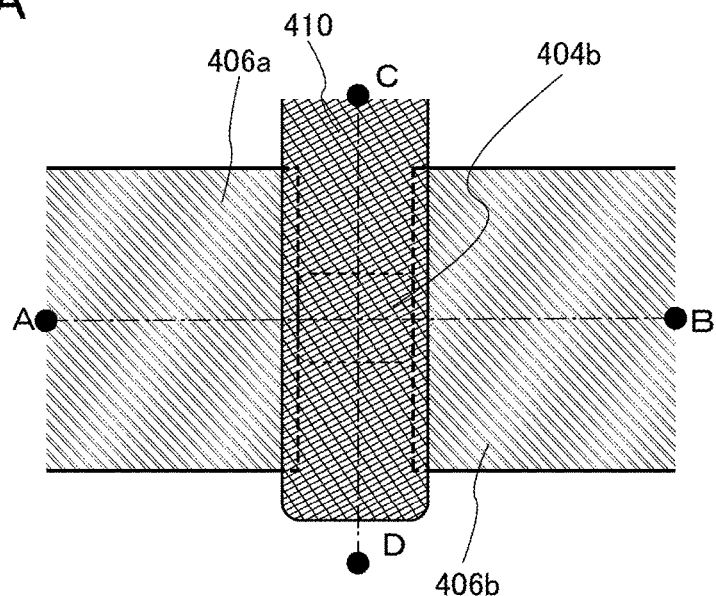
FIGS. 47A to 47C are a top view and cross-sectional views of a transistor.
Figure 47B:
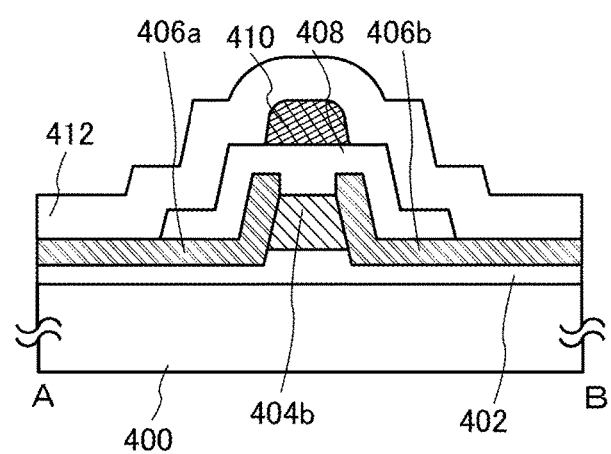
Figure 47C:
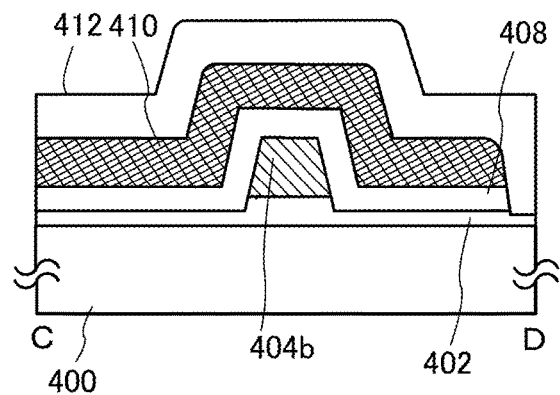
Figure 48A:
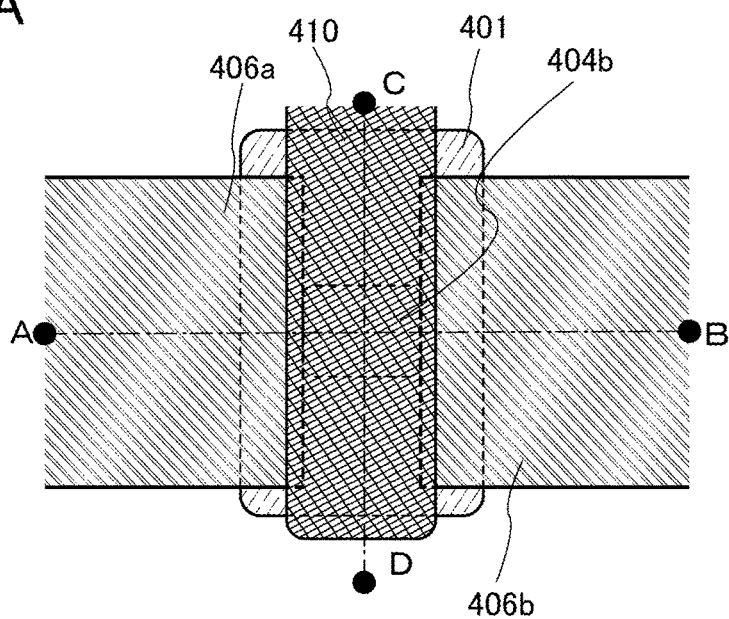
FIGS. 48A to 48C are a top view and cross-sectional views of a transistor.
Figure 48B:
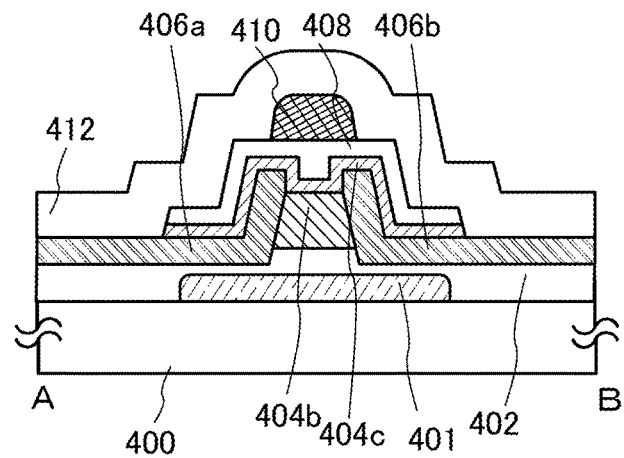
Figure 48C:
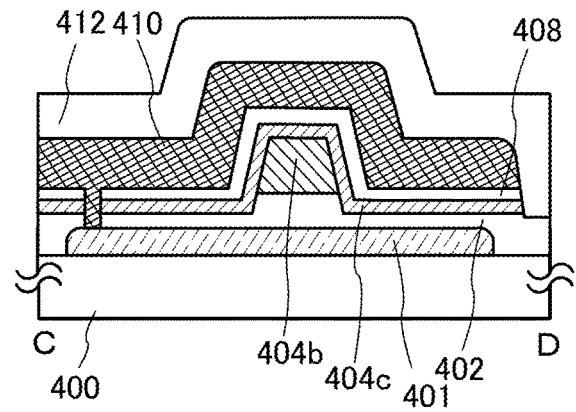
Figure 49A:
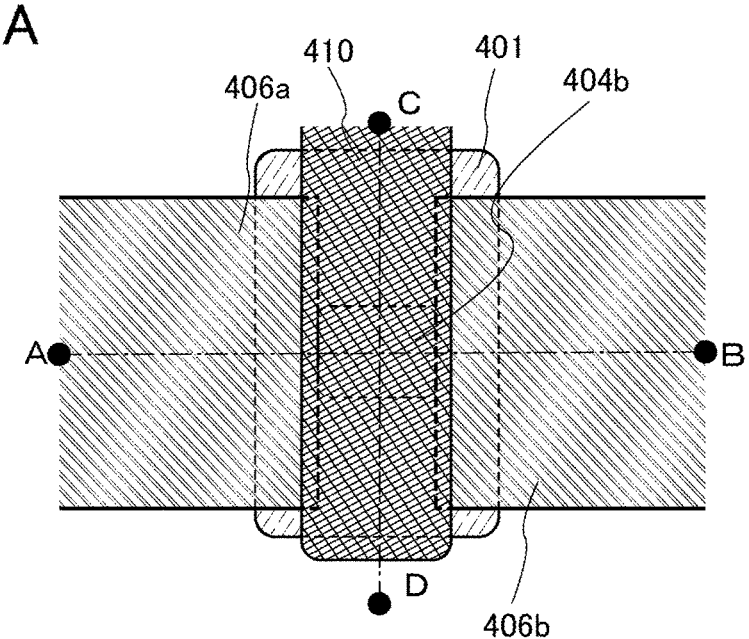
FIGS. 49A to 49C are a top view and cross-sectional views of a transistor.
Figure 49B:
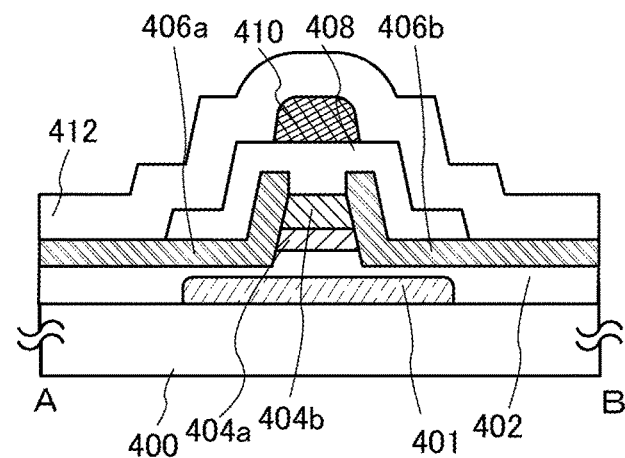
Figure 49C:
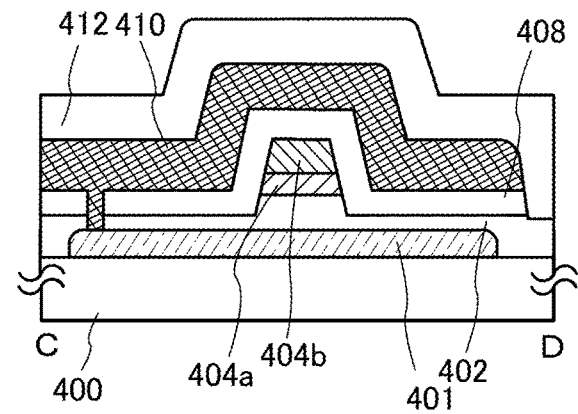
Figure 50A:
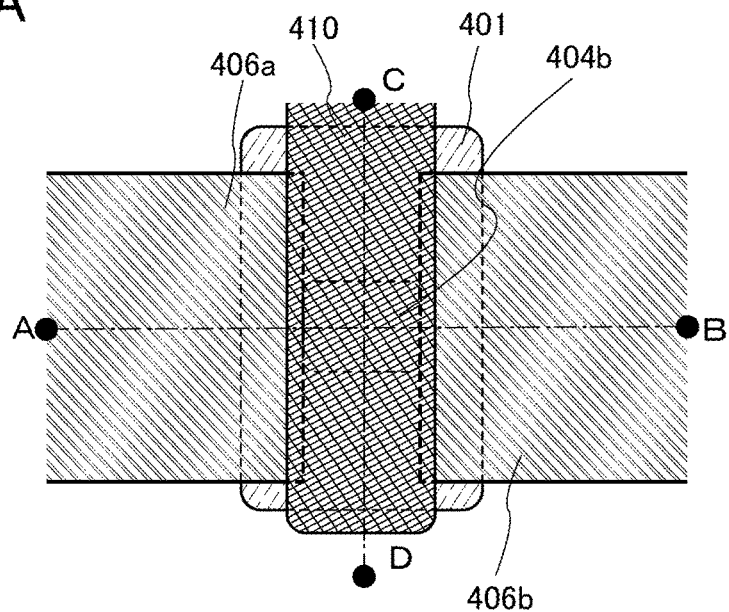
FIGS. 50A to 50C are a top view and cross-sectional views of a transistor.
Figure 50B:
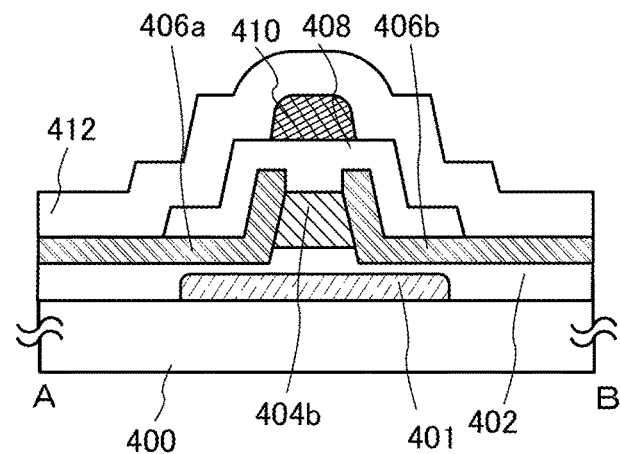
Figure 50C:
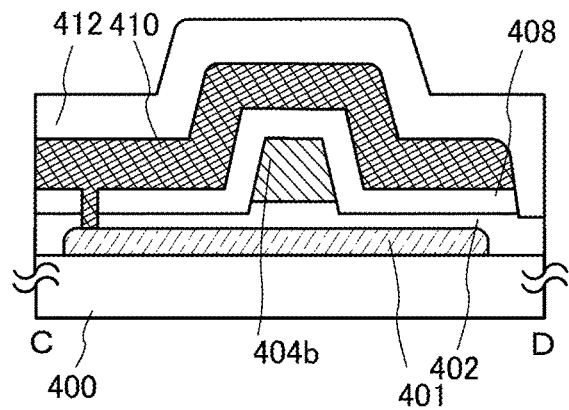

A transistor 295 illustrated in FIGS. 45A to 45C can be used. FIGS. 45A to 45C are a top view and cross-sectional views which illustrate the transistor 295. FIG. 45B illustrates a cross section taken along the dashed-dotted line A-B in FIG. 45A. FIG. 45C illustrates a cross section taken along the dashed-dotted line C-D in FIG. 45A. Note that for simplification of the drawing, some components in the top view in FIG. 45A are not illustrated.

In the transistor 295, only the second oxide semiconductor film 404b and the third oxide semiconductor film 404c are electrically surrounded by the gate electrode.

Note that the conductive film 401 may be provided in FIGS. 45A to 45C as in FIGS. 41A to 41C.

Alternatively, transistors illustrated in FIGS. 46A to 46C and FIGS. 47A to 47C can be used.

Not only the transistors shown in FIGS. 40A to 40C, FIGS. 42A to 42C, and FIGS. 43A to 43C, but also transistors shown in other drawings can have first to third oxide semiconductor films as FIGS. 45A to 45C, FIGS. 46A to 46C, and FIGS. 47A to 47C. For example, FIGS. 48A to 48C, FIGS. 49A to 49C, and FIGS. 50A to 50C are modification examples of FIGS. 41A to 41C.

This embodiment can be combined with any of the other embodiments in this specification as appropriate.

Embodiment 10

In this embodiment, a method for forming the transistor 250, which is described in Embodiment 9 with reference to FIGS. 40A to 40C, is described with reference to FIGS. 51A to 51C, FIGS. 52A to 52C, and FIGS. 53A to 53C.

Figure 51A:
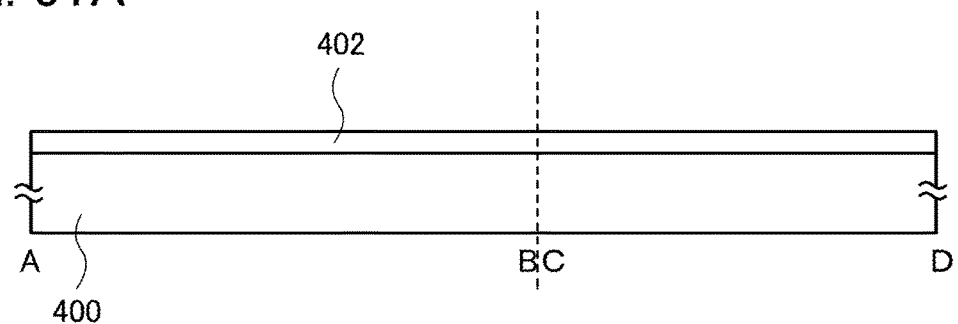
FIGS. 51A to 51C illustrate a manufacturing method of a transistor.

First, a base insulating film 402 is formed over a substrate 400 (see FIG. 51A). The above embodiments can be referred to for materials and formation methods of the substrate 400 and the base insulating film 402.

Figure 51B:
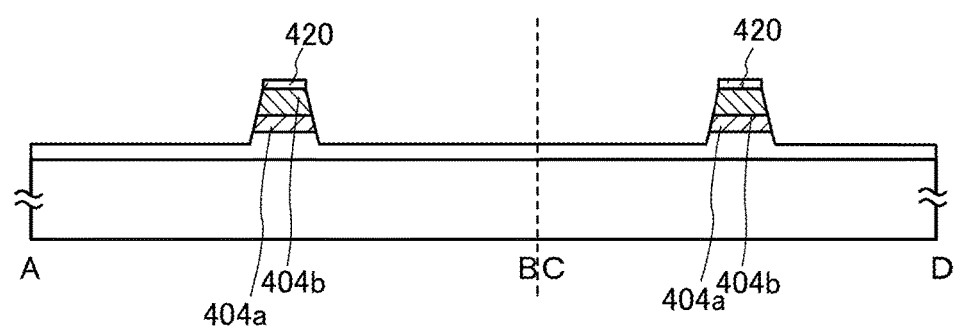

Next, the first oxide semiconductor film 404a and the second oxide semiconductor film 404b are formed over the base insulating film 402 by a sputtering method, a CVD method, an MBE method, an ALD method, or a PLD method, whereby a sacrificial layer 420 is formed over the second oxide semiconductor film 404b (see FIG. 51B).

For processing the first oxide semiconductor film 404a, the second oxide semiconductor film 404b, and the sacrificial layer 420 into island shapes, first, a film to be a hard mask (e.g., a tungsten film) and a resist mask are provided over the sacrificial layer 420, and the film to be a hard mask is etched to form a hard mask. The resist mask is removed, and then, the first oxide semiconductor film 404a, the second oxide semiconductor film 404b, and the sacrificial layer 420 are etched using the hard mask as a mask. And then, the hard mask is removed.

Figure 51C:
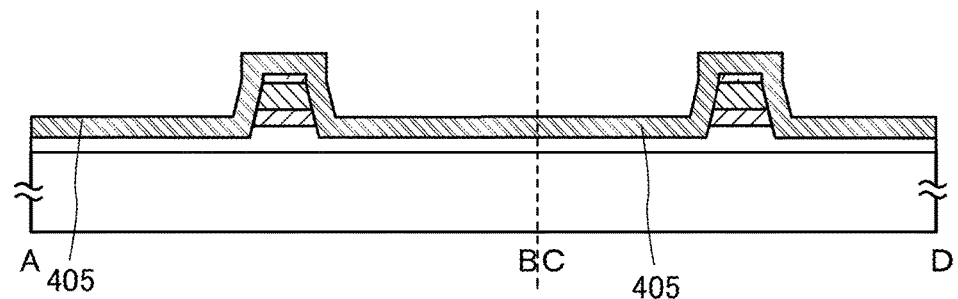

Next, the conductive film 405 to be the source and drain electrodes 406a and 406b is formed over the sacrificial layer 420 (see FIG. 51C). The above embodiments can be referred to for materials and formation methods of the conductive film 405.

Then, the sacrificial layer 420 is removed by lift-off process. Consequently, the conductive film 405 over the sacrificial layer 420 is also removed and a second conductive film 406 is formed in a desired region (see FIG. 52A).

Figure 52A:
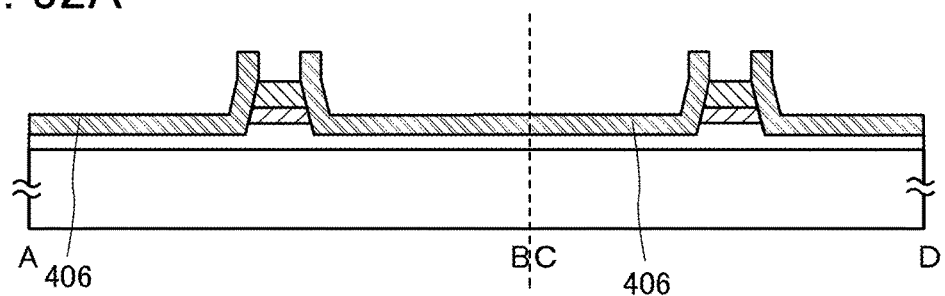
FIGS. 52A to 52C illustrate a method for manufacturing a transistor.
Figure 52B:
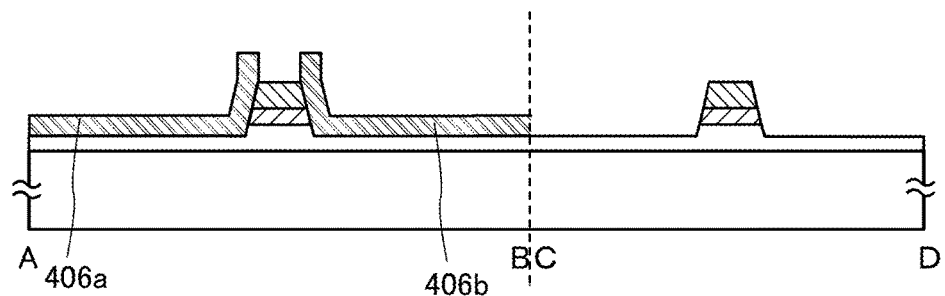

Then, the second conductive film 406 is divided by etching to form the source electrode 406a and the drain electrode 406b (see FIG. 52B). Note that in the cross section of the base insulating film 402, the base insulating film 402 in the C-D direction may be lower than that in the A-B direction.

Figure 52C:
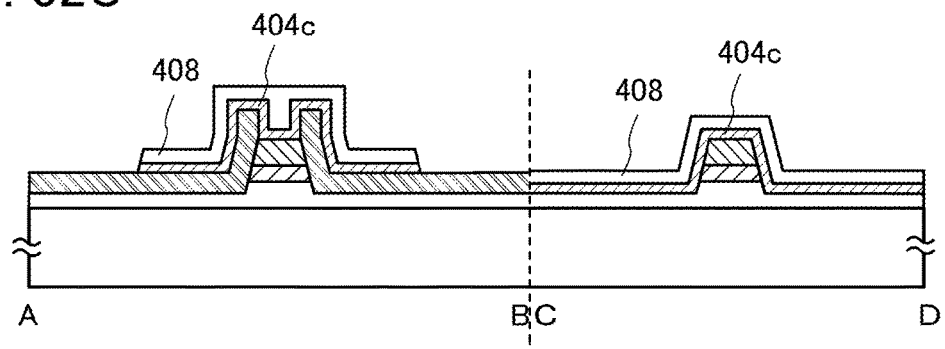

Next, the third oxide semiconductor film 404c is formed over the second oxide semiconductor film 404b, the source electrode 406a, and the drain electrode 406b, and the insulating film 407 which is to be the gate insulating film 408 is formed over the third oxide semiconductor film 403c (see FIG. 52C).

Figure 53A:
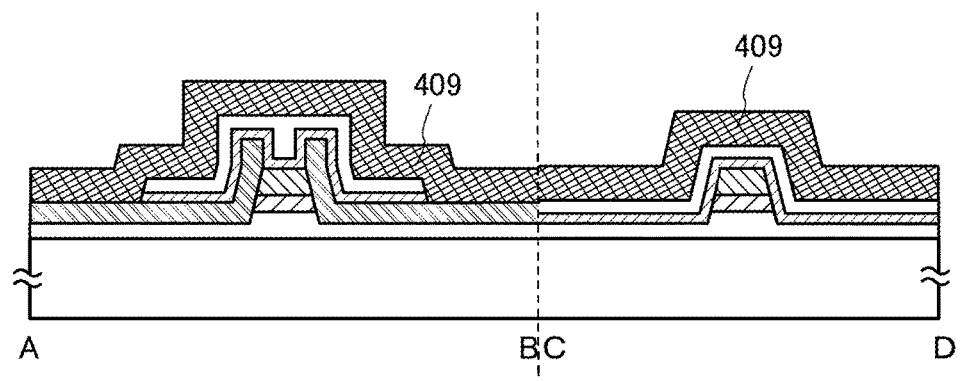
FIGS. 53A to 53C illustrate a method for manufacturing a transistor.

Then, the conductive film 409 to be the gate electrode 410 is formed over the source and drain electrodes 406a and 406b, the third oxide semiconductor film 404c, and the gate insulating film 408 (see FIG. 53A).

Figure 53B:
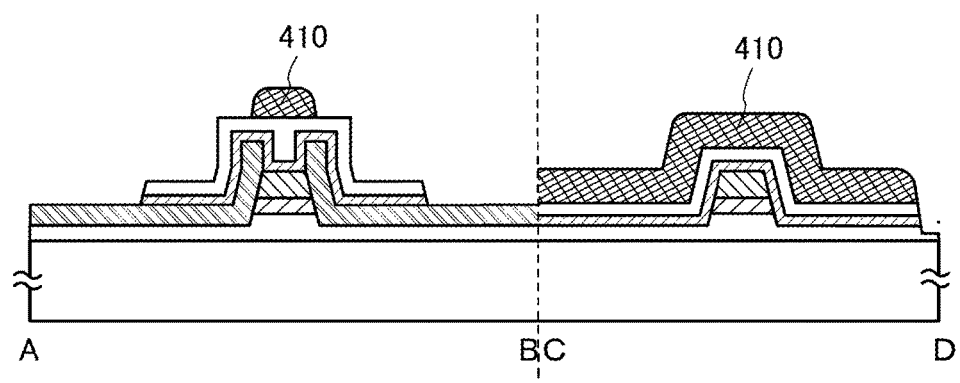

After that, the conductive film 409 is selectively etched using a resist mask to form the gate electrode 410, whereby the gate electrode 410 is formed (see FIG. 53B).

Figure 53C:
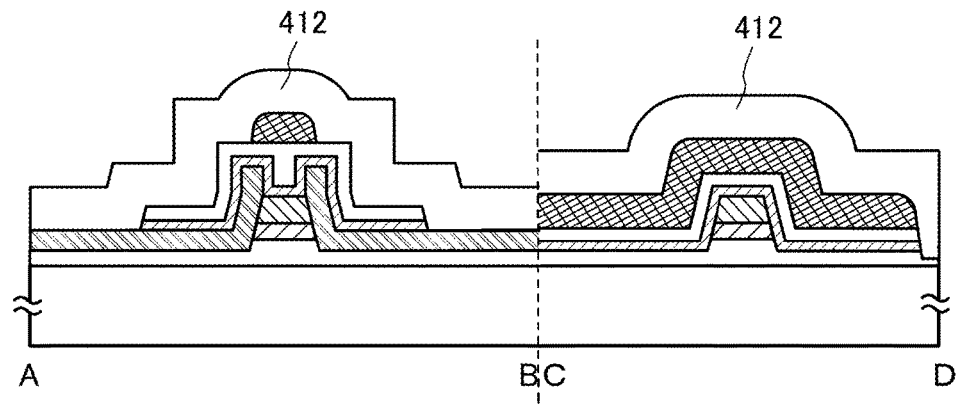

The oxide insulating film 412 are formed over the source and drain electrodes 406a and 406b, the third oxide semiconductor film 404c, the gate insulating film 408, and the gate electrode 410 (see FIG. 53C).

Through the above process, the transistor 250 illustrated in FIGS. 40A to 40C can be manufactured.

This embodiment can be combined with any of the other embodiments in this specification as appropriate.

Embodiment 11

In this embodiment, a transistor having a structure different from those of the transistors described in the above embodiments is described.

Figure 54A:
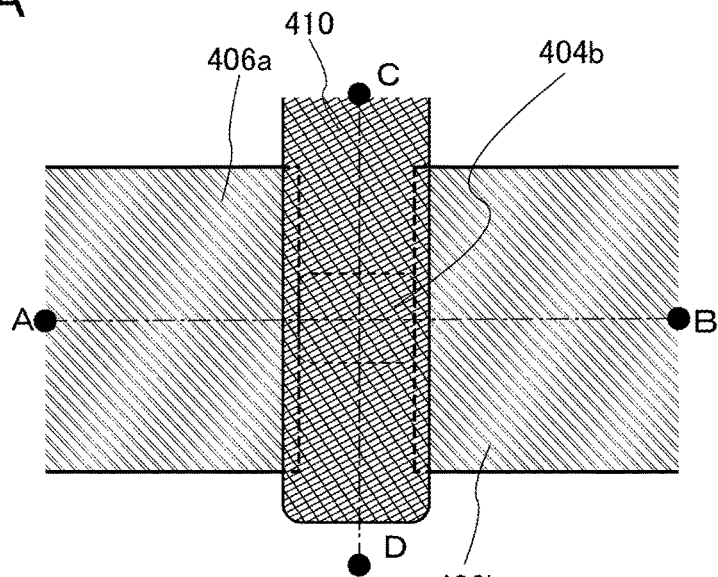
FIGS. 54A to 54C are a top view and cross-sectional views of a transistor.
Figure 54B:
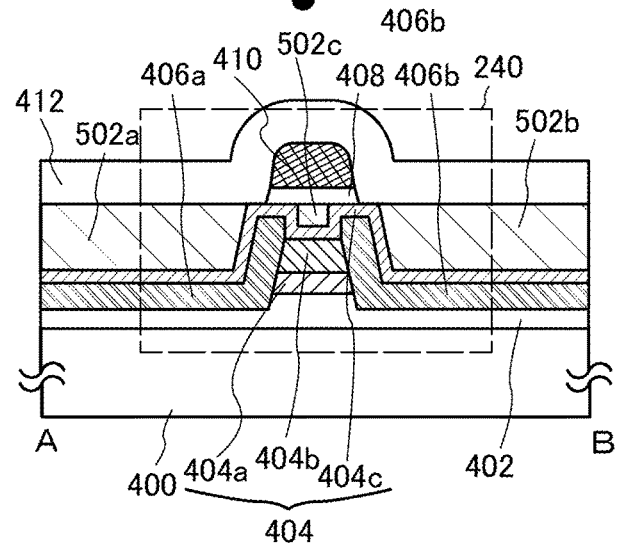
Figure 54C:
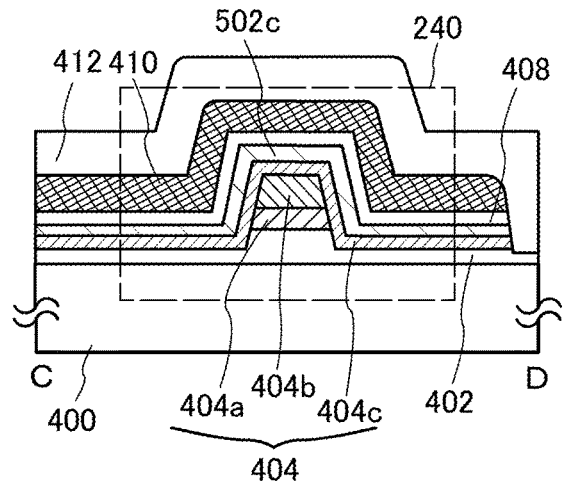

FIGS. 54A, 54B, and 54C are a top view and cross-sectional views of a transistor of one embodiment of the present invention. FIG. 54A is the top view. FIG. 54B is a cross-sectional view taken along the dashed-dotted line A-B in FIG. 54A. FIG. 54C is a cross-sectional view taken along the dashed-dotted line C-D in FIG. 54A. Note that for simplification of the drawing, some components in the top view in FIG. 54A are not illustrated. The direction of the dashed-dotted line A-B and the direction of the dashed-dotted line C-D can be referred to as a channel length direction and a channel width direction, respectively.

A transistor 240 illustrated in FIGS. 54A to 54C includes the base insulating film 402 having a depressed portion and a projected portion over the substrate 400; the first oxide semiconductor film 404a and the second oxide semiconductor film 404b over the projected portion of the base insulating layer 402; the source electrode 406a and the drain electrode 406b in contact with the side surfaces of the first oxide semiconductor film 404a and the second oxide semiconductor film 404b; the third oxide semiconductor film 404c in contact with the bottom surface of the depressed portion of the base insulating film 402, the side surface of the projected portion (or depressed portion) of the base insulating film 402, the side surface of the first oxide semiconductor film 404a, the side surface of the second oxide semiconductor film 404b, the top surface of the second oxide semiconductor film 404b, the source electrode 406a, and the drain electrode 406b; the insulating films 502a, 502b, and 502c over the third oxide semiconductor film 404c; the gate insulating film 408 over the third oxide semiconductor film 404c and the insulating film 502c; the gate electrode 410 which is over and in contact with the gate insulating film 408 and faces the top and side surfaces of the second oxide semiconductor film 404b; and the oxide insulating film 412 over the source electrode 406a, the drain electrode 406b, the third oxide semiconductor film 404c, the gate insulating film 408, and the gate electrode 410. The upper surface of the second oxide semiconductor film 404b is lower than the upper surface of the source and drain electrodes 406a and 406b. The first oxide semiconductor film 404a, the second oxide semiconductor film 404b, and the third oxide semiconductor film 404c are collectively referred to as a multilayer film 404.

The source and drain electrodes 406a and 406b of the transistor 240 in FIGS. 54A to 54C can be formed by performing lift-off process on a conductive film which is to be the source and drain electrodes 406a and 406b.

Note that the conductive film 401 may be provided in FIGS. 54A to 54C as in FIGS. 41A to 41C.

Figure 55A:
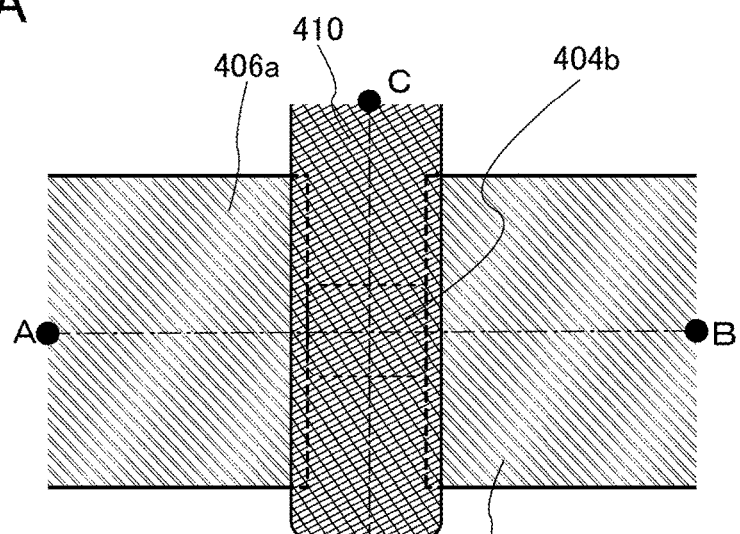
FIGS. 55A to 55C are a top view and cross-sectional views of a transistor.
Figure 55B:
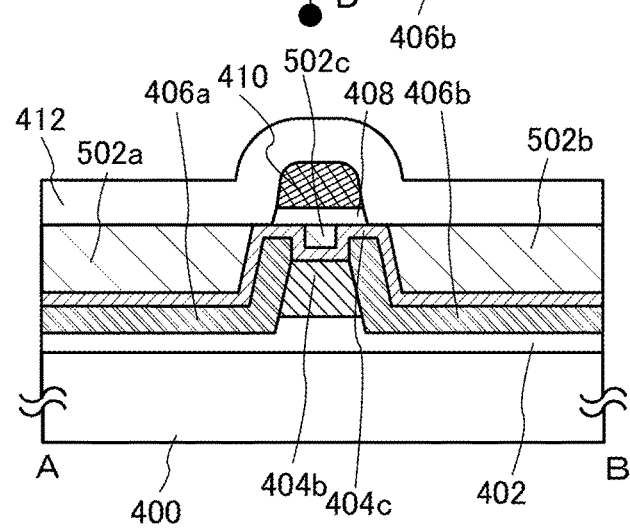
Figure 55C:
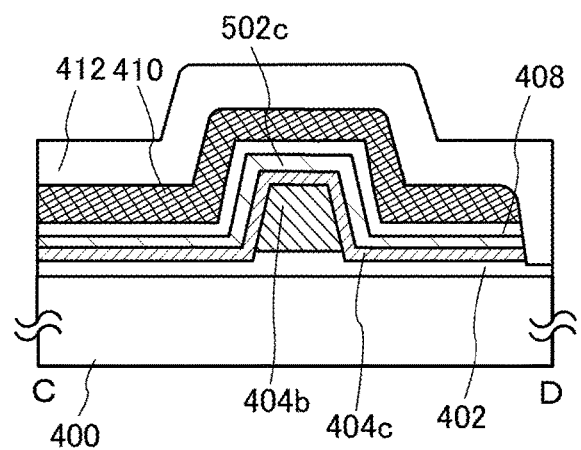

Although this embodiment includes the first to third oxide semiconductor films, one embodiment is not limited to this. A structure in which any one or two of the films is/are not provided. Another oxide semiconductor film may be additionally provided. FIGS. 55A to 55C show the example.

This embodiment can be combined with any of the other embodiments in this specification as appropriate.

Embodiment 12

In this embodiment, a method for manufacturing the transistor 240 described in Embodiment 11 with reference to FIGS. 54A to 54C will be described with reference to FIGS. 56A to 56C and FIGS. 57A to 57C.

First, the base insulating film 402 is formed over the substrate 400. Then, the first oxide semiconductor film 404a, the second oxide semiconductor film 404b, and the sacrificial layer 420 are formed over the base insulating film 402. Next, the conductive film 405 to be the source electrode 406a and the drain electrode 406b is formed over the sacrificial layer 420. Then, the sacrificial layer 420 is removed by lift-off process. Consequently, the conductive film 405 over the sacrificial layer 420 is also removed and the conductive film 406 is formed in a desired region. Then, the conductive film 406 is divided by etching to form the source electrode 406a and the drain electrode 406b (see FIG. 56A). The above embodiments can be referred to for the materials and formation methods of the substrate 400, the base insulating film 402, the first and second oxide semiconductor films 404a and 404b, the sacrificial layer 420, and the source and drain electrodes 406a and 406b.

Figure 56A:
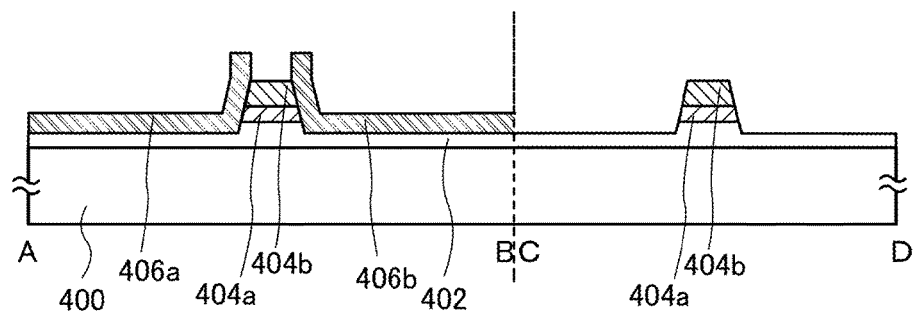
FIGS. 56A to 56C illustrate a method for manufacturing a transistor.
Figure 56B:
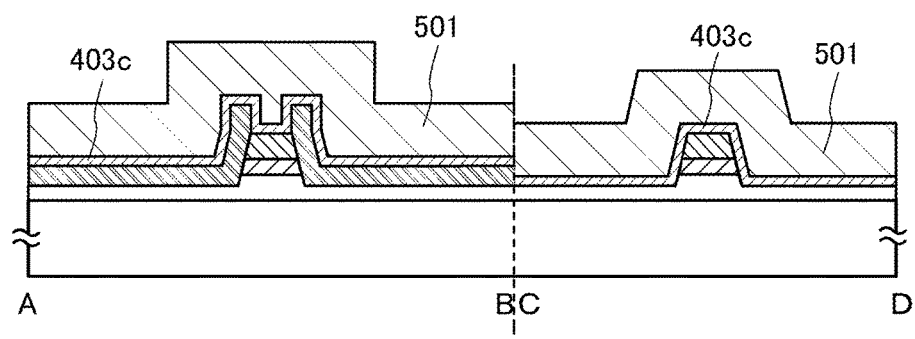

Next, the third oxide semiconductor film 403c and an insulating film 501 are formed over the second oxide semiconductor film 404b and the source and drain electrodes 406a and 406b (see FIG. 56B). The third oxide semiconductor film 404c in the above embodiment can be referred to for the materials and formation methods of the third oxide semiconductor film 403c. The base insulating film 402 in the above embodiment can be referred to for the materials and formation methods of the insulating film 501.

Figure 56C:
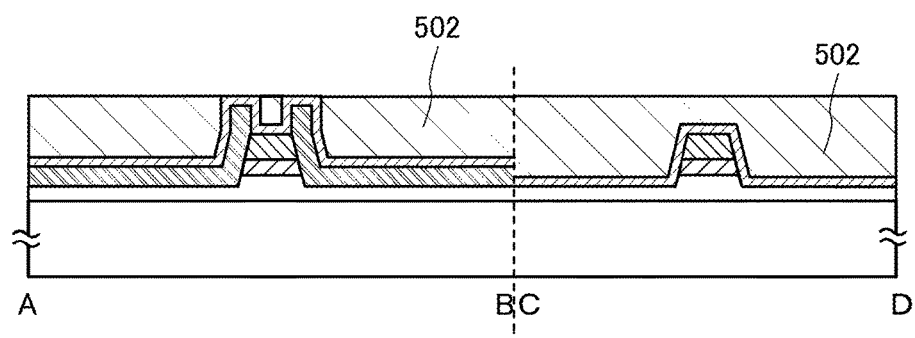

Then, removing (polishing) treatment is performed on the insulating film 501 to remove part of the insulating film 501 and expose the third oxide semiconductor film 403c, whereby the insulating film 502 is formed (see FIG. 56C).

For the removing treatment, chemical mechanical polishing (CMP) treatment can be preferably used. Another removing treatment may be used. Alternatively, the polishing treatment such as the CMP treatment may be combined with etching (dry etching or wet etching) treatment or plasma treatment. For example, after the CMP treatment, dry etching treatment or plasma treatment (e.g., reverse sputtering) may be performed in order to improve the flatness of a surface to be processed. In the case where in the removing treatment, the etching treatment, the plasma treatment, or the like is combined with the CMP treatment, the order of steps may be, without any particular limitation, set as appropriate depending on the material, thicknesses, and surface roughness. Alternatively, a large part of the insulating film 501 may be removed by CMP treatment and other part of the insulating film 501 may be removed by dry etching treatment.

Note that the CMP treatment may be performed only once or plural times. When the CMP treatment is performed plural times, first polishing is preferably performed with a high polishing rate followed by final polishing with a low polishing rate. By performing polishing at different polishing rates in this manner, the planarity of the surface of the insulating film 501 can be further improved.

Figure 57A:
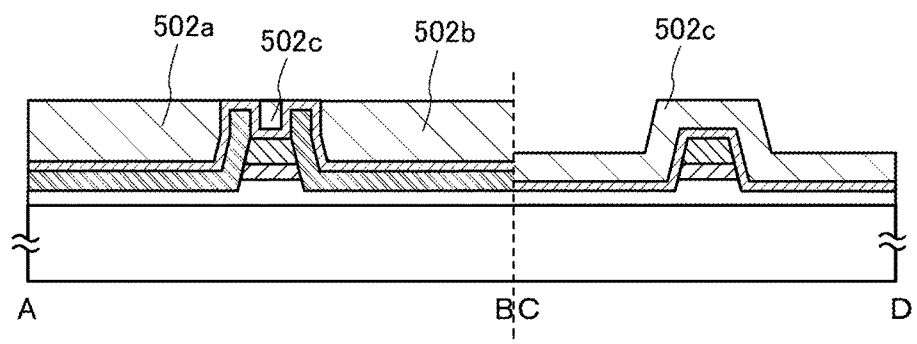
FIGS. 57A to 57C illustrate a method for manufacturing a transistor.

Next, the insulating film 502 is divided by etching to form the insulating films 502a to 502c (see FIG. 57A).

Figure 57B:
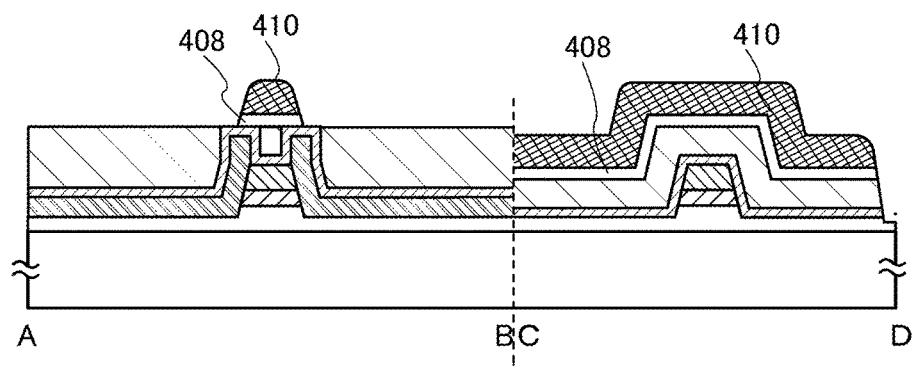

Next, the gate insulating film 408 and the gate electrode 410 are formed over the third oxide semiconductor film 404c and the insulating films 502c (see FIG. 57B). The above embodiments can be referred to for materials and formation methods of the gate insulating film 408 and the gate electrode 410.

Figure 57C:
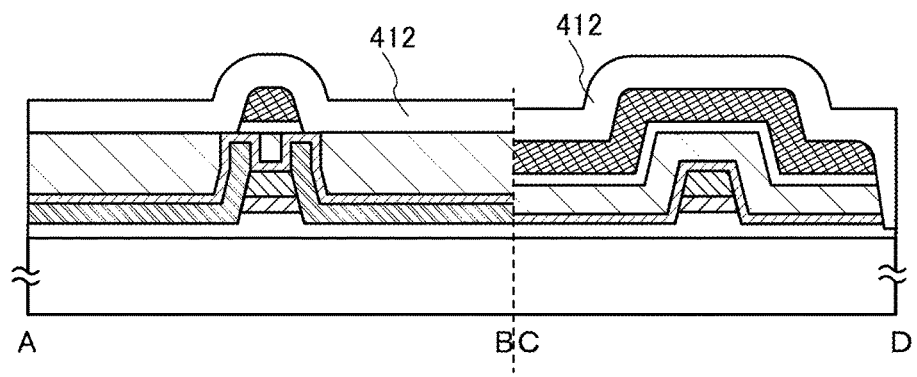

Lastly, the oxide insulating film 412 is formed over the third oxide semiconductor film 404c, the insulating films 502a and 502b, the gate insulating film 408, and the gate electrode 410 (see FIG. 57C). The above embodiments can be referred to for materials and formation methods of the oxide insulating film 412.

Through the above process, the transistor 240 illustrated in FIGS. 54A to 54C can be manufactured.

This embodiment can be combined with any of the other embodiments in this specification as appropriate.

Embodiment 13

In this embodiment, an example of a circuit including the transistor of one embodiment of the present invention is described with reference to the drawings.

Figure 61A:
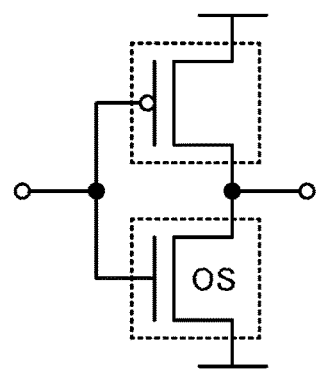
FIGS. 61A to 61D each illustrate an inverter including a semiconductor device of an embodiment of the present invention.
Figure 61B:
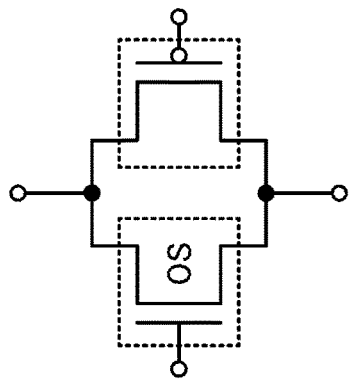
Figure 61C:
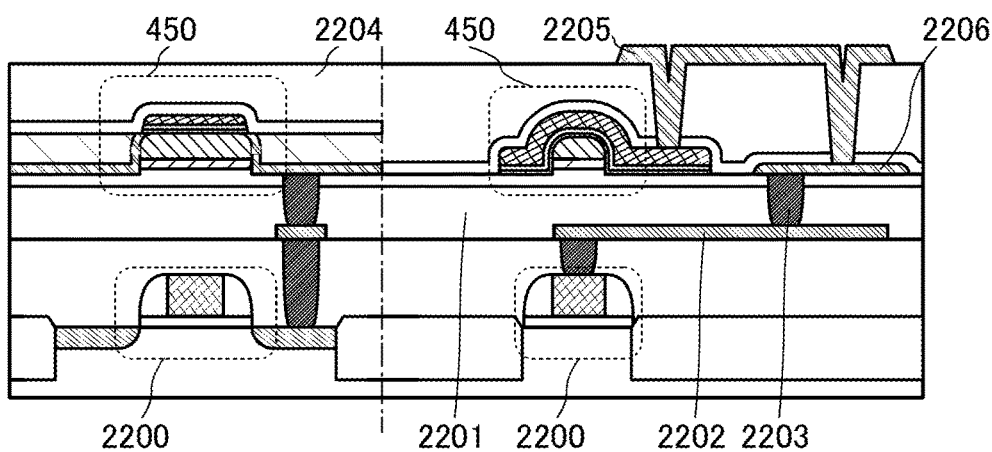
Figure 61D:
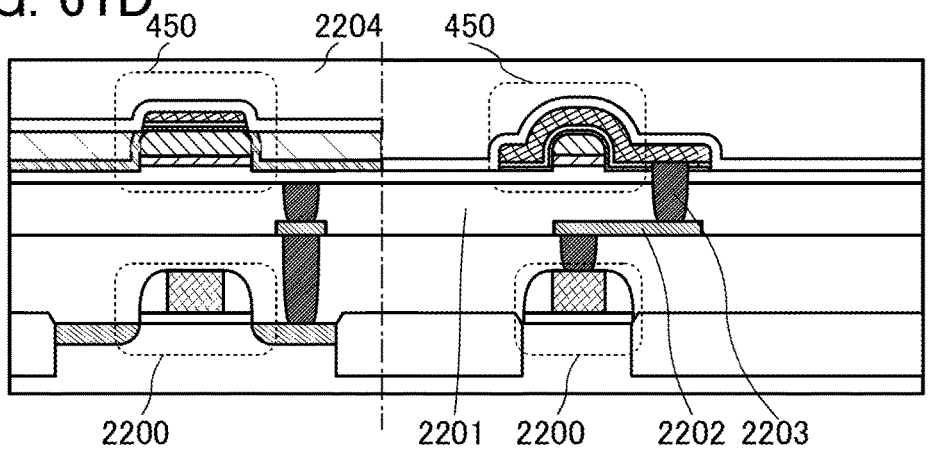

FIGS. 61A and 61B are each a circuit diagram of a semiconductor device and FIGS. 61C and 61D are each a cross-sectional view of a semiconductor device. FIGS. 61C and 61D each illustrate a cross-sectional view of the transistor 450 in a channel length direction on the left and a cross-sectional view of the transistor 450 in a channel width direction on the right. In the circuit diagram, "OS" is written beside a transistor in order to clearly demonstrate that the transistor includes an oxide semiconductor.

The semiconductor devices illustrated in FIGS. 61C and 61D each include a transistor 2200 containing a first semiconductor material in a lower portion and a transistor containing a second semiconductor material in an upper portion. Here, an example is described in which the transistor 450 described in Embodiment 1 as an example is used as the transistor containing the second semiconductor material.

Here, the first semiconductor material and the second semiconductor material are preferably materials having different band gaps. For example, a semiconductor material other than an oxide semiconductor (e.g., silicon, germanium, silicon germanium, silicon carbide, or gallium arsenide) can be used as the first semiconductor material, and the oxide semiconductor described in Embodiment 1 can be used as the second semiconductor material. A transistor using a material other than an oxide semiconductor, such as single crystal silicon, can operate at high speed easily. In contrast, a transistor including an oxide semiconductor has the low off-state current.

Although the transistor 2200 is a p-channel transistor here, it is needless to say that an n-channel transistor can be used to form a circuit having a different configuration. The specific structure of the semiconductor device, such as a material used for the semiconductor device and the structure of the semiconductor device, does not need to be limited to that described here except for the use of the transistor described in Embodiment 1, which is formed using an oxide semiconductor.

FIGS. 61A, 61C, and 61D each illustrate a configuration example of what is called a CMOS circuit, in which a p-channel transistor and an n-channel transistor are connected in series and gates of the transistors are connected.

The transistor using an oxide semiconductor of one embodiment of the present invention has high on-state current, which can achieve high-speed operation of a circuit.

In the structure illustrated in FIG. 61C, the transistor 450 is provided over the transistor 2200 with an insulating film 2201 positioned therebetween. Wirings 2202 are provided between the transistor 2200 and the transistor 450. Wirings and electrodes in the upper layer and the lower layer are electrically connected via plugs 2203 embedded in insulating films. An insulating film 2204 covering the transistor 450, a wiring 2205 over the insulating film 2204, and a wiring 2206 formed by processing the same conductive film as the pair of electrodes of the transistor are provided.

By stacking two transistors in the above manner, an area occupied by a circuit can be reduced; accordingly, a plurality of circuits can be arranged in high density.

In FIG. 61C, one of the source and the drain of the transistor 450 is electrically connected to one of a source and a drain of the transistor 2200 via the wiring 2202 and the plug 2203. The gate of the transistor 450 is electrically connected to a gate of the transistor 2200 via the wiring 2205, the wiring 2206, the plug 2203, the wiring 2202, and the like.

In the configuration illustrated in FIG. 61D, an opening portion in which the plug 2203 is embedded is provided in a gate insulating film of the transistor 450, and the gate of the transistor 450 is in contact with the plug 2203 through the opening portion. Such a configuration makes it possible to achieve the integration of the circuit easily and to reduce the lengths and the number of wirings and plugs used to be smaller than those in the configuration illustrated in FIG. 61C; thus, the circuit can operate at higher speed.

Note that when a connection between the electrodes of the transistor 450 and the transistor 2200 is changed from that in the configuration illustrated in FIG. 61C or FIG. 61D, a variety of circuits can be formed. For example, a circuit having a configuration in which a source and a drain of a transistor are connected to those of another transistor as illustrated in FIG. 61B can operate as what is called an analog switch.

A semiconductor device having an image sensor function for reading data of an object can be fabricated with the use of the transistor described in any of the above embodiments.

Figure 62:
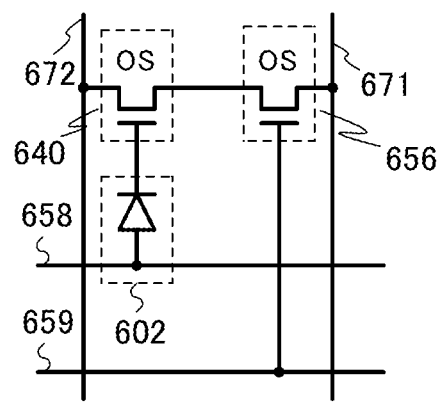
FIG. 62 is an equivalent circuit diagram illustrating an example of a semiconductor device.

FIG. 62 illustrates an example of an equivalent circuit of a semiconductor device having an image sensor function.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

As the photodiode 602, for example, a pin photodiode in which a semiconductor layer having p-type conductivity, a high-resistance semiconductor layer (semiconductor layer having i-type conductivity), and a semiconductor layer having n-type conductivity are stacked can be used.

With detection of light that enters the photodiode 602, data on an object to be detected can be read. Note that a light source such as a backlight can be used at the time of reading data of an object.

As each of the transistor 640 and the transistor 656, the transistor in which a channel is formed in an oxide semiconductor, which is described in any of the above embodiments, can be used. In FIG. 62, "OS" is written beside the transistor 640 and the transistor 656 so that the transistors 640 and 656 can be identified as transistors including an oxide semiconductor.

It is preferable that each of the transistor 640 and the transistor 656 be one of the transistors described in the above embodiments, in which the oxide semiconductor film is electrically covered with the gate electrode. When the oxide semiconductor film has round end portions and a curved surface in the transistor, coverage with a film formed over the oxide semiconductor film can be improved. In addition, electric field concentration which might occur at end portions of the source electrode and the drain electrode can be reduced, which can suppress deterioration of the transistor. Therefore, variation in the electrical characteristics of the transistor 640 and the transistor 656 is suppressed, and the transistor 640 and the transistor 656 are electrically stable. The semiconductor device having an image sensor function illustrated in FIG. 62 can have high reliability by including the transistor.

This embodiment can be combined with any of the other embodiments in this specification as appropriate.

Embodiment 14

In this embodiment, an example of a semiconductor device (memory device) which includes a transistor according to one embodiment of the present invention, which can hold stored data even when not powered, and which has an unlimited number of write cycles will be described with reference to drawings.

Figure 63:
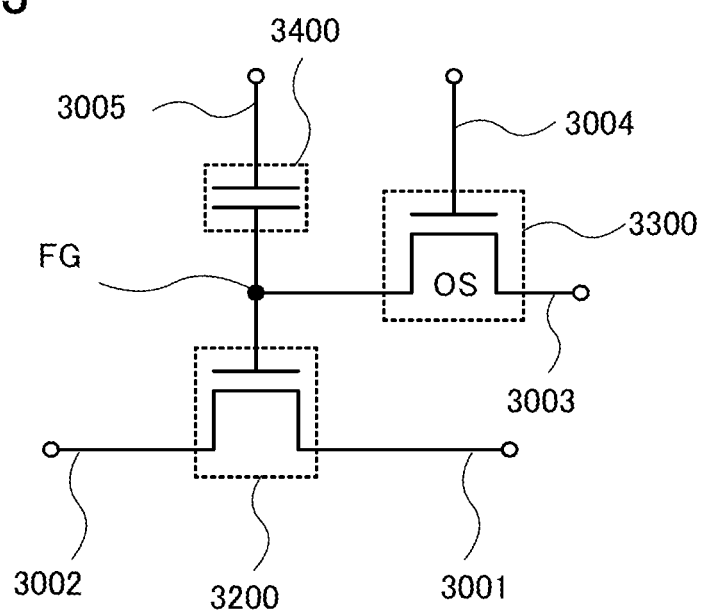
FIG. 63 is a circuit diagram of a semiconductor device of an embodiment.

FIG. 63 is a circuit diagram of the semiconductor device.

The semiconductor device illustrated in FIG. 63 includes a transistor 3200 including a first semiconductor material, a transistor 3300 including a second semiconductor material, and a capacitor 3400. As the transistor 3300, the transistor described in Embodiment 1 can be used.

The transistor 3300 is a transistor in which a channel is formed in a semiconductor layer including an oxide semiconductor. Since the off-state current of the transistor 3300 is low, stored data can be retained for a long period owing to such a transistor. In other words, power consumption can be sufficiently reduced because a semiconductor device in which refresh operation is unnecessary or the frequency of refresh operation is extremely low can be provided.

In FIG. 63A, a first wiring 3001 is electrically connected to a source electrode of the transistor 3200. A second wiring 3002 is electrically connected to a drain electrode of the transistor 3200. A third wiring 3003 is electrically connected to one of the source electrode and the drain electrode of the transistor 3300. A fourth wiring 3004 is electrically connected to the gate electrode of the transistor 3300. The gate electrode of the transistor 3200 and the other of the source electrode and the drain electrode of the transistor 3300 are electrically connected to the one electrode of the capacitor 3400. A fifth wiring 3005 is electrically connected to the other electrode of the capacitor 3400.

The semiconductor device in FIG. 63 utilizes a characteristic in which the potential of the gate electrode of the transistor 3200 can be held, and thus enables writing, storing, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely small, the charge of the gate electrode of the transistor 3200 is held for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge is given to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the data stored in the gate electrode layer can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

When a transistor having a channel formation region formed using an oxide semiconductor and having extremely small off-state current is applied to the semiconductor device in this embodiment, the semiconductor device can store data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Furthermore, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating film does not arise at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

As described above, a miniaturized and highly integrated semiconductor device having favorable electrical characteristics can be provided.

Embodiment 15

In this embodiment, a CPU in which the transistor described in any of the above embodiments can be used and the storage device described in the above embodiment is included is described.

Figure 64:
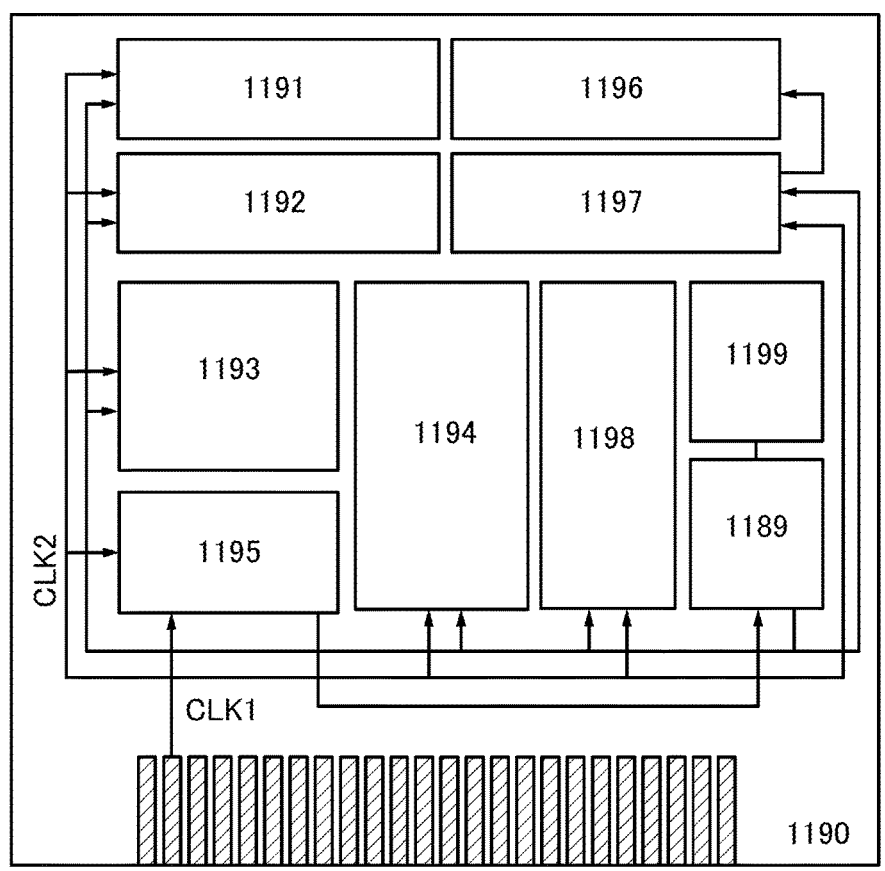
FIG. 64 is a block diagram of a semiconductor device of an embodiment.

FIG. 64 is a block diagram illustrating a configuration example of a CPU at least partly including the transistor described in Embodiment 1.

The CPU illustrated in FIG. 64A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The rewritable ROM 1199 and the ROM interface 1189 may be provided over a separate chip. Obviously, the CPU illustrated in FIG. 64A is only an example in which the structure is simplified, and an actual CPU may have various structures depending on the application. For example, the CPU may have the following configuration: a structure including the CPU illustrated in FIG. 64 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 64, a memory cell is provided in the register 1196. For the memory cell of the register 1196, any of the transistors described in the above embodiments can be used.

In the CPU illustrated in FIG. 64, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

Figure 65:
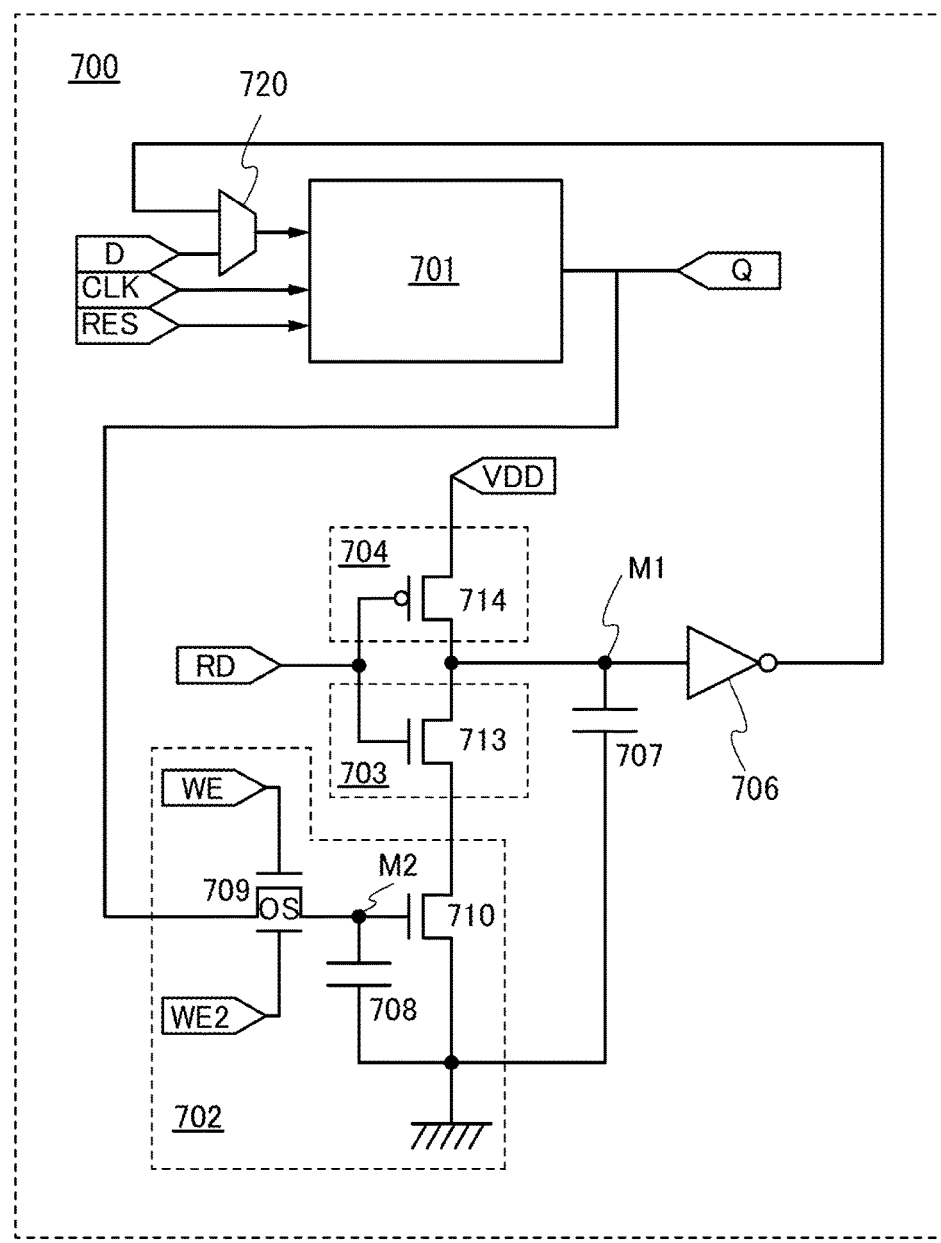
FIG. 65 is a circuit diagram of a memory device of an embodiment.

FIG. 65 is an example of a circuit diagram of a memory element that can be used as the register 1196. A memory element 700 includes a circuit 701 in which stored data is volatile when power supply is stopped, a circuit 702 in which stored data is nonvolatile when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 700 may further include another element such as a diode, a resistor, or an inductor, as needed.

Here, the memory device described in Embodiment 4 can be used as the circuit 702. When supply of the power supply voltage to the memory element 700 is stopped, a ground potential (0 V) or a potential at which the transistor 709 is turned off continues to be input to a gate of the transistor 709 in the circuit 702. For example, the gate of the transistor 709 is grounded through a load such as a resistor.

FIG. 65 illustrates an example in which the switch 703 is a transistor 713 having one conductivity type (e.g., an n-channel transistor) and the switch 704 is a transistor 714 having a conductivity type opposite to the one conductivity type (e.g., a p-channel transistor). Here, a first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a line which can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a line which can supply a power supply potential VDD is supplied. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the line which can supply a low power supply potential (e.g., a GND line). The other of the pair of electrodes of the capacitor 708 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 708 is electrically connected to the line which can supply a low power supply potential (e.g., a GND line).

The capacitor 707 and the capacitor 708 are not necessarily provided as long as the parasitic capacitance of the transistor, the wiring, or the like is actively utilized.

A control signal WE is input to the first gate (first gate electrode) of the transistor 709. As for each of the switch 703 and the switch 704, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 701 is input to the other of the source and the drain of the transistor 709. FIG. 65 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 65, a signal output from the second terminal of the switch 703 (the other of the source and the drain of the transistor 713) is input to the circuit 701 through the logic element 706 and the circuit 720; however, this embodiment is not limited thereto. The signal output from the second terminal of the switch 703 (the other of the source and the drain of the transistor 713) may be input to the circuit 701 without its logic value being inverted. For example, in the case where a node in which a signal obtained by inversion of the logic value of a signal input from the input terminal is held is provided in the circuit 701, the signal output from the second terminal of the switch 703 (the other of the source and the drain of the transistor 713) can be input to the node.

As the transistor 709 in FIG. 65, any of the transistors described in Embodiment 1 can be used. The transistor 709 preferably includes a second gate (second gate electrode). The control signal WE can be input to the first gate and the control signal WE2 can be input to the second gate. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and Icut of the transistor 709 (a drain current when a gate voltage of the transistor is 0 V) can be further reduced. Note that as the transistor 709, the transistor without the second gate can be used.

Further, in FIG. 65, the transistors included in the memory element 700 except for the transistor 709 can each be a transistor in which a channel is formed in a layer formed using a semiconductor other than an oxide semiconductor or in the substrate 1190. For example, the transistor can be a transistor in which a channel is formed in a silicon layer or a silicon substrate. Alternatively, a transistor in which a channel is formed in an oxide semiconductor film can be used for all the transistors used for the memory element 700. Further alternatively, in the memory element 700, a transistor in which a channel is formed in an oxide semiconductor film can be included besides the transistor 709, and a transistor in which a channel is formed in a layer or the substrate 1190 including a semiconductor other than an oxide semiconductor can be used for the reset of the transistors.

As the circuit 701 in FIG. 65, for example, a flip-flop circuit can be used. As the logic element 706, for example, an inverter, a clocked inverter, or the like can be used.

In the driving method of the semiconductor device of one embodiment of the present invention, in a period during which the memory element 700 is not supplied with the power supply voltage, data stored in the circuit 701 can be held by the capacitor 708 which is provided in the circuit 702.

The off-state current of a transistor in which a channel is formed in an oxide semiconductor film is extremely low. For example, the off-state current of a transistor in which a channel is formed in an oxide semiconductor film is significantly lower than that of a transistor in which a channel is formed in silicon having crystallinity. Thus, when such a transistor including an oxide semiconductor is used for the transistor 709, a signal held in the capacitor 708 is held for a long time also in a period during which the power supply voltage is not supplied to the memory element 700. The memory element 700 can accordingly hold the stored content (data) also in a period during which the supply of the power supply voltage is stopped.

Since the switch 703 and the switch 704 are provided, the memory element performs the above pre-charge operation; thus, the time required for the circuit 701 to hold original data again after the supply of the power supply voltage is restarted can be shortened.

In the circuit 702, a signal held by the capacitor 708 is input to the gate of the transistor 710. Therefore, after supply of the power supply voltage to the memory element 700 is restarted, the signal held by the capacitor 708 can be converted into the one corresponding to the state (the on state or the off state) of the transistor 710 to be read from the circuit 702. Consequently, an original signal can be accurately read even when a potential corresponding to the signal held by the capacitor 708 fluctuates to some degree.

By applying the above-described memory element 700 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example in which the storage element 700 is used in a CPU is described in this embodiment, the storage element 700 can also be used in a digital signal processor (DSP), a custom LSI, an LSI such as a programmable logic device (PLD), and a radio frequency identification (RF-ID).

This embodiment can be combined with any of the other embodiments disclosed in this specification as appropriate.

Embodiment 16

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. Specific examples of such electronic devices are illustrated in FIGS. 66A to 66F.

Figure 66A:
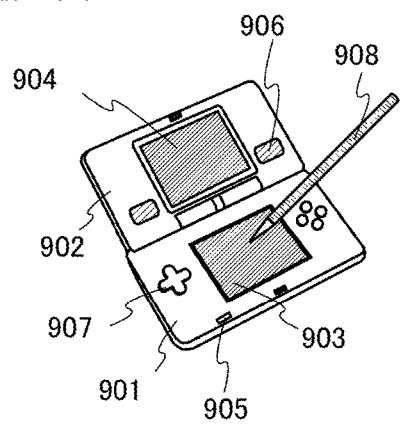
FIGS. 66A to 66F illustrate electronic devices of an embodiment.

FIG. 66A illustrates a portable game console including a housing 901, a housing 902, a display portion 903, a display portion 904, a microphone 905, a speaker 906, an operation key 907, a stylus 908, and the like. Although the portable game machine in FIG. 66A has the two display portions 903 and 904, the number of display portions included in a portable game machine is not limited to this.

Figure 66B:
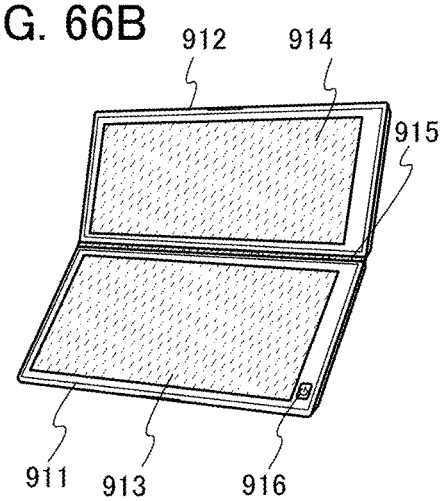

FIG. 66B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel area of a display device.

Figure 66C:
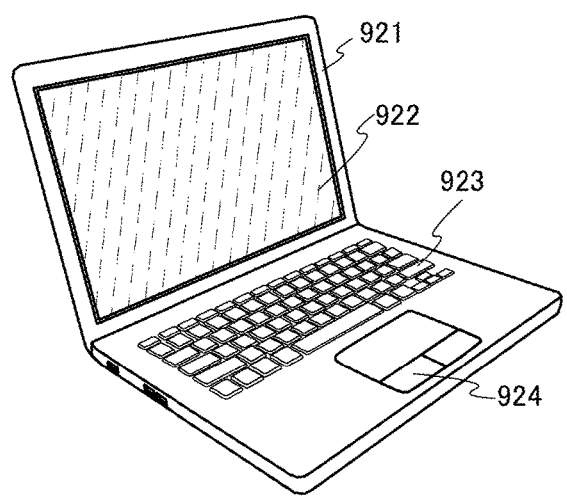

FIG. 66C illustrates a laptop personal computer, which includes a housing 921, a display portion 922, a keyboard 923, a pointing device 924, and the like.

Figure 66D:
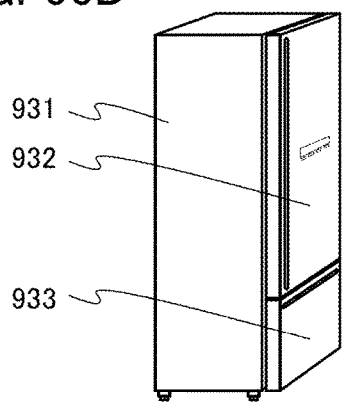

FIG. 66D illustrates the electric refrigerator-freezer including a housing 931, a door for a refrigerator 932, a door for a freezer 933, and the like.

Figure 66E:
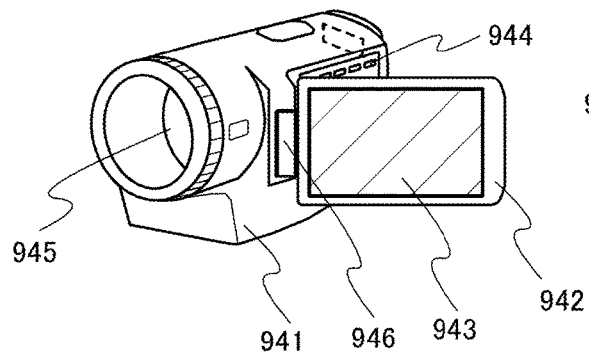

FIG. 66E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 66F:
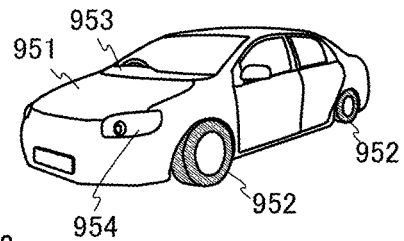

FIG. 66F illustrates an ordinary vehicle including a car body 951, wheels 952, a dashboard 953, lights 954, and the like.

This embodiment can be combined with any of the other embodiments disclosed in this specification as appropriate.

This application is based on Japanese Patent Application serial no. 2013-154723 filed with Japan Patent Office on Jul. 25, 2013, Japanese Patent Application serial no. 2013-154749 filed with Japan Patent Office on Jul. 25, 2013, and Japanese Patent Application serial no. 2013-154736 filed with Japan Patent Office on Jul. 25, 2013, the entire contents of which are hereby incorporated by reference.

What is claimed is:
1. A semiconductor device comprising:
a first insulating film;
a first oxide semiconductor film over the first insulating film;
a second oxide semiconductor film over the first oxide semiconductor film;
a first conductive film and a second conductive film over the first insulating film;
a third oxide semiconductor film over the second oxide semiconductor film, the first conductive film, and the second conductive film;
a second insulating film over the third oxide semiconductor film; and
a third conductive film over the second insulating film,
wherein each of the first conductive film and the second conductive film is in contact with a first side surface of the second oxide semiconductor film,
wherein, in a channel width direction, the third conductive film faces a second side surface of the second oxide semiconductor film,
wherein the first oxide semiconductor film comprises a depressed portion, and
wherein the third oxide semiconductor film is in contact with the depressed portion.
2. The semiconductor device according to claim 1, wherein, in the channel width direction, the third oxide semiconductor film is in contact with the second side surface of the second oxide semiconductor film.
3. The semiconductor device according to claim 1, wherein an entire upper surface of the second oxide semiconductor film is in contact with the third oxide semiconductor film.
4. The semiconductor device according to claim 1, wherein, in a channel length direction, a length of the third oxide semiconductor film is larger than a length of each of the first oxide semiconductor film and the second oxide semiconductor film.

5. The semiconductor device according to claim 1, wherein the third oxide semiconductor film comprises indium, gallium, and zinc.

6. A semiconductor device comprising:
a first conductive film;
a first insulating film over the first conductive film;
a first oxide semiconductor film over the first insulating film;
a second oxide semiconductor film over the first oxide semiconductor film;
a second conductive film and a third conductive film over the first insulating film;
a third oxide semiconductor film over the second oxide semiconductor film, the first conductive film, and the second conductive film;
a second insulating film over the third oxide semiconductor film; and
a fourth conductive film over the second insulating film,
wherein each of the second conductive film and the third conductive film is in contact with a first side surface of the second oxide semiconductor film,
wherein, in a channel width direction, the fourth conductive film faces a second side surface of the second oxide semiconductor film,
wherein the first oxide semiconductor film comprises a depressed portion, and
wherein the third oxide semiconductor film is in contact with the depressed portion.

7. The semiconductor device according to claim 6, wherein, in the channel width direction, the third oxide semiconductor film is in contact with the second side surface of the second oxide semiconductor film.

8. The semiconductor device according to claim 6, wherein an entire upper surface of the second oxide semiconductor film is in contact with the third oxide semiconductor film.

9. The semiconductor device according to claim 6, wherein, in a channel length direction, a length of the third oxide semiconductor film is larger than a length of each of the first oxide semiconductor film and the second oxide semiconductor film.

10. The semiconductor device according to claim 6, wherein the fourth conductive film is electrically connected to the first conductive film.

11. The semiconductor device according to claim 6, wherein the third oxide semiconductor film comprises indium, gallium, and zinc.

* * * * *